(12) United States Patent
Lint et al.

(10) Patent No.: US 9,664,711 B2
(45) Date of Patent: May 30, 2017

(54) CURRENT SENSING DEVICES AND METHODS

(75) Inventors: James Douglas Lint, Cardiff, CA (US); Fuxue Jin, San Diego, CA (US); Francisco Michel, San Diego, CA (US); Victor Aldaco, Chula Vista, CA (US)

(73) Assignee: PULSE ELECTRONICS, INC., San Diego, CA (US)

( * ) Notice: Subject to any disclaimer, the term of this patent is extended or adjusted under 35 U.S.C. 154(b) by 742 days.

(21) Appl. No.: 12/567,622

(22) Filed: Sep. 25, 2009

(65) Prior Publication Data

US 2011/0025304 A1 Feb. 3, 2011

Related U.S. Application Data

(60) Provisional application No. 61/230,474, filed on Jul. 31, 2009.

(51) Int. Cl.
*G01R 15/18* (2006.01)
*H01F 5/02* (2006.01)
*H01F 38/30* (2006.01)

(52) U.S. Cl.
CPC ............ *G01R 15/181* (2013.01); *H01F 5/02* (2013.01); *H01F 38/30* (2013.01)

(58) Field of Classification Search
None
See application file for complete search history.

(56) References Cited

U.S. PATENT DOCUMENTS

| 750,594 A | 1/1904 | Campbell |
| 2,470,598 A | 5/1949 | Biebesheimer |
| 2,949,591 A * | 8/1960 | Craige ........................... 336/83 |

(Continued)

FOREIGN PATENT DOCUMENTS

| CN | 1283795 | 2/2001 |
| CN | 1283795 A | 2/2001 |

(Continued)

OTHER PUBLICATIONS

"Practical Aspects of Rogowski Coil Applications to Relaying" by Kojovic, et al. Sep. 2010.

(Continued)

*Primary Examiner* — Paresh Patel
(74) *Attorney, Agent, or Firm* — Gazdzinski & Associates, PC

(57) ABSTRACT

A low-cost and high-precision current sensing device and methods for use and manufacturing. In one embodiment, the current sensing apparatus comprises a Rogowski-type coil which is manufactured in segments so as to facilitate the manufacturing process. In an exemplary embodiment, the current sensing apparatus segments comprise a number of bobbin elements that are wound and subsequently formed into complex geometric shapes such as torus-like shapes. In an alternative embodiment, bonded windings are utilized which allow the segments to be formed without a bobbin or former. In yet another alternative embodiment, the aforementioned current sensing devices are stacked in groups of two or more. Methods of manufacturing and using the aforementioned current sensing apparatus are also disclosed.

4 Claims, 41 Drawing Sheets

(56) References Cited

U.S. PATENT DOCUMENTS

| | | |
|---|---|---|
| 3,340,353 A | 9/1967 | Mildner |
| 3,419,835 A | 12/1968 | Stein |
| 3,477,051 A | 11/1969 | Clark et al. |
| 3,605,055 A | 9/1971 | Grady |
| 3,614,554 A | 10/1971 | Shield et al. |
| 3,626,291 A * | 12/1971 | Yauch et al. ............ 324/127 |
| 3,689,862 A | 9/1972 | Raymond |
| 3,699,488 A | 10/1972 | Goodman et al. |
| 3,772,626 A | 11/1973 | Russell |
| 3,947,795 A * | 3/1976 | Donnelly et al. .......... 336/184 |
| 4,020,437 A | 4/1977 | Kern |
| 4,048,605 A | 9/1977 | McCollum |
| 4,091,349 A * | 5/1978 | Niederjohn et al. ......... 336/192 |
| 4,103,268 A | 7/1978 | Anders et al. |
| 4,146,860 A * | 3/1979 | Miller ........................ 336/192 |
| 4,253,231 A | 3/1981 | Nouet |
| 4,352,079 A * | 9/1982 | Mueller et al. .............. 336/65 |
| 4,378,525 A | 3/1983 | Burdick |
| 4,547,961 A | 10/1985 | Bokil et al. |
| 4,611,191 A | 9/1986 | Souchere |
| 4,616,176 A | 10/1986 | Mercure |
| 4,687,987 A | 8/1987 | Kuchnir et al. |
| 4,700,131 A | 10/1987 | Miller |
| 4,709,205 A | 11/1987 | Baurand et al. |
| 4,777,381 A | 10/1988 | Fernandes |
| 4,808,954 A | 2/1989 | Ito |
| 4,847,986 A | 7/1989 | Meinel |
| 4,904,975 A * | 2/1990 | Medenbach ............... 336/192 |
| 4,978,906 A | 12/1990 | Herbert et al. |
| 5,038,104 A | 8/1991 | Wikswo, Jr. et al. |
| 5,055,816 A | 10/1991 | Altman et al. |
| 5,066,904 A | 11/1991 | Bullock |
| 5,126,714 A | 6/1992 | Johnson |
| 5,220,488 A | 6/1993 | Denes |
| 5,257,000 A | 10/1993 | Billings et al. |
| 5,299,956 A | 4/1994 | Brownell et al. |
| 5,332,989 A * | 7/1994 | Ching ........................ 336/208 |
| 5,414,400 A | 5/1995 | Gris et al. |
| 5,430,613 A | 7/1995 | Hastings et al. |
| 5,442,280 A | 8/1995 | Baudart |
| 5,451,914 A | 9/1995 | Stengel |
| 5,461,309 A | 10/1995 | Baudart |
| 5,487,214 A | 1/1996 | Walters |
| 5,671,856 A | 9/1997 | Lisch |
| 5,726,615 A * | 3/1998 | Bloom ........................ 336/83 |
| 5,736,910 A | 4/1998 | Townsend et al. |
| 5,781,091 A | 7/1998 | Krone et al. |
| 5,892,420 A | 4/1999 | Larranaga et al. |
| 5,959,846 A | 9/1999 | Noguchi et al. |
| 5,982,265 A | 11/1999 | Von Skarczinski et al. |
| 6,018,239 A | 1/2000 | Berkcan |
| 6,087,920 A * | 7/2000 | Abramov ................... 336/192 |
| 6,094,044 A | 7/2000 | Kustera et al. |
| 6,148,500 A | 11/2000 | Krone et al. |
| 6,184,672 B1 | 2/2001 | Berkcan |
| 6,193,560 B1 | 2/2001 | Morana et al. |
| 6,225,560 B1 | 5/2001 | Machado |
| 6,270,380 B1 | 8/2001 | Shichida et al. |
| 6,313,623 B1 | 11/2001 | Kojovic et al. |
| 6,332,810 B1 | 12/2001 | Bareel |
| 6,409,547 B1 | 6/2002 | Reede |
| 6,414,475 B1 | 7/2002 | Dames et al. |
| 6,417,661 B1 | 7/2002 | Berkcan et al. |
| 6,428,362 B1 | 8/2002 | Phommachanh |
| 6,440,750 B1 | 8/2002 | Feygenson et al. |
| 6,445,271 B1 | 9/2002 | Johnson |
| 6,455,885 B1 | 9/2002 | Lin |
| 6,464,541 B1 | 10/2002 | Hashim et al. |
| 6,521,695 B1 | 2/2003 | Peruzzotti et al. |
| 6,545,456 B1 | 4/2003 | Radosevich et al. |
| 6,585,540 B2 | 7/2003 | Gutierrez et al. |
| 6,614,218 B1 | 9/2003 | Ray |
| 6,642,827 B1 | 11/2003 | McWilliams et al. |
| 6,655,988 B1 | 12/2003 | Simmons et al. |
| 6,677,850 B2 | 1/2004 | Dames |
| 6,696,910 B2 | 2/2004 | Nuytkens et al. |
| 6,731,193 B2 | 5/2004 | Meier et al. |
| 6,734,661 B2 | 5/2004 | Colby et al. |
| 6,769,166 B1 | 8/2004 | Blanchard |
| 6,769,936 B2 | 8/2004 | Gutierrez et al. |
| 6,822,547 B2 | 11/2004 | Saito et al. |
| 6,825,650 B1 | 11/2004 | McCormack et al. |
| 6,848,943 B2 | 2/2005 | Machado et al. |
| 6,856,227 B2 * | 2/2005 | Ushio et al. ................ 336/198 |
| 6,926,558 B2 | 8/2005 | Sasai et al. |
| 6,952,153 B2 | 10/2005 | Jacobson et al. |
| 6,962,511 B2 | 11/2005 | Gutierrez et al. |
| 6,963,195 B1 | 11/2005 | Berkcan |
| 6,965,225 B2 | 11/2005 | DeBuda |
| 7,078,888 B2 * | 7/2006 | Budillon et al. ............ 324/127 |
| 7,106,162 B2 | 9/2006 | Saito |
| 7,109,837 B2 | 9/2006 | Watts et al. |
| 7,145,784 B2 | 12/2006 | Utsuno et al. |
| 7,158,005 B2 | 1/2007 | Pleskach et al. |
| 7,196,607 B2 | 3/2007 | Pleskach et al. |
| 7,218,198 B2 * | 5/2007 | Pilniak et al. ............... 336/208 |
| 7,218,199 B1 * | 5/2007 | Chang ........................ 336/212 |
| 7,227,441 B2 | 6/2007 | Skendzic et al. |
| 7,227,442 B2 | 6/2007 | Skendzic |
| 7,241,181 B2 | 7/2007 | Machado et al. |
| 7,253,603 B2 | 8/2007 | Kovanko et al. |
| 7,271,697 B2 | 9/2007 | Whittaker et al. |
| 7,277,002 B2 | 10/2007 | Harding |
| 7,288,929 B2 | 10/2007 | Prsha et al. |
| 7,322,863 B2 | 1/2008 | Rapp et al. |
| 7,367,851 B2 | 5/2008 | Machado et al. |
| 7,405,643 B2 | 7/2008 | Jeong et al. |
| 7,408,434 B2 | 8/2008 | Lee et al. |
| 7,429,908 B2 * | 9/2008 | Pilniak ........................ 336/208 |
| 7,474,192 B2 | 1/2009 | Skendzic et al. |
| 7,477,128 B2 | 1/2009 | Quilici |
| 7,489,226 B1 | 2/2009 | Chignola et al. |
| 7,510,441 B2 | 3/2009 | Zhang et al. |
| 7,524,206 B2 | 4/2009 | Gutierrez et al. |
| 7,538,541 B2 | 5/2009 | Kojovic |
| 7,564,233 B2 | 7/2009 | Kojovic |
| 7,592,964 B2 | 9/2009 | Mullenborn et al. |
| 7,598,837 B2 | 10/2009 | Gilmartin |
| 7,598,839 B1 | 10/2009 | Wedley |
| 7,656,263 B2 | 2/2010 | Whittaker et al. |
| 7,661,994 B2 | 2/2010 | Machado et al. |
| 7,671,716 B2 | 3/2010 | Chen |
| 7,708,602 B2 | 5/2010 | Rascon et al. |
| 7,724,204 B2 | 5/2010 | Annamaa et al. |
| 7,819,699 B2 | 10/2010 | Xu et al. |
| 7,821,374 B2 | 10/2010 | Harrison et al. |
| 7,868,727 B2 | 1/2011 | Chen et al. |
| 7,961,072 B2 | 6/2011 | Pilniak et al. |
| 7,982,572 B2 | 7/2011 | Schaffer et al. |
| 8,193,891 B2 | 6/2012 | Gerhard et al. |
| 8,203,418 B2 | 6/2012 | Harrison et al. |
| 8,234,778 B2 | 8/2012 | Schaffer et al. |
| 8,319,628 B2 * | 11/2012 | Schweitzer et al. ........ 340/539.1 |
| 2002/0003464 A1 * | 1/2002 | Berkcan .............. H01F 17/0033 336/229 |
| 2002/0158305 A1 | 10/2002 | Dalmia et al. |
| 2003/0011458 A1 | 1/2003 | Nuytkens et al. |
| 2003/0112000 A1 | 6/2003 | Sorenson, Jr |
| 2004/0000968 A1 | 1/2004 | White et al. |
| 2004/0005820 A1 | 1/2004 | Gutierrez et al. |
| 2004/0150502 A1 | 8/2004 | Jacobson et al. |
| 2005/0059295 A1 | 3/2005 | Chen et al. |
| 2005/0088267 A1 | 4/2005 | Watts et al. |
| 2005/0208914 A1 | 9/2005 | Ogawa |
| 2005/0248430 A1 | 11/2005 | Dupraz et al. |
| 2005/0253573 A1 | 11/2005 | Budillon et al. |
| 2006/0176139 A1 | 8/2006 | Pleskach et al. |
| 2006/0220774 A1 | 10/2006 | Skendzic |
| 2006/0290457 A1 | 12/2006 | Lee et al. |
| 2007/0001796 A1 | 1/2007 | Waffenschmidt et al. |
| 2007/0063807 A1 | 3/2007 | Quilici |
| 2007/0111598 A1 | 5/2007 | Quilici |
| 2007/0152651 A1 | 7/2007 | Shiokawa et al. |
| 2007/0210787 A1 | 9/2007 | Ebenezer et al. |

(56) References Cited

U.S. PATENT DOCUMENTS

| | | |
|---|---|---|
| 2007/0216510 A1 | 9/2007 | Jeong et al. |
| 2007/0282411 A1 | 12/2007 | Franz et al. |
| 2007/0285089 A1 | 12/2007 | Ibuki et al. |
| 2007/0290695 A1 | 12/2007 | Mahon |
| 2008/0007249 A1 | 1/2008 | Wilkerson et al. |
| 2008/0036448 A1 | 2/2008 | Kovach et al. |
| 2008/0077336 A1 | 3/2008 | Fernandes |
| 2008/0079418 A1 | 4/2008 | Rea et al. |
| 2008/0096426 A1 | 4/2008 | Chou et al. |
| 2008/0106253 A1 | 5/2008 | Kojovic |
| 2008/0111226 A1 | 5/2008 | White et al. |
| 2008/0186124 A1 | 8/2008 | Schaffer et al. |
| 2008/0211484 A1 | 9/2008 | Howell et al. |
| 2008/0233803 A1 | 9/2008 | Renteria et al. |
| 2008/0303511 A1 | 12/2008 | Grno |
| 2009/0002111 A1 | 1/2009 | Harrison et al. |
| 2009/0058399 A1 | 3/2009 | Wang et al. |
| 2009/0077791 A1 | 3/2009 | Quilici |
| 2009/0200682 A1 | 8/2009 | Zhang |
| 2009/0231769 A1 | 9/2009 | Fischer et al. |
| 2010/0013460 A1 | 1/2010 | Ermisch et al. |
| 2010/0013589 A1 | 1/2010 | Schaffer et al. |
| 2010/0259275 A1 | 10/2010 | Grieshaber et al. |
| 2010/0295646 A1 | 11/2010 | Harrison et al. |
| 2010/0301836 A1 | 12/2010 | Kern |
| 2011/0014800 A1 | 1/2011 | Cheng |
| 2011/0025304 A1 | 2/2011 | Lint et al. |
| 2011/0025305 A1 | 2/2011 | Lint et al. |
| 2011/0034081 A1 | 2/2011 | Feldman et al. |
| 2011/0074397 A1 | 3/2011 | Bulumulla et al. |
| 2011/0148561 A1 | 6/2011 | Lint et al. |
| 2011/0204879 A1 | 8/2011 | Peretto |
| 2011/0291789 A1 | 12/2011 | Dalmia et al. |
| 2012/0058676 A1 | 3/2012 | Schaffer et al. |
| 2012/0175970 A1 | 7/2012 | Jackman |
| 2013/0043967 A1 | 2/2013 | Rouaud et al. |
| 2013/0063125 A1 | 3/2013 | Chamarti et al. |
| 2013/0063129 A1* | 3/2013 | Chamarti et al. ............ 324/126 |
| 2013/0063131 A1* | 3/2013 | Chamarti et al. ............ 324/150 |
| 2013/0063161 A1 | 3/2013 | Chamarti et al. |

FOREIGN PATENT DOCUMENTS

| | | |
|---|---|---|
| CN | 1189755 | 2/2005 |
| CN | 1696712 A | 11/2005 |
| CN | 1270332 C | 8/2006 |
| CN | 1993782 A | 7/2007 |
| CN | 101023364 A | 8/2007 |
| CN | 100407564 | 7/2008 |
| CN | 100407564 C | 7/2008 |
| CN | 101438172 A | 5/2009 |
| CN | 201465698 U | 5/2010 |
| DE | 1278006 B | 9/1968 |
| DE | 2432919 D4 | 2/1976 |
| DE | 19712900 | 11/1997 |
| EP | 0555994 A1 | 8/1993 |
| EP | 0708459 A1 | 4/1996 |
| EP | 0756298 A2 | 1/1997 |
| GB | 987310 D2 | 3/1995 |
| JP | 2004186099 A | 7/2004 |
| TW | 234743 | 11/1994 |
| TW | 312748 | 8/1997 |
| TW | I279819 B | 4/2007 |
| WO | WO-2009139521 A1 | 11/2009 |
| WO | WO-2010065113 A1 | 6/2010 |

OTHER PUBLICATIONS

Iris, "Smart Grid Monitoring," *Current Sensing for a Smarter Grid*, Doc ref: 10068MAR10 V1.02, Sentec, http://www.sentec.co.uk/assets/library/document/i/original/iris_datasheet_1.02_v1_.pdf, (pp. 1-2).
European Search Report for EP12180314 dated Nov. 29, 2012.
"Practical Aspects of Rogowski Coil Applications to Relaying" by Kojovic et al. Sep. 2010.
An Overview of Rogowski Coil Current Sensing Technology; David E. Shepard, Tactical Marketing Manager and Donald W. Yauch Applications Manager; LEM DynAmp Inc.
Clamp-On Weather Proof Rogowski Coil, available at http://www.taehwatrans.com/.
Crotti, Et A1. "Analysis of Rogowski Coil Behavior Under Non IdeA1 Measurement Conditions" XIX IMEKO World.
Dielectric Constants of Various Materials Table, http://www.csgnetwork.com/dieconstantstable.html.
DuPont<gs id="c1f5957d-3bd5-4321-8343-92d15f72daa1" ginger_software_uiphraseguid="060605f9-a87d-4965-9e01-052ef4c4d9fc" class="GINGER_SOFTWARE_mark">.</gs>TM. <gs Id="76a21411-359b-47d5-96-ad-b3be6690f958" ginger_software_uiphraseguid="579a6f1d8fd5-42a3-8edf-a65520b93e57" class="GINGER_SOFTWARE_mark">Crastin </gs><gs id="568539e2-8382-427b-9622-9abf9157be8c" ginger_software_uiphraseguid="579a6f1d-8fd5-42a3-8edf-a65520b93e57" class="GINGER_SOFTWARE_mark">.</gs>RTM. Polybutylene Terephthalate (PBT) polyester resin, http://www2.dupont.com/Plastics/en.sub.--US/Products/Crastin/Crastn.html.
"International Search Report and Written Opinion for Application No. PCT/US2010/033909, mailed on Sep. 20, 2010, 14 pages."
International Search Report and Written Opinion for Application No. PCT/US2013/068807, mailed on Mar. 19, 2014, 10 Pages.
International Search Report and Written Opinion for Application No. PCT/US2011/020397, mailed on Mar. 11, 2011, 8 pages.
International Search Report and Written Opinion for Application No. PCT/US2013/043462, mailed on Oct. 31, 2013, 7 Pages.
Office Action mailed Jul. 29, 2015 for Korean Application No. 20137017783 filed May 6, 2010, 12 pages.
Synthetic Resin, http://en.wikipedia.org/wiki/Synthetic.sub.--resin.
Crotti, Et al. "Analysts of Rogowski Coil Behavior Under Non Ideal Measurement Conditions" XIX IMEKO World Congress, Fundamental and Applied Metrology, Sep. 6-11, 2009, Lisbon, Portugal, pp. 876-881.

* cited by examiner

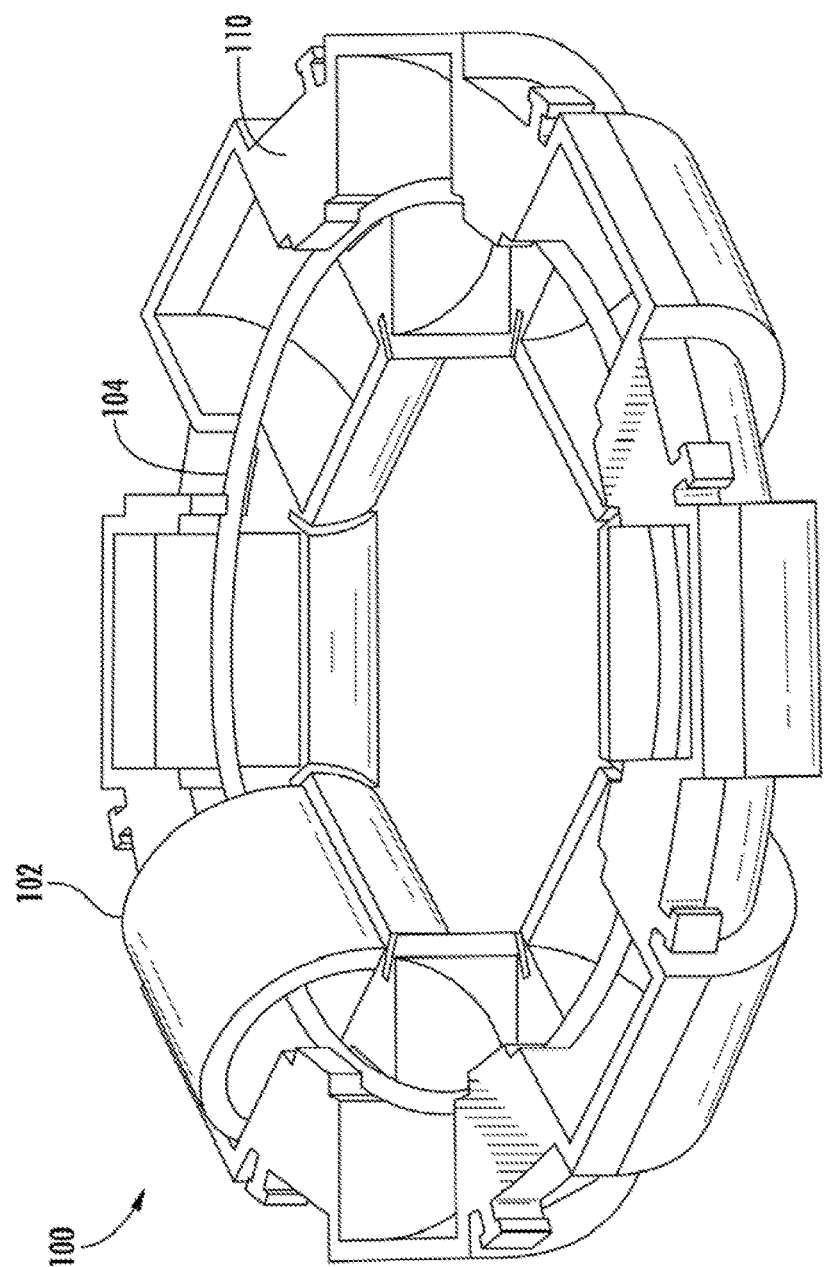

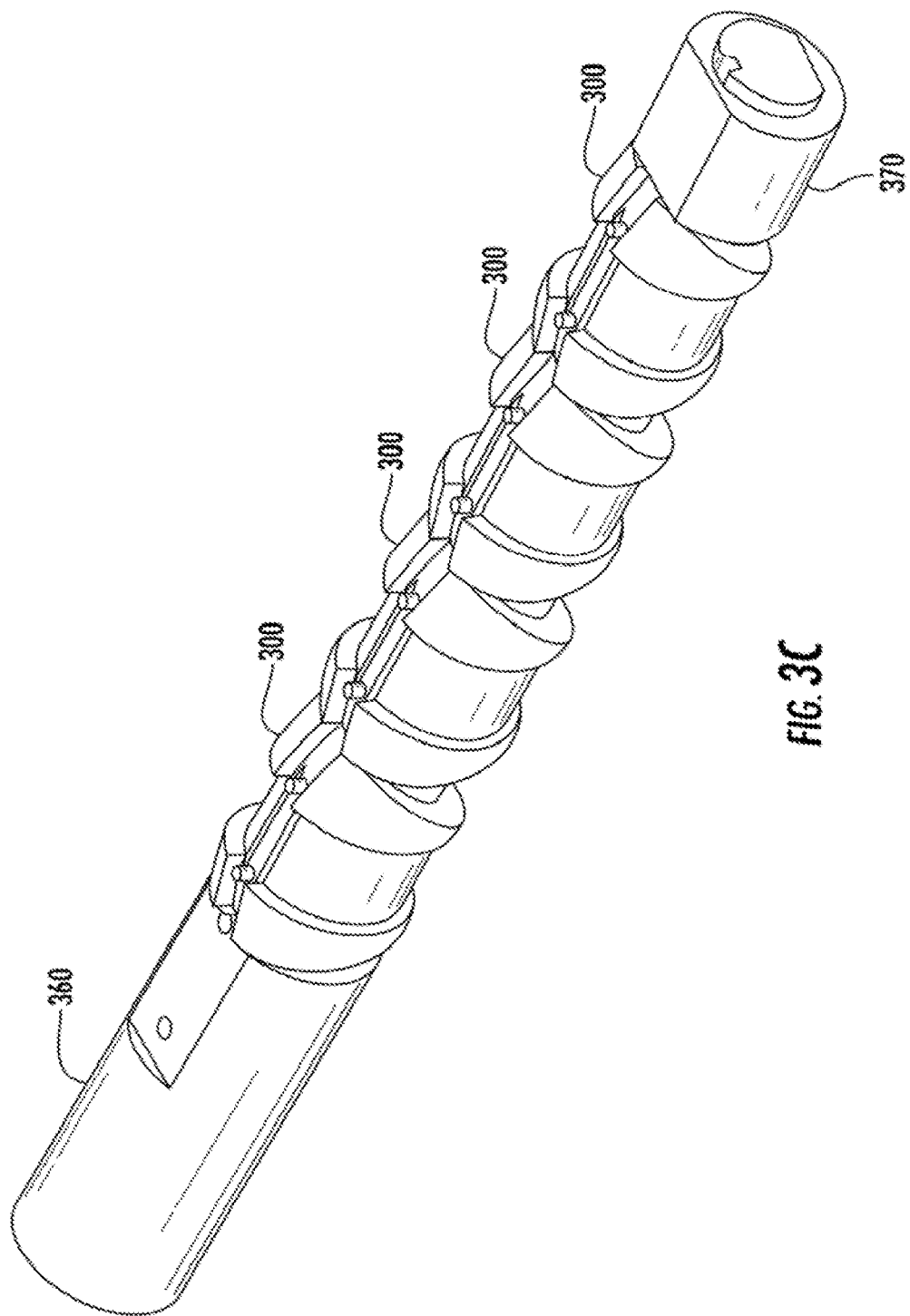

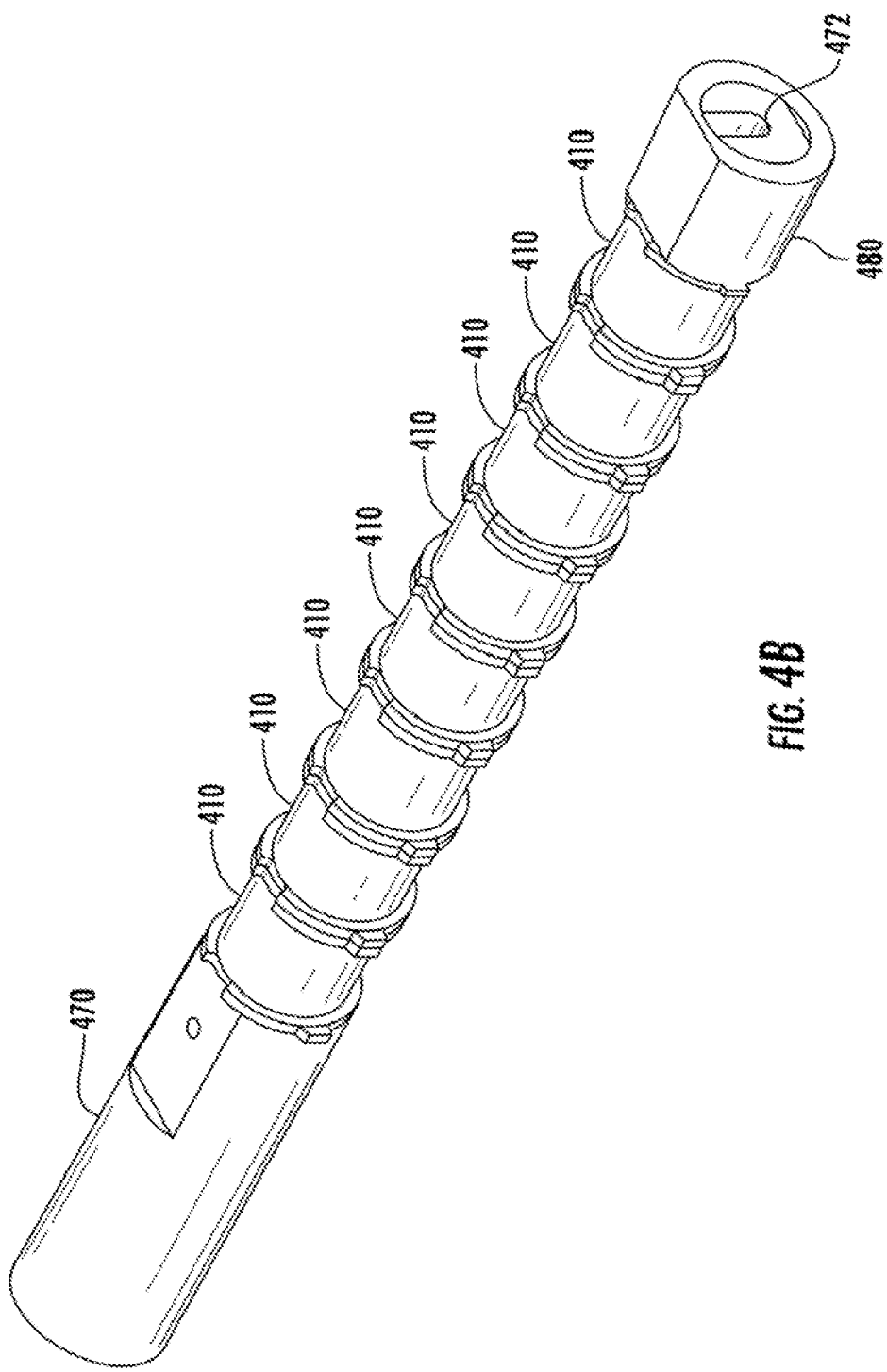

CURRENT SENSING DEVICES AND METHODS

PRIORITY

This application claims priority to U.S. Provisional Patent Application Ser. No. 61/230,474 filed Jul. 31, 2009 of the same title, which is incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

1. Field of the Invention

The present invention relates generally to circuit elements and more particularly in one exemplary aspect to devices for the sensing of current, and methods of utilizing and manufacturing the same.

2. Description of Related Technology

A myriad of different configurations of current sensing devices are known in the prior art. One common approach to the manufacture of current sensing devices is via the use of a so-called "Rogowski coil". A Rogowski coil is an electrical device for measuring alternating current ("AC"). It typically consists of a helical coil of wire with the lead from one end returning through the center of the coil and passing through the helical coil of wire to the other end. The whole helical coil of wire is then positioned around an alternate current carrying conductor whose current is to be measured. The voltage that is induced in the coil is proportional to the rate of change of current in the conductor such that the output of the Rogowski coil is indicative to the amount of current passing through the conductor.

Rogowski coils can be made open-ended and flexible, allowing it to be wrapped around a current carrying conductor without otherwise directly disturbing the current passing through that conductor. A Rogowski coil typically utilizes air, rather than a magnetically permeable core therefore giving the Rogowski coil the properties of possessing both a relatively low inductance along with response to relatively fast-changing currents. Furthermore, the output of a Rogowski coil is typically highly linear, even when subjected to large currents such as those used in electric power transmission, welding, or other pulsed power applications. In addition, properly constructed Rogowski coils are often also largely immune to electromagnetic interference, thereby making them resistant to outside tampering. However, due to the relatively complex winding configurations involved, prior art attempts at manufacturing Rogowski type coils have been labor intensive and expensive.

Numerous methodologies exist for producing Rogowski coils in the prior art, including for example, those disclosed in U.S. Pat. No. 4,616,176 to Mercure, et al. issued Oct. 7, 1986 and entitled "Dynamic current transducer"; U.S. Pat. No. 5,414,400 to Gris, et al. issued May 9, 1995 and entitled "Rogowski coil"; U.S. Pat. No. 5,442,280 to Baudart issued Aug. 15, 1995 and entitled "Device for measuring an electrical current in a conductor using a Rogowski coil"; U.S. Pat. No. 5,982,265 to Von Skarczinski, et al. issued Nov. 9, 1999 and entitled "Current-detection coil for a current transformer"; U.S. Pat. No. 6,094,044 to Kustera, et al. issued Jul. 25, 2000 and entitled "AC current sensor having high accuracy and large bandwidth"; U.S. Pat. No. 6,313,623 to Kojovic, et al. issued Nov. 6, 2001 and entitled "High precision Rogowski coil"; U.S. Pat. No. 6,614,218 to Ray issued Sep. 2, 2003 and entitled "Current measuring device"; U.S. Pat. No. 6,731,193 to Meier, et al. issued May 4, 2004 and entitled "Printed circuit board-based current sensor"; U.S. Pat. No. 6,822,547 to Saito, et al. issued Nov. 23, 2004 and entitled "Current transformer"; U.S. Pat. No. 7,227,441 to Skendzic, et al. issued Jun. 5, 2007 and entitled "Precision Rogowski coil and method for manufacturing same"; U.S. Pat. No. 7,253,603 to Kovanko, et al. issued Aug. 7, 2007 and entitled "Current sensor arrangement"; U.S. Pat. No. 7,538,541 to Kojovic issued May 26, 2009 and entitled "Split Rogowski coil current measuring device and methods"; United States Patent Pub. No. 20050248430 to Dupraz, et al. published Nov. 10, 2005 and entitled "Current transformer with Rogowski type windings comprising an association of partial circuits forming a complete circuit"; United States Patent Pub. No. 20060220774 to Skendzic published Oct. 5, 2006 and entitled "Precision printed circuit board based Rogowski coil and method for manufacturing same"; United States Patent Pub. No. 20070290695 to Mahon published Dec. 20, 2007 and entitled "Method and Apparatus for Measuring Current"; United States Patent Pub. No. 20080007249 to Wilkerson; et al. published Jan. 10, 2008 and entitled "Precision, Temperature-compensated, shielded current measurement device"; United States Patent Pub. No. 20080079418 to Rea; et al. published Apr. 3, 2008 and entitled "High-precision Rogowski current transformer"; United States Patent Pub. No. 20080106253 to Kojovic published May 8, 2008 and entitled "Shielded Rogowski coil assembly and methods"; and United States Patent Pub. No. 20080211484 to HOWELL; et al. published Sep. 4, 2008 and entitled "Flexible current transformer assembly".

Despite the broad variety of prior art current sensing configurations, there is a salient need for current sensing devices (including Rogowski coils) that both are low in cost to manufacture, such low cost being enabled by inter alia addressing the difficulties associated with the complex coil configurations of prior art current sensing devices, and offer improved or at least comparable electrical performance over prior art devices. Ideally such a solution would not only offer very low manufacturing cost and improved electrical performance for the current sensing device, but also provide a high level of consistency and reliability of performance by limiting opportunities for errors or other imperfections during manufacture of the device.

Moreover, an ideal solution would also be at least somewhat scalable, and able to assume various desired form factors.

SUMMARY OF THE INVENTION

In a first aspect of the invention, an improved current sensing inductive device is disclosed. In one embodiment, the current sensing inductive device includes multiple ones of segmented winding elements. A return conductor electrically couples a leading one of the segmented winding elements with a trailing one of the segmented winding elements.

In one embodiment, the segmented winding elements comprise segmented bobbin elements upon which a number of windings are disposed.

In another embodiment, the windings are effectively freestanding such that no bobbin or other internal support structure is required.

In a second aspect of the invention, an improved form-less current sensing inductive device is disclosed. In one embodiment, the inductive device includes multiple ones of form-less wound air coils. These air coils are then placed within respective cavities located on an encapsulating header. A return conductor couples a leading one of the form-less coils with a trailing one of the form-less coils.

In a third aspect of the invention, a system apparatus that incorporates the aforementioned current sensing inductive devices is disclosed. In one embodiment, the system apparatus comprises a power distribution utility box that incorporates an improved current sensing inductive device. The power distribution utility box includes a network interface that transmits data collected by the current sensing inductive device over a network to a device or location (e.g., centralized repository or control center) for monitoring, billing, and/or control applications.

In a fourth aspect of the invention, methods of manufacturing the aforementioned device(s) are disclosed. In one embodiment, the method comprises continuously winding an insulated conductor over multiple segmented bobbin elements. A return conductor is routed between each of the segmented bobbin elements. The return conductor is then electrically coupled with the insulated conductor so as to form the current sensing inductive device.

In a fifth aspect of the invention, methods of using the aforementioned apparatus are disclosed.

In a sixth aspect of the invention, a scalable inductive device is disclosed. In one embodiment, the device comprises a number of winding segments, and the number of winding segments (and/or number of turns per segment) can be varied as desired so as to achieve a desired tradeoff between higher performance and higher cost of manufacturing. In a seventh aspect of the invention, a low cost and highly precise inductive device is disclosed. In one embodiment, a number of segments are used to effectively approximate a circular, continuous Rogowski coil device.

In an eighth aspect of the invention, a user-tunable multi-coil assembly is disclosed. In one embodiment, two or more segmented coils are stacked (i.e., in juxtaposed disposition with a common central axis), such that the angular disposition (rotation) of the coils around the common axis can be varied by an installer or end user, and/or the number of coils present can be changed. As the segments of one coil are placed in different position with respect to the segments of the other coil(s) (and/or the number of coils increased or decreased), the output of the devices will vary, thereby allowing the installer/user to "tune" the effective output of the coil assembly to the desired level of performance.

In another embodiment, the two or more coils are substantially concentric with one another, such that they have different radii. Similarly, when the relative position of the coils is changed (and/or number of coils varied), the output of the coils will vary as well, and can be tuned or adjusted to a desired level of performance.

Moreover, in yet another embodiment, the vertical spacing or disposition of the different coils (whether in "stacked" or "concentric" configuration) can be varied, thereby increasing/decreasing the coupling or interaction of the coils.

In a ninth aspect of the invention, a coil device having a conductor receiving insert is disclosed. In one embodiment, the device comprises a segmented coil of the type referenced above, which further includes a central portion adapted to orient and place one or more conductors being monitored at a prescribed location within the center region of the coil.

BRIEF DESCRIPTION OF THE DRAWINGS

The features, objectives, and advantages of the invention will become more apparent from the detailed description set forth below when taken in conjunction with the drawings, wherein:

FIG. 3C is a perspective view illustrating the four (4) assembled Rogowski coil segments of FIG. 3B mounted on a winding mandrel in accordance with the principles of the present invention.

FIG. 4B is a perspective view illustrating eight (8) assembled Rogowski coil segments of FIG. 4 mounted on a winding mandrel in accordance with the principles of the present invention.

FIG. 8B-1 is a cross-section of the device of FIG. 8B, taken along line 8B-1-8B-1, with cover installed.

Figure 1A:
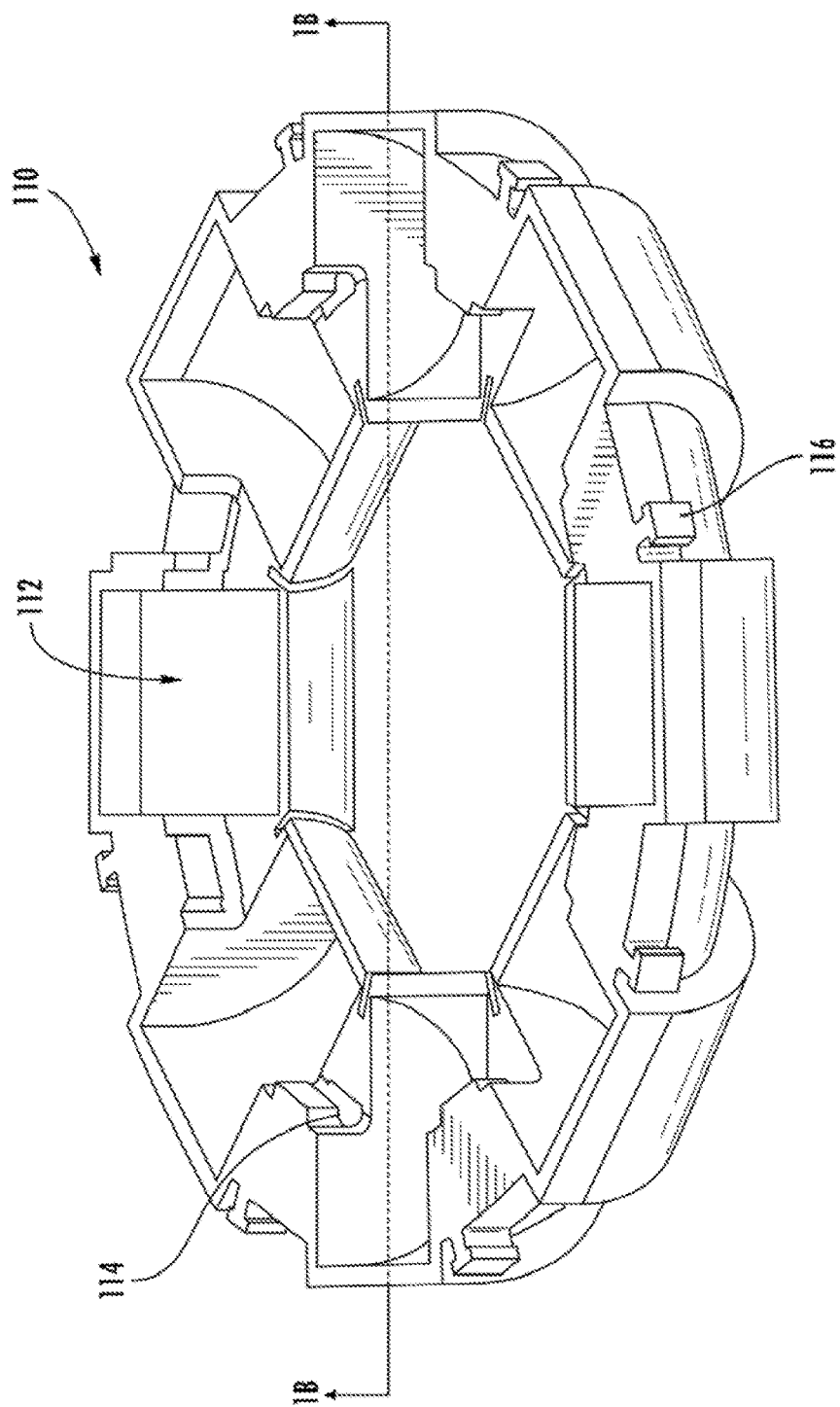
FIG. 1A is a perspective view illustrating the Rogowski coil header of FIG. 1 in accordance with the principles of the present invention.

All Figures disclosed herein are ©Copyright 2009 Pulse Engineering, Inc. All rights reserved.

DETAILED DESCRIPTION OF THE PREFERRED EMBODIMENT

Reference is now made to the drawings wherein like numerals refer to like parts throughout.

As used herein, the terms "bobbin" and "form" (or "former") are used without limitation to refer to any structure or component(s) disposed on or within or as part of an inductive device which helps form or maintain one or more windings of the device.

As used herein, the terms "electrical component" and "electronic component" are used interchangeably and refer to components adapted to provide some electrical and/or signal conditioning function, including without limitation inductive reactors ("choke coils"), transformers, filters, transistors, gapped core toroids, inductors (coupled or otherwise), capacitors, resistors, operational amplifiers, and diodes, whether discrete components or integrated circuits, whether alone or in combination.

As used herein, the term "inductive device" refers to any device using or implementing induction including, without limitation, inductors, transformers, and inductive reactors (or "choke coils".

As used herein, the terms "network" and "bearer network" refer generally to any type of data, telecommunications or other network including, without limitation, data networks (including MANs, PANs, WANs, LANs, WLANs, micronets, piconets, internets, and intranets), hybrid fiber coax (HFC) networks, satellite networks, cellular networks, and telco networks. Such networks or portions thereof may utilize any one or more different topologies (e.g., ring, bus, star, loop, etc.), transmission media (e.g., wired/RF cable, RF wireless, millimeter wave, optical, etc.) and/or communications or networking protocols (e.g., SONET, DOCSIS, IEEE Std. 802.3, 802.11, ATM, X.25, Frame Relay, 3GPP, 3GPP2, WAP, SIP, UDP, FTP, RTP/RTCP, H.323, etc.).

As used herein, the terms "network interface" or "interface" typically refer to any signal, data, or software interface with a component, network or process including, without limitation, those of the FireWire (e.g., FW400, FW800, etc.), USB (e.g., USB2, USB 3.0, USB On-the-Go, etc.), Ethernet (e.g., 10/100, 10/100/1000 (Gigabit Ethernet), 10-Gig-E, etc.), MoCA, optical (e.g., PON, DWDM, etc.), Serial ATA (e.g., SATA, e-SATA, SATAII), Ultra-ATA/DMA, Coaxsys (e.g., TVnet™), radio frequency tuner (e.g., in-band or OOB, cable modem, etc.), WiFi (802.11a,b,g,n), WiMAX (802.16), PAN (802.15), IrDA, or other wireless families.

As used herein, the term "signal conditioning" or "conditioning" shall be understood to include, but not be limited to, signal voltage transformation, filtering and noise mitigation, signal splitting, impedance control and correction, current limiting, capacitance control, and time delay.

As used herein, the terms "top", "bottom", "side", "up", "down" and the like merely connote a relative position or geometry of one component to another, and in no way connote an absolute frame of reference or any required orientation. For example, a "top" portion of a component may actually reside below a "bottom" portion when the component is mounted to another device (e.g., to the underside of a PCB).

As used herein, the term "wireless" means any wireless signal, data, communication, or other interface including without limitation Wi-Fi, Bluetooth, 3G (e.g., 3GPP, 3GPP2, and UMTS), HSDPA/HSUPA, TDMA, CDMA (e.g., IS-95A, WCDMA, etc.), FHSS, DSSS, GSM, PAN/802.15, WiMAX (802.16), 802.20, narrowband/FDMA, OFDM, PCS/DCS, analog cellular, CDPD, satellite systems, millimeter wave or microwave systems, optical, acoustic, and infrared (i.e., IrDA).

Overview

The present invention provides, inter alia, improved low cost current sensing apparatus and methods for manufacturing, and utilizing the same. In one embodiment, the current sensing apparatus are formed in segments that are, in exemplary embodiments, generally linear in nature so as to facilitate the winding of the apparatus. The formed segments are subsequently positioned into complex geometries, such as circular, polygonal, or elliptical torus/toroidal like geometries. While torus geometries are common, the formed segments can be adapted for use with a wide variety of geometries in which the conductors they are formed around are irregular in nature. In addition to substantially fixed forms, additional embodiments disclosed herein are also suitable for flexible assemblies.

The aforementioned "segmented" coil approach advantageously allows for the control of cost of manufacturing the device to be balanced against the required performance or precision level. As greater precision is required for a given application, a greater number of segments (and/or greater number of turns per segment) can be employed, which also generally corresponds to greater cost of manufacture. In low-precision applications, a lower-precision device with fewer segments and/or turns can be utilized, thereby providing the lowest possible cost for the required level of precision.

In one exemplary implementation, the segments are formed from bobbin elements with features and/or geometries that advantageously facilitate their assembly into the final completed current sensing apparatus. These bobbin elements include one or more of hinged couplings, alignment features, molded flexible webbing, etc. in order to facilitate assembly. In an alternative embodiment, the segments are formed from self-supporting bonded wire windings which are subsequently placed into a protective header element. One or more return conductor(s) or pass through conductor(s) is/are also utilized which is electrically coupled to the windings to form the current sensing apparatus.

In exemplary embodiments of the device, the header and/or bobbin elements are formed with features that are advantageously incorporated into the geometry of the device so as to support and accurately position the return conductor(s) with respect to the windings on the device. The positioning of the return conductor can be weighed against both performance considerations and manufacturing considerations in order to provide a high performance and low-cost current sensing apparatus. The positioning of the conductor can even be variable in nature; e.g., through a structure which supports multiple different positions of the conductor(s).

"Free space" or "formless" embodiments of the device are also disclosed, wherein the turns of the winding(s) (and the segments themselves) are formed and used without a bobbin or other supporting structure. In one variant, so-called "bonded" wire is used, wherein the individual turns of the winding are selectively bonded to one another (e.g., via a thermally activated adhesive or other substance) so as to maintain the turns in a desired position and orientation relative to one another, thereby obviating the bobbin and reducing manufacturing cost. In another variant, the windings (and center conductor) are encapsulated in a polymer or other encapsulating compound which "pots" the windings and conductor in relative position, and adds mechanical stability and rigidity.

"Tunable" embodiments are also envisioned that place two (2) or more of the aforementioned current sensing apparatus adjacent to one another in order to correct for segment-related electrical performance deficiencies, and/or allow for selective tuning of the coil performance by a user or installer. In one embodiment, two or more coils are arranged in a stacked or juxtaposed orientation, and placed relative to one another so as to cancel out or mitigate flux leakage associated with the gaps between coil segments. In another variant, the two or more coils are substantially concentric.

Detailed Description of Exemplary Embodiments

Detailed descriptions of the various embodiments and variants of the apparatus and methods of the invention are now provided. While primarily discussed in the context of current sensing devices, and in particular in one embodiment to current sensing devices that operate according to the Rogowski principle, the various apparatus and methodologies discussed herein are not so limited. In fact, many of the apparatus and methodologies described herein are useful in the manufacture of any number of complex coil configurations (such as wound torus shapes) that can benefit from the segmented manufacturing methodologies and apparatus described herein, including devices that do not utilize or need a pass through or return conductor.

In addition, it is further appreciated that certain features discussed with respect to specific embodiments can, in many instances, be readily adapted for use in one or more other contemplated embodiments that are described herein. It would be readily appreciated by one of ordinary skill, given the present disclosure that many of the features described herein possess broader usefulness outside of the specific examples and implementations with which they are described.

Rogowski Coil Principles—

In order to better understand various design considerations in implementing the methodologies for the manufacture of exemplary coils as described subsequently herein, it is useful to understand the underlying principles that govern the behavior of a Rogowski-type coil. As is well understood in the electronic arts, the voltage produced by a Rogowski coil is driven by Equation (1) below:

$$V = \frac{-AN\mu_0}{l} \frac{dI}{dt} \quad \text{Equation (1)}$$

Where:
A=the area of one of the small loops;
N=the number of turns;
l=is the length of the winding;
$\mu_o$=a magnetic constant; and
dI/dt=is the rate of change of the current in the loop.

In order for a real-life implementation to operate closer to the theoretical behavior set forth in Equation (1), various assumptions are made including that the turns are evenly spaced, and that the radius of the device is comparatively large as compared with the radius of the turns themselves. Accordingly, these assumptions and how they affect the sensitivity of the Rogowski coil itself should be kept in mind in the subsequent discussion of various coil devices as set forth below.

Current Sensing Apparatus—

Figure 1B:
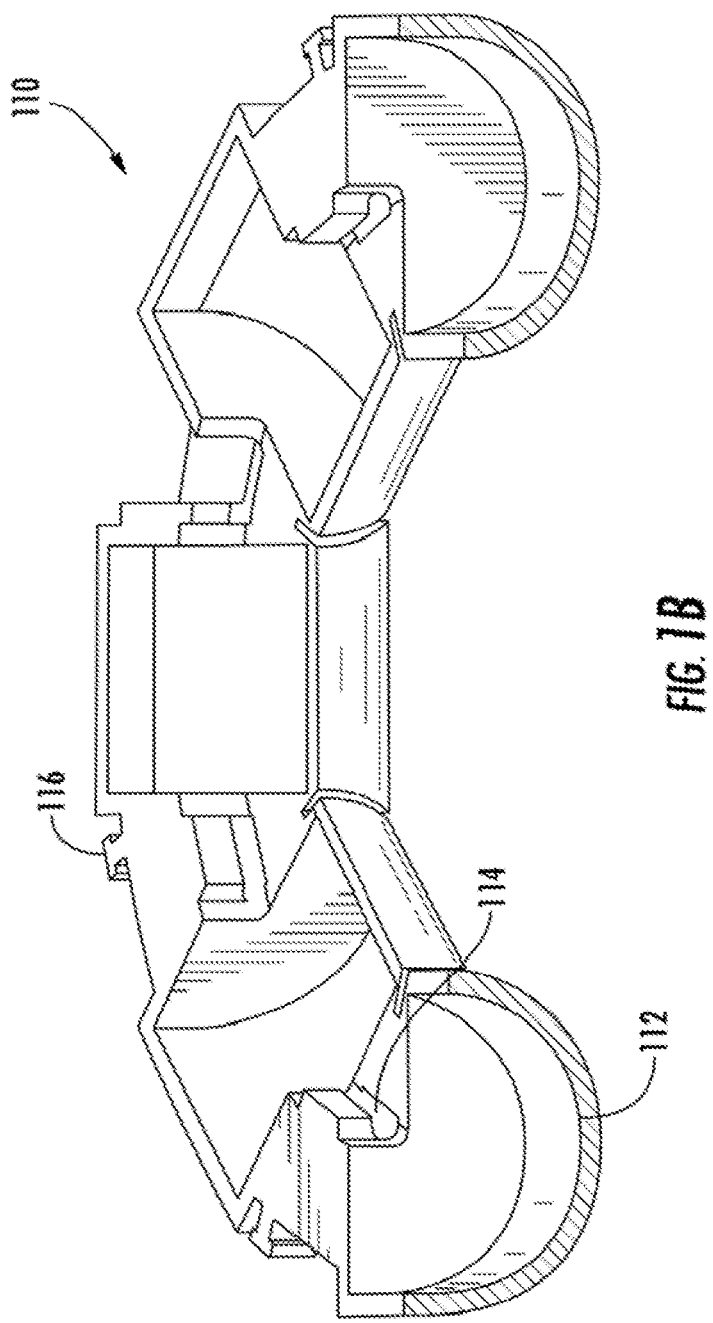
FIG. 1B is a perspective sectional view taken along line 1B-1B of FIG. 1A.
Figure 8:
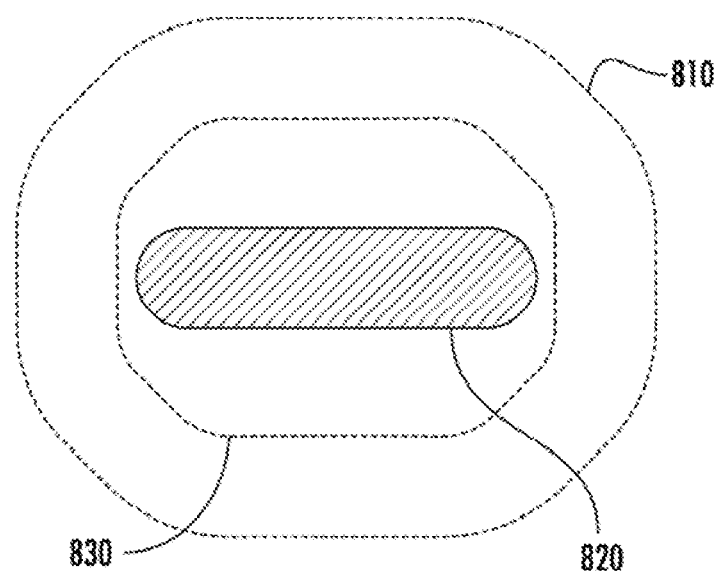
FIG. 8 is a top elevation view illustrating an alternate configuration for a Rogowski coil device positioned about a rectangular power conductor in accordance with the principles of the present invention.
Figure 8A:
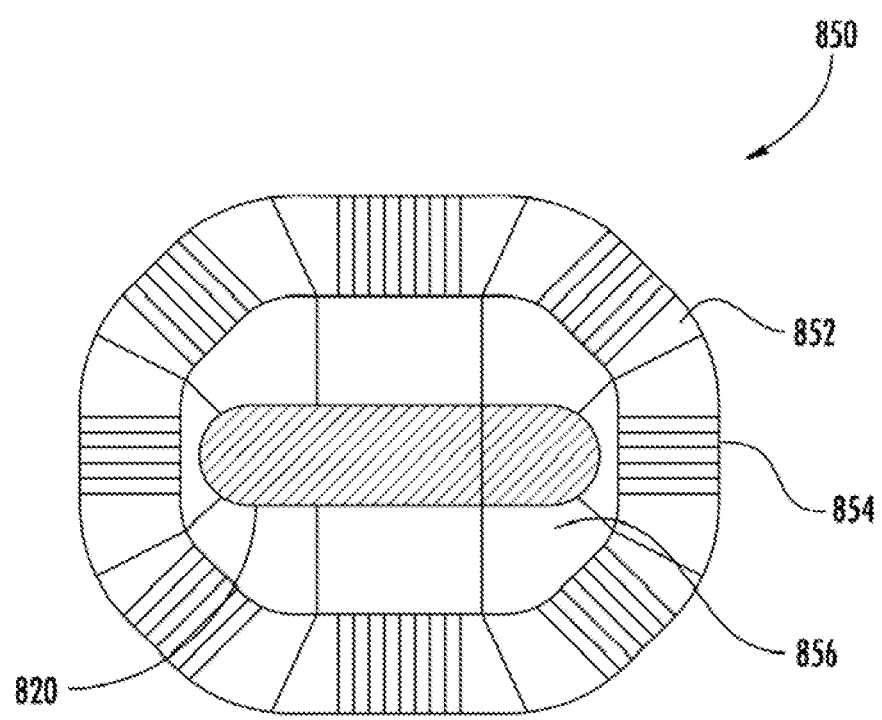
FIG. 8A is a top elevation view illustrating a first exemplary embodiment of the Rogowski coil device of FIG. 8 with alignment features incorporated thereon to prevent skewing and biasing in accordance with the principles of the present invention.
Figures 1, 8B:
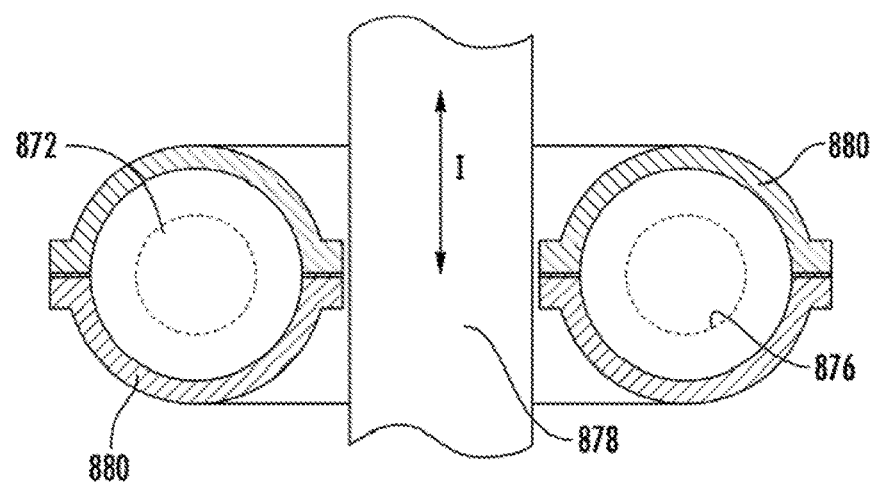
FIG. 1 is a perspective view illustrating a first embodiment of a Rogowski coil device in accordance with the principles of the present invention.
FIG. 8B is a top elevation view of another embodiment of the sensing device of the invention, adapted for use on a 4-sided (e.g., rectangular) bus bar (with cover removed).
Figure 8B:
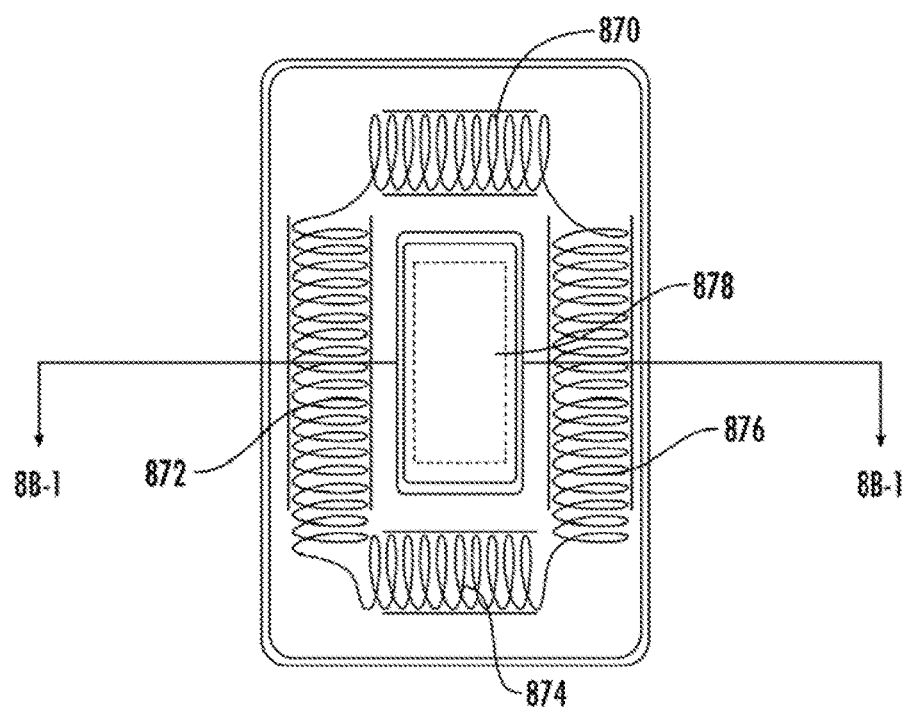

Referring now to FIGS. 1-1B, a first embodiment of a current sensing apparatus 100 is shown and described in detail. Specifically a Rogowski-type current sensing apparatus is illustrated in the embodiment of FIGS. 1-1B. FIG. 1 illustrates the main elements associated with the current sensing apparatus including a wound coil 102, a pass through or return conductor 104 and a segmented header 110.

As can be seen in FIG. 1, a first salient advantage of this device 100 over other prior art Rogowski coils is readily apparent. Specifically, typical prior art Rogowski coils emphasized a uniform distribution of coil windings throughout the entire loop of the device, which was largely believed to be necessary in order to achieve adequate electrical performance for the device. However, it has been discovered by the Assignee hereof that such prior art construction is not only difficult to manufacture (resulting in relatively high selling prices for the device), but also not necessary in order to achieve a desired level of electrical performance for the device. Rather, by segmenting the current sensing apparatus 100 into multiple substantially uniformly wound coil segments 102, the underlying device is not only easier to manufacture, but provides similar or improved electrical performance over traditional Rogowski coil devices.

In an exemplary embodiment, the coil segments 102 are wound on a linear mandrel using a bonded wire winding. Moreover, a regular insulated wire may also be used in conjunction with a bonding/gluing process. Bonded wire is a well-established product/process that is used to produce so-called "air coils". Air coils themselves are inductors, and have been conventionally used in RFID tags, voice coils, sensors, and the like. The materials and manufacturing equipment for producing bonded wire are commercially available from a variety of sources known to the artisan of ordinary skill. Bonded wire is essentially an enamel-coated wire having additional coating applied (by either the wire vendor or the device manufacturer) to the outer surfaces of the enamel. Generally, during winding, the bonded wire coating may be activated (normally by heat, although other types of processes including radiation flux, chemical agents, and so forth) to cause the coated wires to stick/bond together. This approach provides certain benefits and cost economies in the context of electronic component production. By using bonded wire, the coil segment 102 itself becomes a self supporting structure. The use of bonded wire generally is well known, and its use in constructing inductive devices is described in detail at, for example, co-owned U.S. patent application Ser. No. 10/885,868 filed Jul. 6, 2004 and entitled "Form-less Electronic Device and Methods of Manufacturing", the contents of which are incorporated herein by reference in its entirety.

The device 100 of FIG. 1 illustrates only a single coil segment 102 installed in the segmented header 110, although it is appreciated that the device 100 is intended to operate with eight (8) coil segments as illustrated. Furthermore, while eight (8) coil segments are shown, it is appreciated that more or less segments can be added depending largely on the overall size of the current sensing apparatus 100 and its desired shape/profile. The ability to modify the number of coil segments provides a distinct competitive advantage over prior art methods of manufacturing current sensing apparatus. Specifically, as the number of coil segments increases (i.e. advances towards a theoretic infinite amount of segments), the behavior of the current sensing apparatus will tend to perform more like an ideal coil, however this is at the expense of manufacturing complexity and cost. Conversely however, the number of segments can also be decreased until a minimum acceptable level of electrical performance has been achieved, thereby minimizing manufacturing complexity as well as manufacturing cost.

Referring now to FIGS. 1A and 1B, the construction of the exemplary embodiment of the segmented header 110 is more easily seen. The segmented header 110, in the illustrated embodiment, comprises eight (8) cavities 112, each associated with individual ones of the coil segments 102. Preferably, the segmented header 110 is constructed from an injection molded polymer material, although other construction materials including without limitation composites, fibrous materials (e.g. paper) and combinations of the foregoing as well as alternative methodologies (e.g., transfer molding or assembly/adhesive processes) would be readily apparent to one of ordinary skill given the present disclosure. In exemplary embodiments, multiple ones of pass through conductor retaining features 114 are positioned at multiple points along the segmented header, and between adjacent cavities 112 and are utilized to retain the pass through conductor (or conductors) 104 (FIG. 1) at a desired location with respect to the positioned coil segments 102. The retaining features 114, in the illustrated embodiment, position the pass through conductor(s) 104 along the longitudinal axis of each of the coil segments, although it is recognized that the positioning of the pass through conductor(s) may be varied (and in the case where multiple conductors may be used, may actually occupy different positions within the segments). See, for example, the discussion of FIG. 7 subsequently herein. In addition, post features 116 provide a place for the wire-wrapping of interconnection wires between segments.

While, the current sensing apparatus illustrated in FIGS. 1-1B is specifically adapted for applications in which the conductor from which the current will be ultimately sensed is capable of being passed through the center portion the apparatus 100, it is recognized that the segmented header can be manufactured such that it is not a static uniform structure. For example, it is recognized that the apparatus 100 could be hinged such that segmented header 110 is capable of being wrapped around the current carrying conductor for purposes of installation, or to permit measurement/testing by an operator/installer in the field. Furthermore, a hinged segmented header could also be readily adapted so that the flexible nature of the header operates in more than just a single rotational degree of freedom. For example, the segmented header could not only be adapted so as to permit the enclosed loop of the device to be opened and closed but also allowed to pivot and twist so as to facilitate the ability for the segmented header to be accommodated into any number of difficult installation locations in the field.

The opposing end (i.e. the portion that is not hinged) could then further be adapted with a retaining mechanism (such as a snap and the like) that retains the hinged apparatus in its closed form. It is further recognized that this can be accomplished without hinges (e.g. via the use of dowels, snaps, the tension of the pass through conductor, etc.) or via the segmentation of the header 110 into two or more separable or movable portions depending on the needs of the system in which the apparatus will be ultimately installed.

The separable or movable segmented embodiment of the current sensing apparatus 100 described in FIGS. 1-1B is also recognized to be equally applicable to the other current sensing apparatus embodiments described subsequently herein.

It should also be noted that the header 110 is, in certain applications, readily modified to facilitate the mounting of the current sensing apparatus onto an external substrate (whether via surface mount or through-hole applications). For example, in through hole applications, the header 110 incorporates apertures (not shown) which hold and position the ends of the conductors used in the current sensing apparatus at a predetermined spacing. These conductors are preferably formed from a conductive wire of sufficient thickness that deformation of the wire prior to installation is unlikely. In surface mount applications, the header is readily adapted with two or more conductive areas. These conductive areas can either be formed from discrete metallic plates that are attached to the header or alternatively, incorporated via any number of well known polymer plating processes. The ends of the conductors can then be electrically coupled to the conductive areas via soldering, resistive welding, etc., so as to form an electrical connection between the current sensing apparatus windings and the conductive areas to be mounted on an external substrate via a surface mounting process.

The current sensing apparatus (whether static or otherwise) can also optionally be encased in a clamshell cover or otherwise encapsulated/molded/over-molded, etc. to protect against dirt and debris as well as provide enhanced resistance to high voltages from, for example, the conductor that is being measured by the current sensing apparatus. In addition, it has been found that in certain implementations, the performance of the current sensing apparatus is extremely sensitive to deformations to the coil segments 102. Accordingly, by encasing the current sensing apparatus in a clamshell cover or otherwise encapsulating the windings, the performance of the current sensing apparatus can be protected at a relatively inexpensive cost to the end customer. In addition to static embodiments (i.e. where the encased apparatus 100 is substantially rigid), it is recognized that flexible embodiments can be readily implemented by using an encasement that is flexible. Such a flexible device is, in an exemplary variant, formed by utilizing a rubberized shrink tubing disposed about at least portions of the header 110.

Figure 1C:
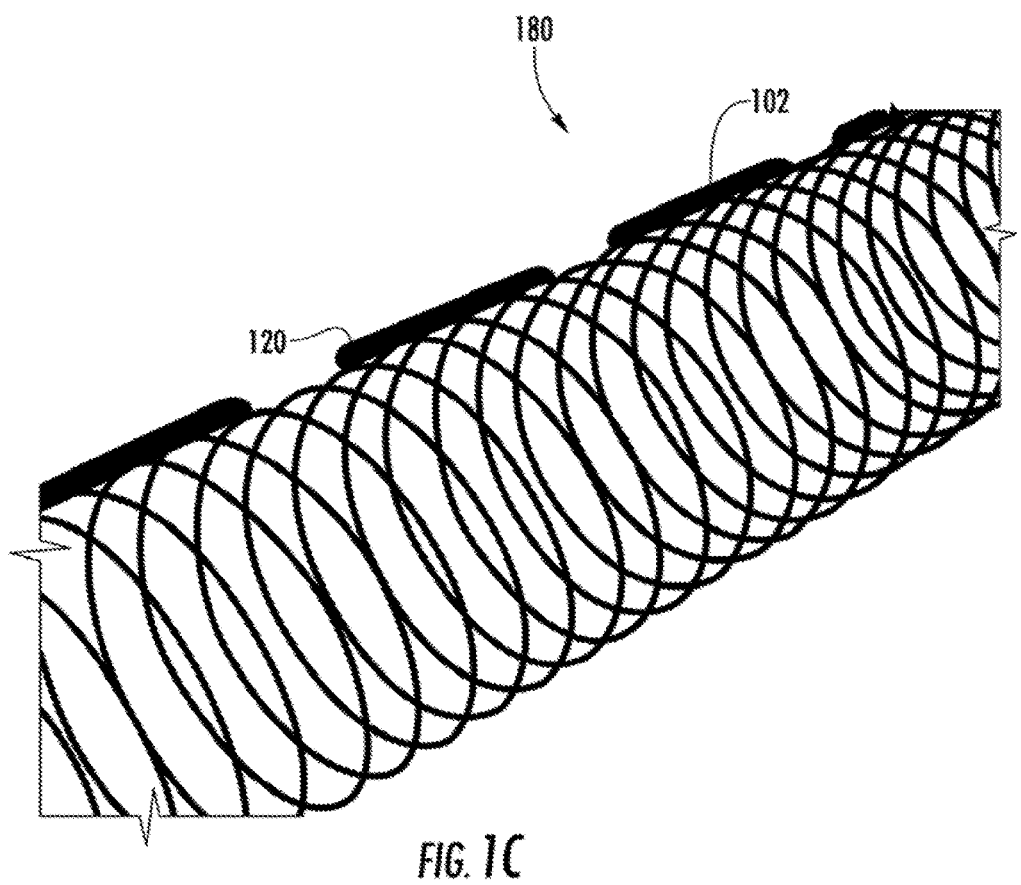
FIG. 1C is a perspective view illustrating a Rogowski coil formed by the segmented or continuous application of an adhesive in accordance with the principles of the present invention.

Referring now to FIG. 1C, an alternative embodiment of the current sensing apparatus illustrated in FIGS. 1-1B is shown and described in detail. Specifically, the embodiment of FIG. 1C illustrates a continuously constructed helical coil for use with or without a header or bobbin element as illustrated in FIG. 1. The current sensing apparatus 180 of FIG. 1C is effectively divided into segments 102 via use of a bead of adhesive 120 disposed e.g., on the inner circumference of the coil. Depending on the particular application, the types of adhesive utilized can very widely. For example, where some flexibility is desired within individual segments 102, a flexible adhesive (such as silicone) is used to allow some movement between individual turns of wire within a segment 102. Alternatively, where flexibility is not desired, a harder adhesive, such as a two-part epoxy, is used to limit the amount of movement between individual turns of wire within a segment.

In the embodiment illustrated, the current sensing apparatus is formed on a mandrel in one continuous winding. The adhesive is then placed in segmented portions 102 on the inner diameter of the finished current sensing apparatus using an auto-dispensing apparatus, thereby substantially automating the manufacture of the current sensing apparatus. Note also that the return conductor (not shown) is routed in the interior of the coil prior to winding. Although the adhesive is primarily envisioned as being placed on the inner diameter of the finished current sensing apparatus, it is recognized that alternative embodiments could readily place the adhesive anywhere else on the windings (such as the outer diameter) and even at multiple locations on the windings (to further secure and minimize movement between adjacent windings in any given segment). In addition, while the adhesive is primarily envisioned as being disposed onto the windings in discrete segments, it is recognized that the bead of adhesive placed on the windings can be continuously applied along the length of the windings, especially in cases where the adhesive used cures in a flexible form.

Advantageously, the foregoing process also lends itself to mass, parallel manufacturing operations. For instance, one long mandrel can be used, with the segments for many coils being formed (and cured if applicable) thereon, with the foregoing adhesive being applied rapidly in one movement down the mandrel. The individual coils can then be severed on the mandrel (or after removal of the entire assembly from the mandrel if desired), and the individual severed coils formed into the desired shape (e.g., substantially circular or polygonal) and terminated. Similarly, multiple such mandrels can be processed in parallel, up to the limitations of the manufacturing equipment. Such mass manufacturing provides yet additional economies of scale over those afforded by the coil design alone.

The device of FIG. 1C can also be encapsulated within a host compound if desired (e.g., potting compound, silicone, etc.) such that its mechanical rigidity is substantially maintained, at least in the critical dimensions. Specifically, it has been recognized by the inventor(s) hereof that the coils described herein may in many cases be sensitive (in terms of degradation in performance) to changes in the cross-sectional area or profile of the turns of each segment. For instance, if the coils of the segments in the device of FIG. 1C were crushed or distorted, the accuracy of the device as a whole can degrade significantly. This dimension is more important than, for example, maintaining the "circularity" of the device as a whole, as well as maintaining the conductor(s) being monitored within the geometric center of the coil/polygon, the device advantageously being largely tolerant to the latter. Accordingly, the mechanical stability of at least the cross-sectional area of the coil turns is a salient consideration in many applications. Whether such stability is maintained via use of a hard or rigid exterior "shell" (e.g., a case, or alternatively a sleeve or other such arrangement which enshrouds the exterior of the coil), or via encapsulation, or via internal support such as a bobbin or header is largely a design choice.

Figure 1D:
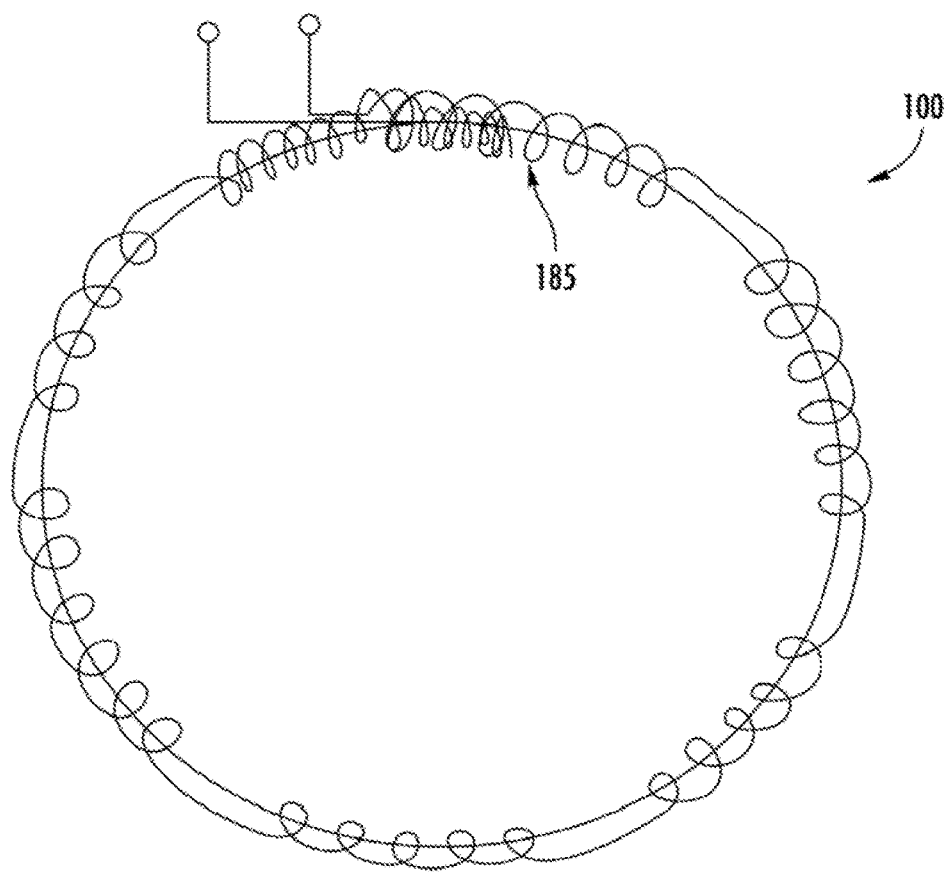
FIG. 1D is a top elevation view illustrating a field installable Rogowski coil device with overlapping conductor ends in accordance with the principles of the Rogowski coil.

FIG. 1D illustrates a top down view of a current sensing apparatus 100 as illustrated in, for example, FIG. 1C that does not possess a header element as illustrated in FIGS. 1-1B. Specifically, FIG. 1D illustrates a first exemplary way of making the current sensing apparatus field-installable around a conductor (without necessitating the removal of the conductor from the device to which the conductor is attached). The current sensing apparatus illustrated in FIG. 1D possesses an overlapping end 185 that can be routed around a conductor. The overlapping end can then be attached via an adhesive and the like to the other "end" of the coil. In this fashion, the free ends of the coil device can be routed around the extant conductor installation, and the two ends overlapped and secured in place, thereby forming an effectively unbroken loop. While it will be appreciated that such an "overlapping" configuration has less precision than a comparable "unbroken" device (e.g., one with no ends per se, but rather made as a continuous loop), it also affords the aforementioned capability of field installation without disassembly, and also very low manufacturing cost (as described in greater detail below).

It is noted that while the device of FIG. 1D illustrates the two ends of the coil overlapping in the vertical plane (i.e., normal to the plane of the Figure), the overlapping ends may overlap radially, while maintaining a "flat" vertical profile (i.e., one end being disposed at a radius smaller than that of the other end).

The two free ends of the device of FIG. 1C can be joined using any number of different techniques, including (without limitation): (1) merely utilizing the existing rigidity or malleability of the coil device if applicable to maintain the two ends in the desired proximate relationship (i.e., "bending" the device into shape); (2) an adhesive to bond the two ends; (3) a section of shrink tubing (e.g., shrinks when heated) of the type well known in the electrical and environmental sealing arts; (4) a plastic or other tie-wrap; (5) using tape (e.g., electrical or duct tape); or (6) a molded or formed snap-fit assembly disposed on the two respective ends. Each of the foregoing (to varying degrees) provide the benefit of very low cost, especially when used in conjunction with the cost-effective forming techniques for the device itself.

Figure 1E:
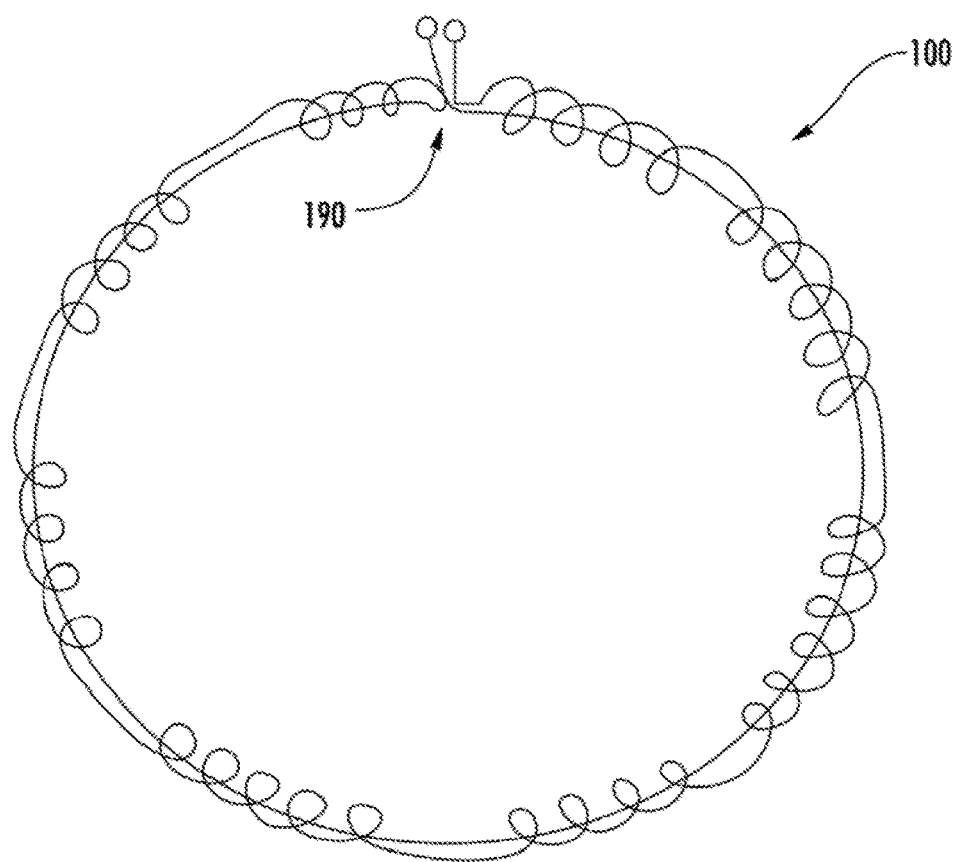
FIG. 1E is a top elevation view illustrating a field installable Rogowski coil device with abutting conductor ends in accordance with the principles of the Rogowski coil.

FIG. 1E illustrates an alternative field-installable embodiment of the device, in which the free ends of the current sensing apparatus 100 abut one another at 190. The embodiment of FIG. 1E is anticipated to be higher in cost to manufacture than that shown in FIG. 1D, but provides better electrical/magnetic performance (precision) over the previous embodiment illustrated in FIG. 1C, due largely to the fact that the abutted ends effectively allow the coil to be nearly "perfect" in shape, and obviate any overlap (which causes magnetic distortions and leakage). The ends of the current sensing apparatus can be abutted using any number of assembly techniques including, without limitation: (1) a locating pin coupling; (2) a magnetic coupling; (3) a screw-on coupling; (4) a shrink tube coupling; and (5) a snap/pivot type coupling. With regards to the use of a magnetic coupling, it should be noted that the use of magnet does not influence a change in the current to be measured (i.e. dI/dt) and accordingly, advantageously does not affect the electrical performance capabilities of the device. The embodiment of FIG. 1D is somewhat more costly to manufacture than that of FIG. 1C (due in large part to the cost of the abutting requirement for the coupling), yet also provides greater precision.

It will also be recognized that the embodiments of FIGS. 1D and 1E may be fashioned so as to be flexible in multiple dimensions. For instance, in one variant, the coil ends can be pulled apart somewhat (so as to permit wrapping around an installed conductor or bus bar) due to the flexibility of the coil (particularly, the gaps between segments), yet also varied vertically with respect to one another (i.e., maintain the same radius, yet move relative to one another as torsional forces are applied to both ends). In another variant, only a prescribed portion of the coil (e.g., a "hinge" region; not shown) is permitted to flex significantly. This can be accomplished in any number of different ways, such as by using a thinner covering material, or actual mechanical hinge, in the hinge region, so that it flexes preferentially in that region.

Figure 2:
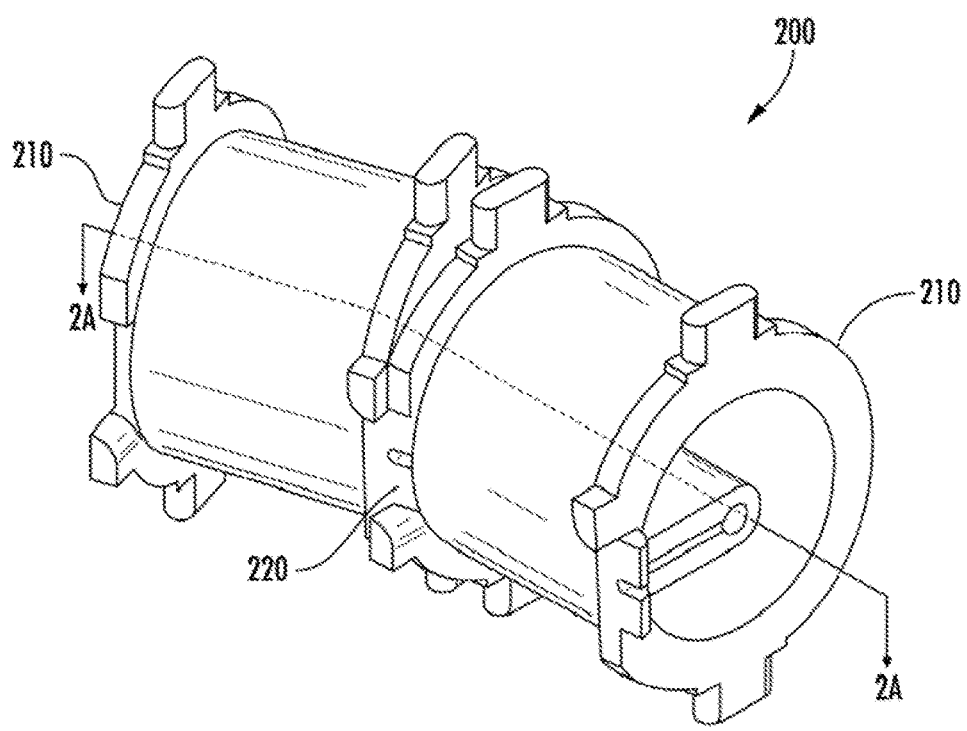
FIG. 2 is a perspective view illustrating a portion of a second embodiment of a Rogowski coil device in accordance with the principles of the present invention.
Figure 2A:
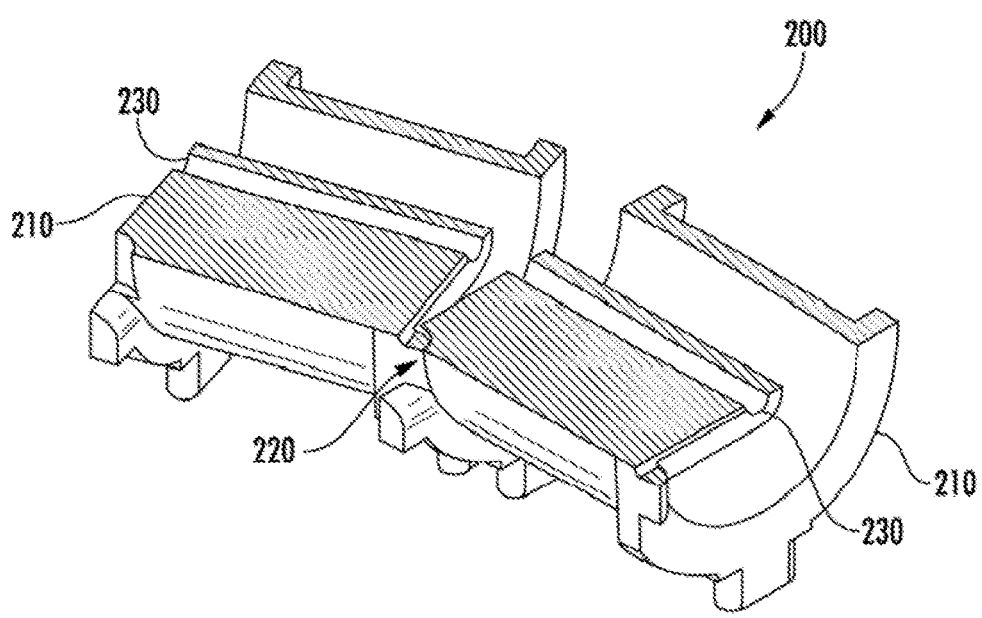
FIG. 2A is a perspective sectional view taken along line 2A-2A of FIG. 2.
Figure 2B:
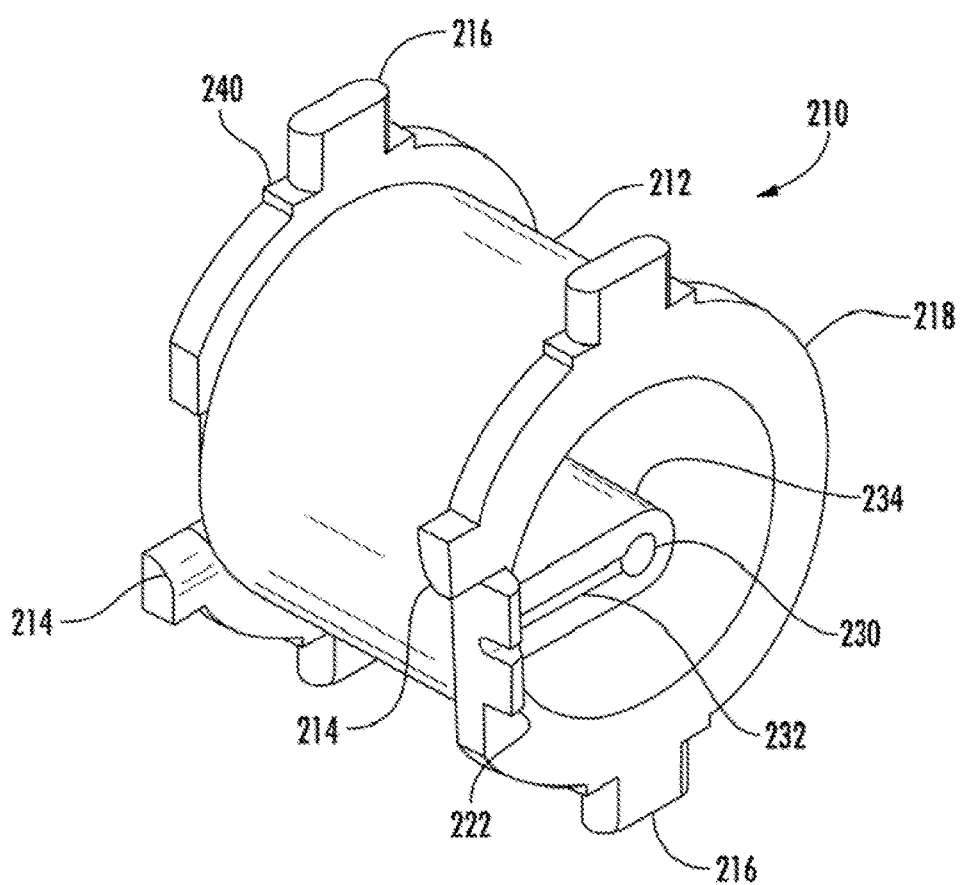
FIG. 2B is a perspective view of a single Rogowski coil segment, as illustrated in FIG. 2, in accordance with the principles of the present invention.
Figure 2C:
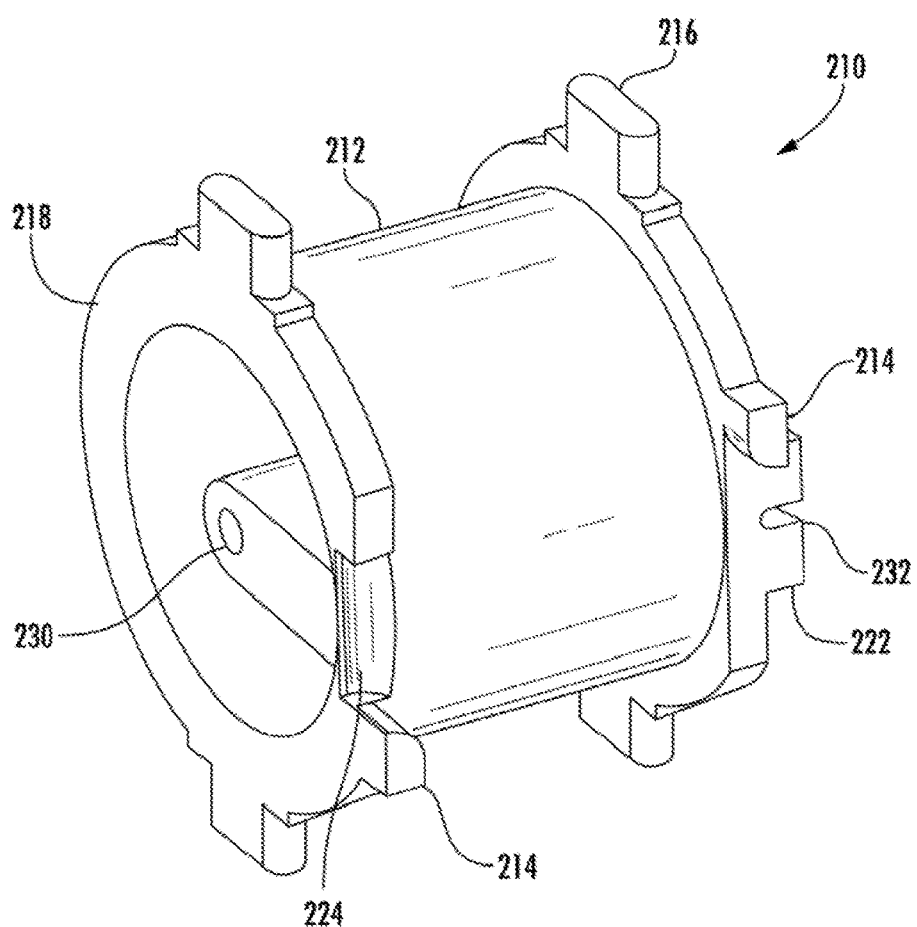
FIG. 2C is a perspective view of the single Rogowski coil segment illustrated in FIG. 2B, shown from a different perspective.

Referring now to FIGS. 2-2C, a second exemplary embodiment of a header- or bobbin-based current sensing apparatus 200 is shown and described in detail. Specifically, the current sensing apparatus 200 of FIGS. 2-2C comprise multiple ones of segmented bobbin elements 210. Each of these bobbin elements 210 is disposed next to one another via an optionally hinged coupling 220. In one exemplary embodiment, this hinged coupling 220 includes features (such as snaps and the like) which retain adjacent segmented bobbin elements so that they remain attached to one another, however it is recognized that in alternative embodiments the hinged coupling may provide only a pivoting, as opposed to a pivoting and retaining function. In an alternative embodiment, the hinged coupling may be accomplished by molding a thin web of connecting material between adjacent ones of bobbin elements 210. Such a configuration could be made static (such as for use in embodiments in which the final application geometry is known) or flexible as described previously herein. The coupling may also be made frangible; i.e., severable after a limited number of loading cycles, if desired, so as to facilitate selective separation of the components.

Referring now to FIGS. 2 and 2A, a partial segment of a current sensing apparatus 200 is shown. Specifically, only a forty-five degree (45°) segment of a three-hundred sixty degree (360°) apparatus 200 is illustrated. Accordingly, as can be seen in the illustrated embodiment, the complete apparatus 200 would consist of eight (8) segmented bobbin elements 210. While eight elements are contemplated, this number is arbitrarily defined by the underlying geometry of the current sensing apparatus application as well as defined performance parameters. Hence, it is readily recognized that more or less elements, and elements of different shapes or configurations (including also heterogeneous "mixes" of two or more different bobbin element configurations) could be utilized in alternative embodiments.

The embodiment illustrated in FIGS. 2-2C also includes a central passageway 230 that is intended to position the pass through conductor at a precise location within each of the segmented bobbin elements. In the illustrated configuration, the passageway is positioned along the longitudinal axis (i.e., the geometrical center) of each of the cylindrical bobbin elements 210; however, as noted elsewhere herein, the position of the central conductor(s) may be (i) non-symmetrical with respect to the cross-section of passageway 230 or bobbin element; (ii) may be variable or changeable; and/or (iii) may reside at other locations.

FIGS. 2B and 2C illustrate differing perspective views of a single segmented bobbin element 210 according to one embodiment. The bobbin element 210 is characterized by a winding channel 212 adapted for receiving one or more layers of windings, while flanges 218 retain the windings in the winding channel 212 resulting in a uniform distribution of the windings within the bobbin element 210. While the winding channel is illustrated with a smooth winding barrel, it is appreciated that grooves could be formed into the winding barrel in order to provide additional features to guide the windings so that they are wound more uniformly. Moreover, the cross-section of this "barrel" need not be symmetric, and/or can also include segmentation (i.e., may comprise an octagon, ellipse, polygon, etc. in cross-section).

Positioned on opposing ends of the flanges are alignment posts 216 positioned above standoffs 240. These alignment posts 216 are optional but are utilized to facilitate individual placement of the bobbin elements 210 within an encapsulating header (see for example FIG. 4A, 460 described subsequently herein). Routing posts 214 are utilized for facilitating the routing of the windings between individual ones of bobbin elements 210 during automated winding on a mandrel as will be discussed more fully subsequently herein. These routing posts 214 act as entry/exit points for the wire wound within the winding channel 212.

Recall the discussion of the hinged coupling 220 with regards to FIG. 2A. As can be seen in FIGS. 2B and 2C, the hinged coupling comprises a protruding portion 222 and a respective receptacle portion 224 which is sized so as to accommodate the protruding portion from an adjacent bobbin element 210. Routing channel 232 can also optionally be utilized to route the exit wire of the last segment to the return wire inside the coil. Note that in the illustrated embodiment the hinged coupling 220 does not include elements that allow adjacent elements 210 to remain movably coupled to one another. Rather, the tension associated with the respective windings and pass through conductor is actually used to retain the assembled current sensing device in its finished torus-like shape. However, it is recognized that alternative embodiments may readily include features that physically couple adjacent elements 210 to one another, use adhesives or other bonding agents, etc.

Figure 3:
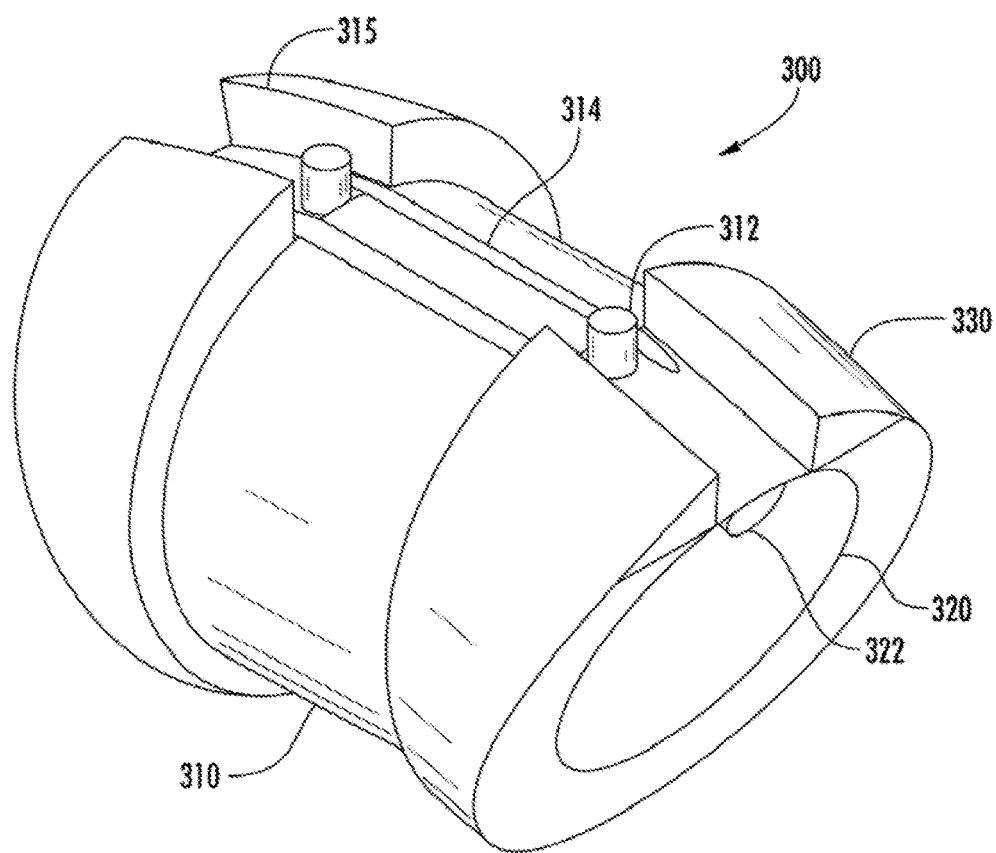
FIG. 3 is a perspective view illustrating a single Rogowski coil segment for a third embodiment of a Rogowski coil device in accordance with the principles of the present invention.
Figure 3A:
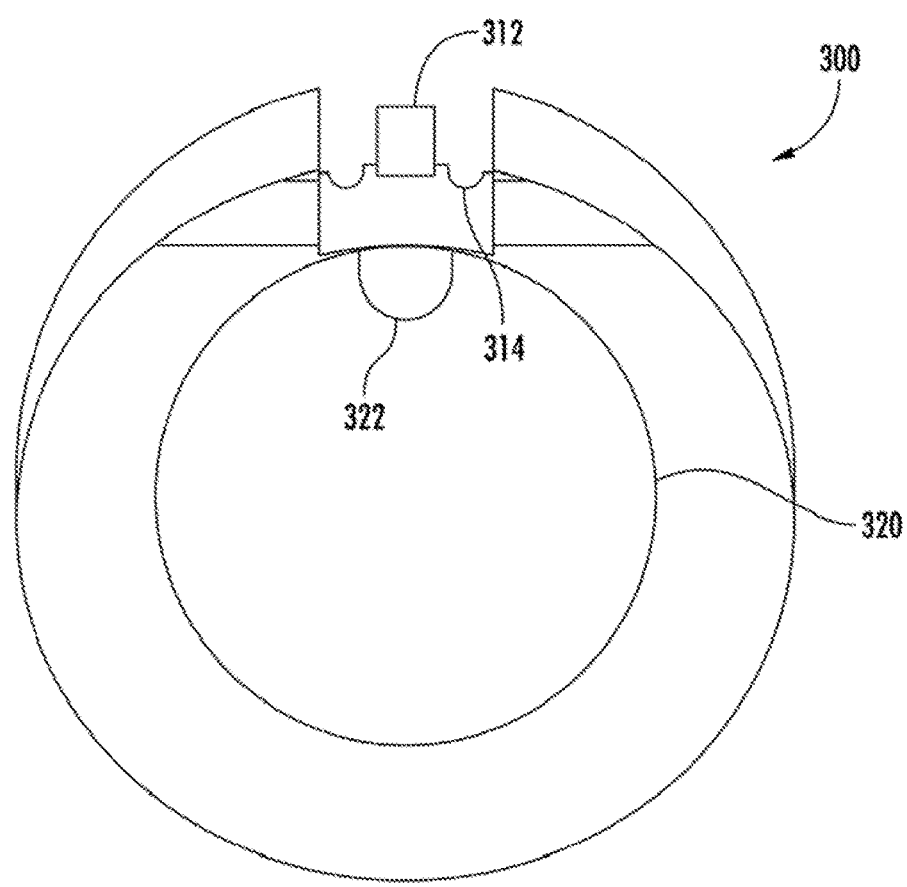
FIG. 3A is a side elevation view of the Rogowski coil segment illustrated in FIG. 3.
Figure 3B:
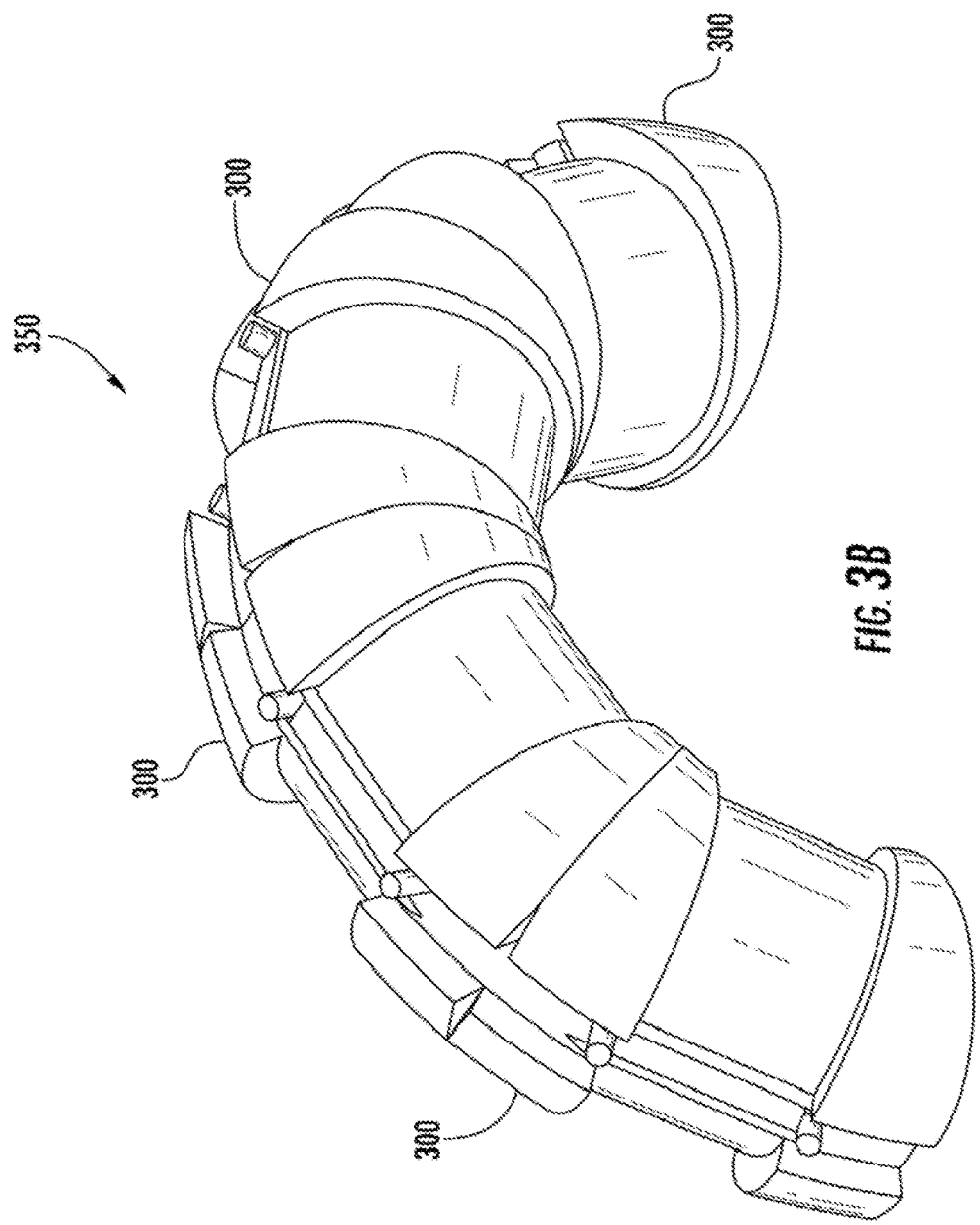
FIG. 3B is a perspective view illustrating four (4) assembled Rogowski coil segments, as illustrated in FIG. 3, forming one-half of a Rogowski coil device in accordance with the principles of the present invention.
Figure 3D:
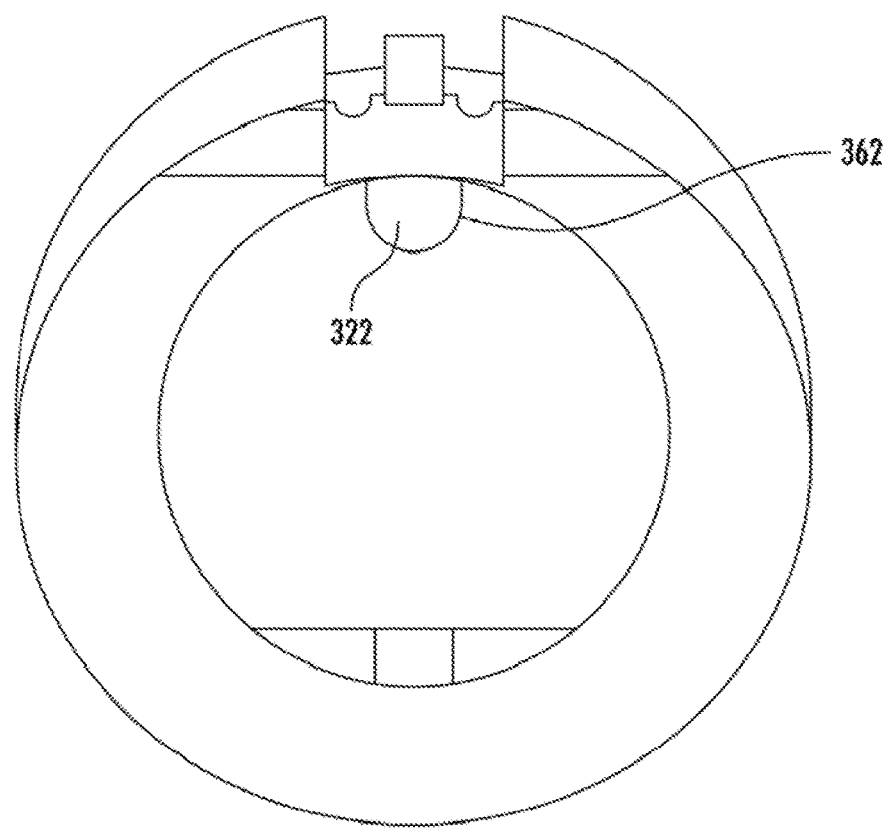
FIG. 3D is a side elevation view of the winding mandrel mounted Rogowski coil segments shown in FIG. 3C.

Referring now to FIGS. 3-3D, yet another embodiment for a Rogowski-type current sensing device 350 is illustrated. FIG. 3 illustrates a single bobbin element 300, of which eight (8) are required (for the illustrated embodiment) to create a single current sensing device 350. It is recognized that more or less bobbin elements, those of heterogeneous configuration, etc. could be utilized in alternative embodiments as discussed previously with respect to other embodiments. Unlike the bobbin element 210 of FIGS. 2-2C, the bobbin element 300 of FIG. 3 does not necessitate a hinged coupling. Instead, the bobbin element 300 of FIG. 3 is constructed so that they collectively form the torus-like structure of the current sensing device 350 when bobbin elements 300 are placed adjacent to one another. See for example, FIG. 3B which shows exactly one half (i.e. four (4) bobbin elements) of the current sensing device 350. Each bobbin element includes a winding channel 310, which is defined by respective flange elements 330. These flange elements maintain and define the winding width for the winding channel 310. The bobbin element 300 further comprises routing posts 312 which again are utilized as exit/entry points for the winding as they exit and enter the winding channel 310. In addition, these exit/entry points can also be used to anchor the pass through or return conductor prior to winding. Optional pass through conductor routing channels 314 are included adjacent to the routing posts 312. The routing channels 314 are adapted to accommodate one or more pass through conductors underneath the windings placed within winding channel 310. Accordingly, the pass through conductor which is routed through channel 315 advantageously helps to maintain the structural integrity of the assembled device 350 when assembled, via tension applied to the pass through conductor (not shown).

In an alternative embodiment, the pass through conductor can instead be routed through the center cavity 320 (i.e., along the inner diameter of the center cavity). Furthermore, the bobbin element 300 could be readily be adapted to accommodate through a central passageway constructed within the center cavity 320 (similar to that shown in FIG. 2B, 230). These and other embodiments would be readily apparent to one of ordinary skill in the art given the present disclosure.

FIG. 3A illustrates a side elevation view of the bobbin element 300 shown in FIG. 3. Specifically, as can be seen in FIG. 3A, despite the curved geometry of the bobbin element 300, center cavity 320 passes, in the illustrated embodiment, in a straight line through the body of the bobbin element. This facilitates the automated winding of the bobbin element (see e.g., FIGS. 3C-3D). Keyed notch 322 also passes linearly along the inside wall of the center cavity 320, thereby providing a feature that can be received within a respective slot (see FIG. 3D, 362) on a mandrel which allows the bobbin element 300 to be rotated with precision during the winding process.

FIGS. 3C and 3D illustrate four (4) such bobbin elements 300 mounted on a mandrel 360. Note that because the bobbin elements 300 are configured in a linear fashion, the automated winding of the final "torus-like" shape is very much simplified over a truly torus (circular) shape. The collar 370 is mounted on the end of the mandrel 360 and secures the bobbin elements onto the mandrel 360. The embodiment illustrated in FIGS. 3-3D can then optionally be encased in a header or housing, such as e.g., an over-lapping clamshell type header (not shown) or other encasement.

Figure 4:
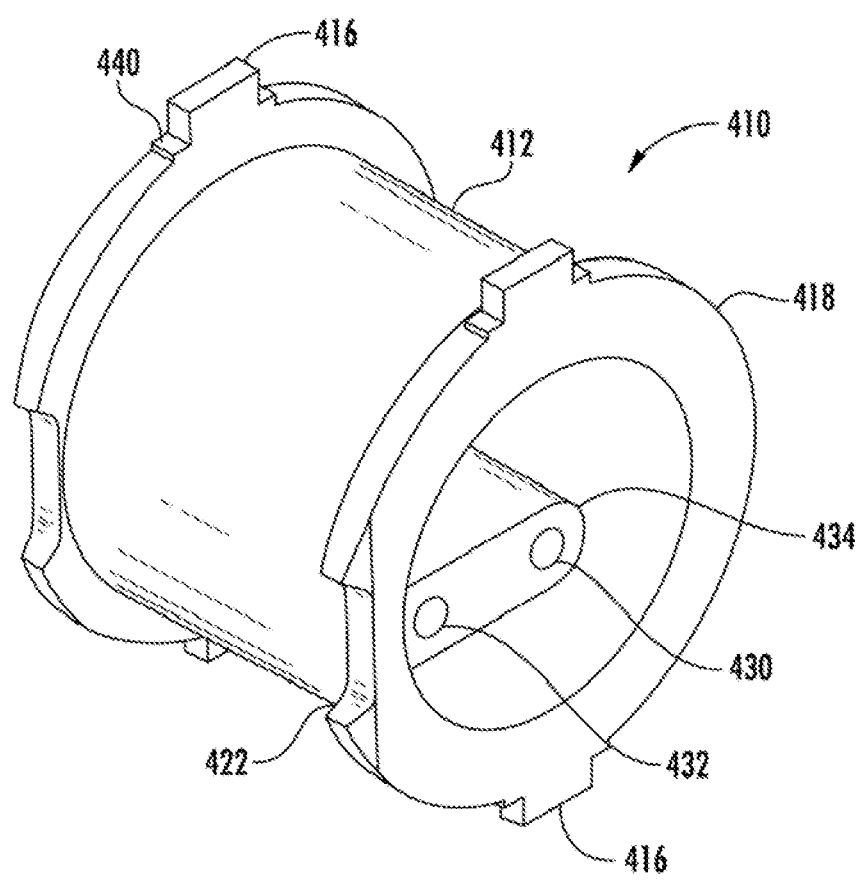
FIG. 4 is a perspective view illustrating a single Rogowski coil segment for a fourth, embodiment of a Rogowski coil device in accordance with the principles of the present invention.
Figure 4A:
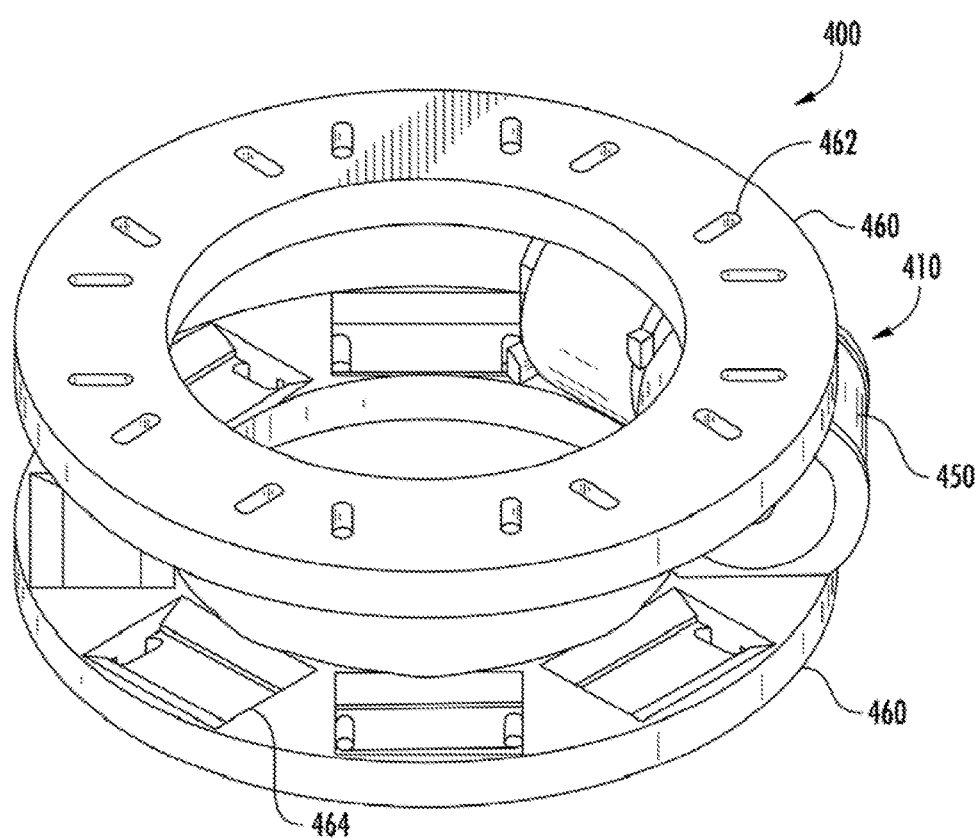
FIG. 4A is a perspective view illustrating two wound Rogowski coil segments, as illustrated in FIG. 4, mounted between two header segments in accordance with the principles of the present invention.

Referring now to FIGS. 4-4B, a fourth exemplary embodiment of a current sensing apparatus 400 is shown and described in detail. Specifically, the current sensing apparatus 400 of FIGS. 4-4B comprise multiple ones of segmented bobbin elements 410. Each of these bobbin elements 410 are disposed next to one another via the use of an external ring-like header 460 (FIG. 4A). FIG. 4 illustrates a partial segment of the current sensing apparatus 400 of FIG. 4A. Specifically, only a forty-five degree (45°) segment of a three-hundred sixty degree (360°) apparatus 400 is shown. Accordingly, in the illustrated embodiment, the complete apparatus 400 would consist of eight (8) segmented bobbin elements 410, as can be seen by counting the number of cavities 464 on the ring-like headers 460 of FIG. 4A. The bobbin element 410 illustrated in FIG. 4 includes a central passageway 430 that is intended to position the pass through conductor at a precise location within each of the segmented bobbin elements. In the embodiment illustrated, the passageway is positioned along the longitudinal axis of the cylindrical bobbin element 410. The bobbin element 410 of FIG. 4 also includes an alternative passageway 432 which can be utilized to route the return wire through the center of the bobbin segment for the purpose of facilitating assembly. The bobbin element 410 is characterized by a winding channel 412 adapted for receiving one or more layers of windings, while flanges 418 retain the windings in the winding channel 412 resulting in a uniform distribution of the windings within the bobbin element 410. Positioned on opposing ends of the flanges are alignment posts 416 positioned above standoffs 440. These alignment posts 416 are optional but are utilized to facilitate individual placement of the bobbin elements 410 within the header 460. Routing features 422 are utilized for facilitating the routing of the windings between individual ones of bobbin elements 410 during automated winding on a mandrel as will be discussed more fully subsequently herein with respect to FIG. 4B. These routing features 422 act as entry/exit points for the wire wound within the winding channel 412.

FIG. 4B illustrates the individual bobbin elements 410 mounted on a mandrel 470 for the purpose of the automated winding of individual ones of the bobbin elements. As can be seen, a slot 472 is machined or otherwise formed in the winding mandrel 470. This slot 472 is sized to accommodate a respective feature 434 (FIG. 4) on the individual bobbin elements which facilitates the winding operation. A collar 480 is placed over an end of the mandrel 470 in order to secure and position the individual bobbin elements 410 at a reliable location along the shaft of the mandrel. This approach permits repeatability and consistency during the winding process, without necessitating the use of vision equipment to help locate the feed end of the automated winder.

Note also that all eight (8) segments 410 utilized to form the current sensing apparatus are disposed on a single winding mandrel 470. While previous embodiments (FIG. 3C) have illustrated only a portion of the entire sensing apparatus being formed at any one time on a mandrel, the embodiment of FIG. 4B illustrates an embodiment in which all segments can be wound in a single winding operation. The wound segments can then be subsequently removed from the mandrel and placed into the headers 460 as shown in FIG. 4A.

Figure 5:
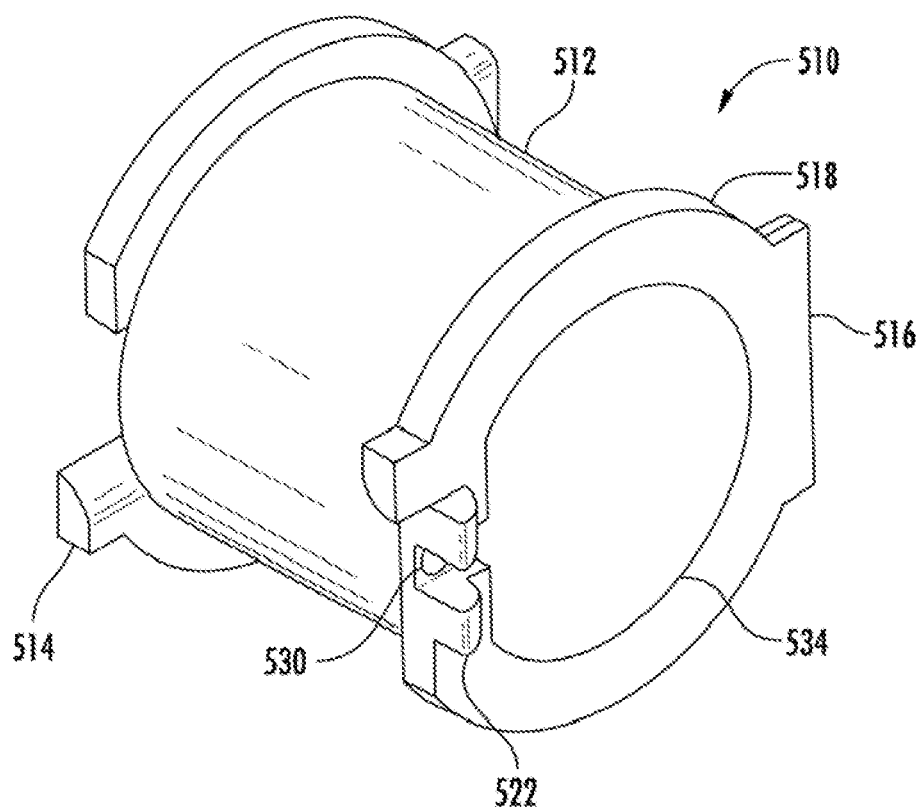
FIG. 5 is a perspective view illustrating a single Rogowski coil segment for a fifth embodiment of a Rogowski coil device in accordance with the principles of the present invention.
Figure 5A:
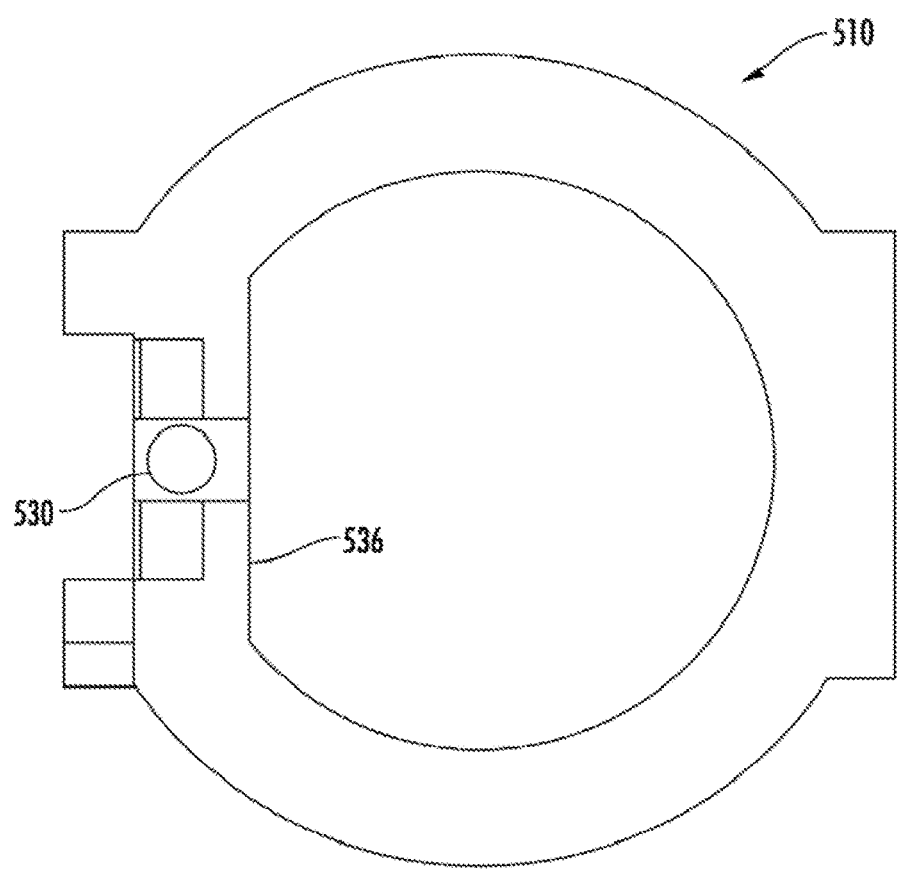
FIG. 5A is a side elevation view illustrating the single Rogowski coil element of FIG. 5.
Figure 5B:
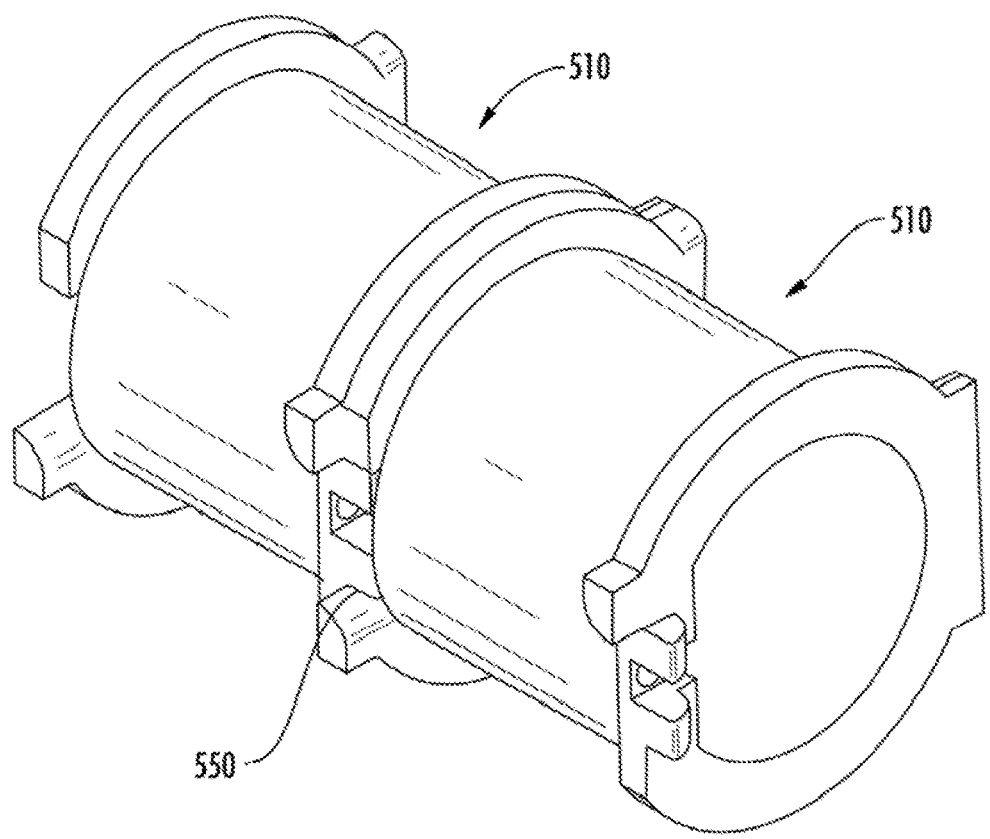
FIG. 5B is a perspective view illustrating two Rogowski coil segments of FIG. 5 mountable together in accordance with the principles of the present invention.
Figure 5C:
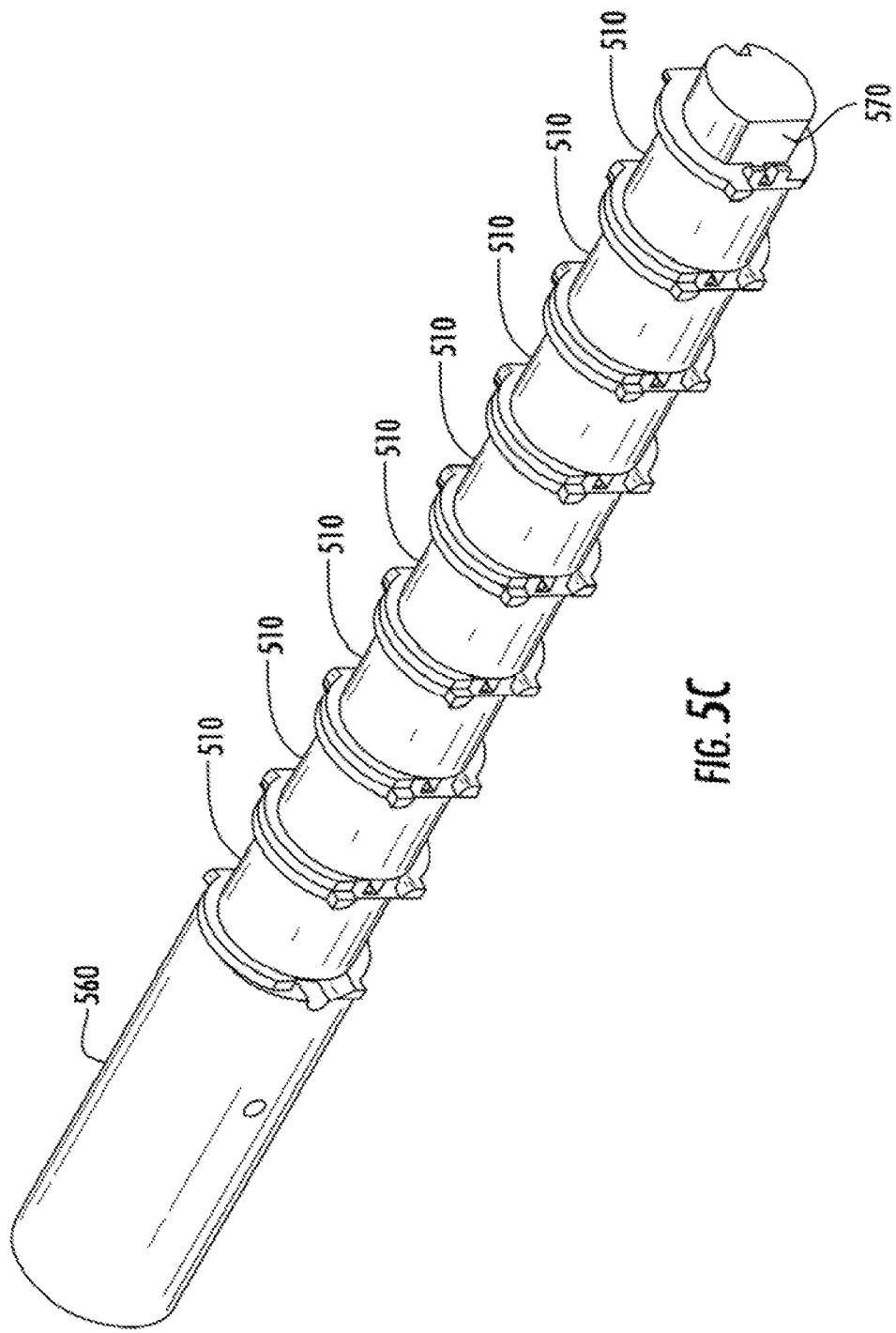
FIG. 5C is a perspective view illustrating eight (8) assembled Rogowski coil segments of FIG. 5 mounted on a winding mandrel in accordance with the principles of the present invention.

Referring now to FIGS. 5-5C, yet another embodiment of a bobbin element 510 for use in a current sensing device is shown and described in detail. The bobbin element illustrated in FIG. 5 is similar in construction with the hinged embodiment previously illustrated in FIGS. 2-2C. Specifically, the embodiment illustrated in FIG. 5 is similar in that it possesses a winding channel 512 defined by outer winding flanges 518. Furthermore, the embodiment illustrated further includes routing posts 514 for facilitating the routing of magnet wire between adjacent ones of winding channels (see FIG. 5C). The hinge element 522 also is adapted for receipt in a respective feature located on an adjacent bobbin element 510 and acts as a pivot point for the bobbin elements, similar to the functionality as described with regards to FIGS. 2-2C. See also the hinge point 550 illustrated in FIG. 5B. In addition, the collective bobbin elements can then optionally be placed inside of a clamshell type cover (not shown) or other encasement, or between a pair of header elements (similar to that shown in FIG. 4A, 460).

However, unlike the previous embodiments discussed, the embodiment of the bobbin element 510 illustrated in FIG. 5 differs in that the pass through or return conductor(s) (not shown) is not routed through the center aperture 534, as has been illustrated in the previous embodiment of FIGS. 2-2C; rather wire routing aperture 530 is utilized for this purpose. The wire routing aperture 530 is positioned within the body of the winding barrel, the outer diameter of which defines the winding channel 512. Such a configuration has advantages in terms of assembly, as the pass through conductor is resident on the inner diameter of the finished current sensing device. Because the pass through conductor is on the inner diameter, the length of the pass through conductor advantageously does not need to be significantly lengthened as the individual bobbin elements 510 are formed into their final torus shape. This allows for, inter glia, greater simplicity and efficiency in manufacturing and assembly.

In addition, as the pass through conductor is not positioned within the center aperture 534, it can be easily accommodated during the mandrel winding process with the individual bobbin elements 510 each mounted on the mandrel 560. Note also that flat surface 536 (as perhaps is best shown in FIG. 5A) corresponds with a flat surface 570 located on the mandrel 560. This geometry helps ensure that the bobbin elements 510 spin as the mandrel spins.

Figure 6:
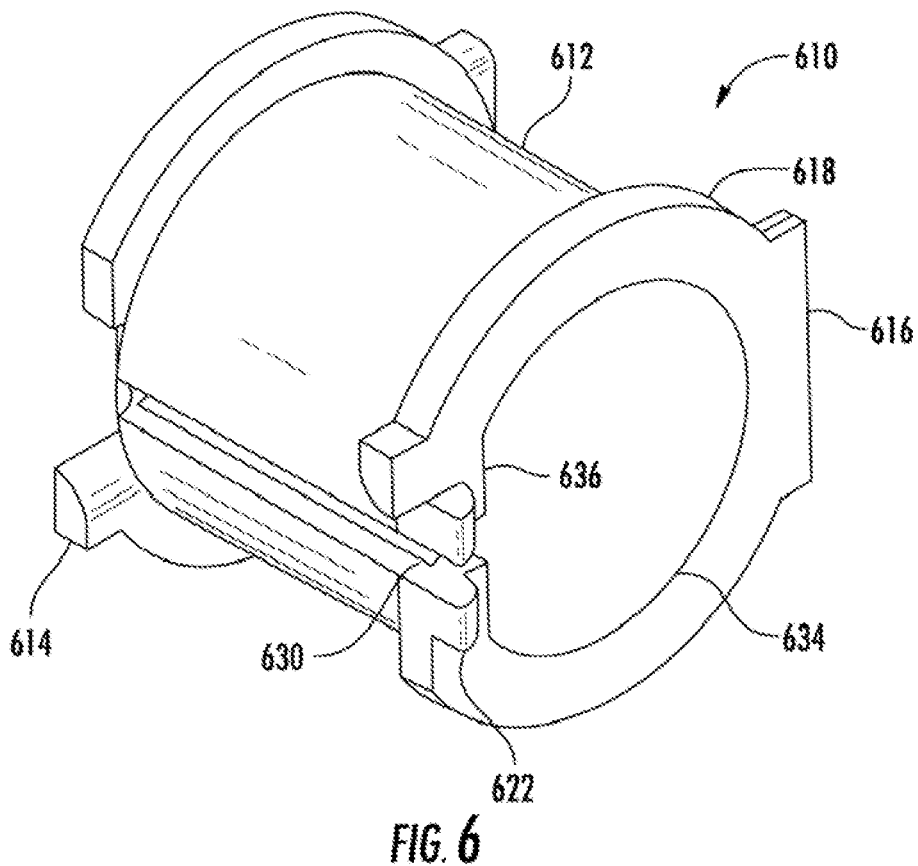
FIG. 6 is a perspective view illustrating a single Rogowski coil segment for a sixth embodiment of a Rogowski coil device in accordance with the principles of the present invention.
Figure 6A:
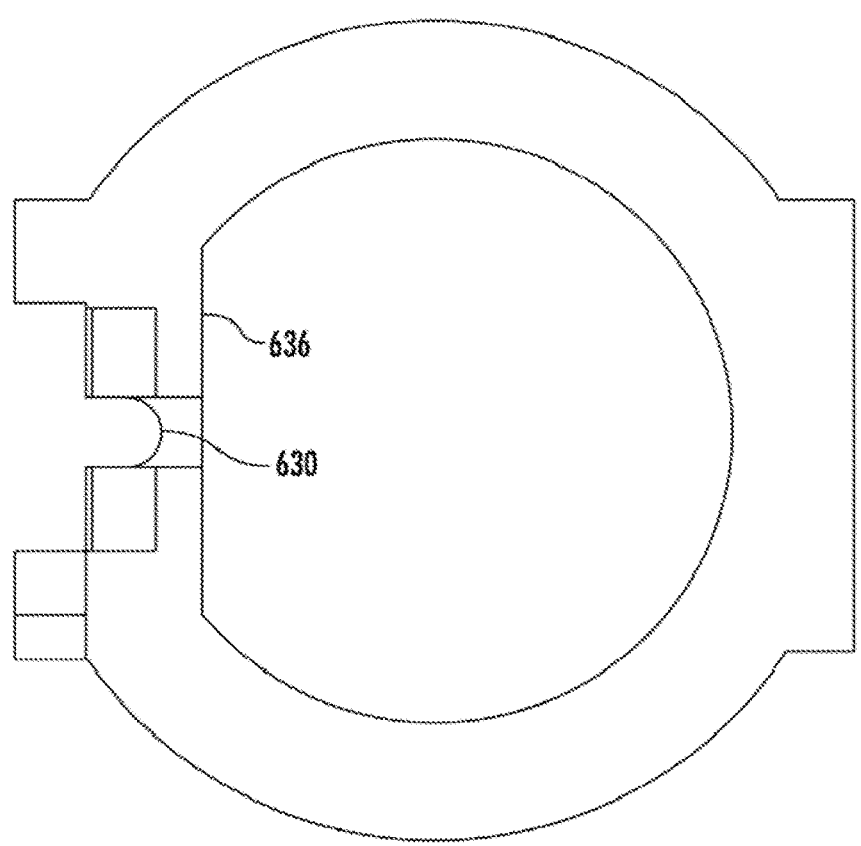
FIG. 6A is a side elevation view illustrating the single Rogowski coil element of FIG. 6.
Figure 6B:
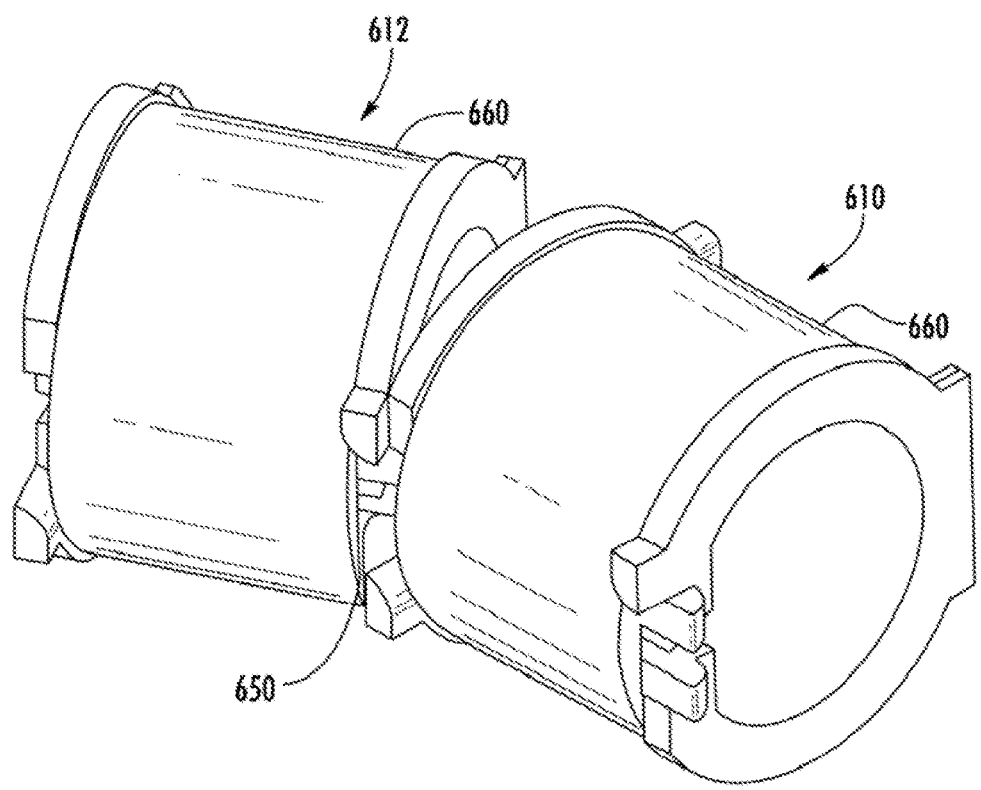
FIG. 6B is a perspective view illustrating two Rogowski coil segments of FIG. 6 mountable together in accordance with the principles of the present invention.

FIGS. 6-6B illustrate yet another variant of the current sensing apparatus of FIGS. 5-5C. The embodiment of FIGS. 6-6B is similar in that it is made up of bobbin elements 610 for use in a current sensing device. The bobbin element 610 comprises a hinged assembly similar to that illustrated in FIGS. 2-2C. The bobbin element further possesses a winding channel 612 defined by outer winding flanges 618 and further includes routing posts 614 for facilitating the routing of magnet wire between adjacent ones of winding channels (see FIG. 6B). The hinge element 622 also is adapted for receipt in a respective feature located on an adjacent bobbin element 610 and acts as a pivot point for the bobbin elements, similar to the functionality as described with regards to FIGS. 2-2C and FIGS. 5-5C. See also the hinge point 650 illustrated in FIG. 6B. The collective bobbin elements 610 can then optionally be placed inside of a clamshell type cover (not shown) or other encasement, or between a pair of header elements (similar to that shown in FIG. 4A, 460).

The embodiment of the bobbin element 610 illustrated in FIG. 6 differs over prior illustrated embodiments in one salient aspect; i.e., that the return conductor (not shown) is not routed through the center aperture 634 or a wire routing aperture (FIG. 5A, 530) passing through the winding barrel, as has been illustrated in previous embodiments. Rather, the wire routing slot 630 is utilized for this purpose. The wire routing slot 630 is positioned on the exterior periphery or outer diameter of the winding channel. Such a configuration has advantages in terms of assembly as the return conductor is resident not only on the inner diameter of the finished current sensing device, but also does not need to be threaded through an aperture, thereby simplifying assembly.

Figure 6C:
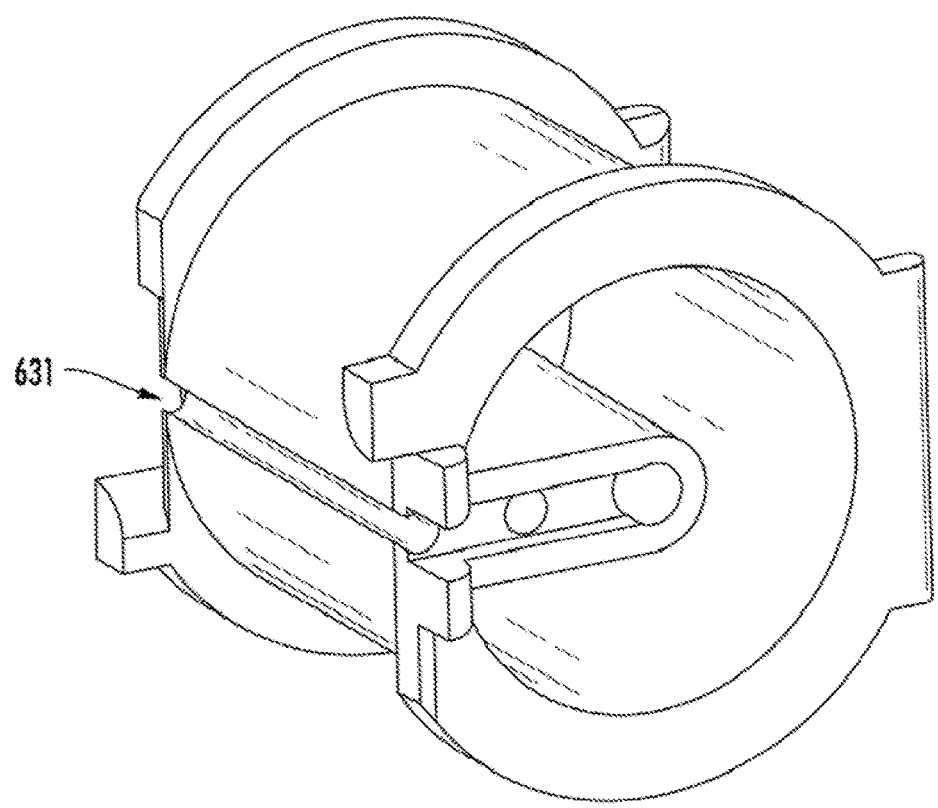
FIG. 6C is a perspective view illustrating another embodiment of a coil segment adapted to receive a peripheral cord, in accordance with the principles of the present invention.

It is also noted that routing slot may be used to run the return wire (conductor) and/or a flexible cord inlay (non-conductor). For example, in one variant (see FIG. 6C), the wire being wound around the bobbins would capture and secure the aforementioned cord (not shown) in the outer slot 631 to the individual bobbin elements, so as to provide a flexible hinge between them, and add mechanical stability (as well as protect the crossover wire during assembly). This cord does not have to be round in cross-section; in fact, it may have literally any cross sectional shape including without limitation square, rectangular, polygonal, oval/elliptical, or even be a composite of multiple discrete strands (e.g., braided).

Furthermore, because the return conductor is on the inner diameter, the length of the return conductor does not need to be significantly lengthened as the individual bobbin elements 610 are formed into their torus shape, as previously discussed. In addition, as the return conductor is not positioned within the center aperture 634, it can be easily accommodated during the mandrel winding process with the individual bobbin elements 610 each mounted on the mandrel 560 illustrated in FIG. 5C.

Figure 7:
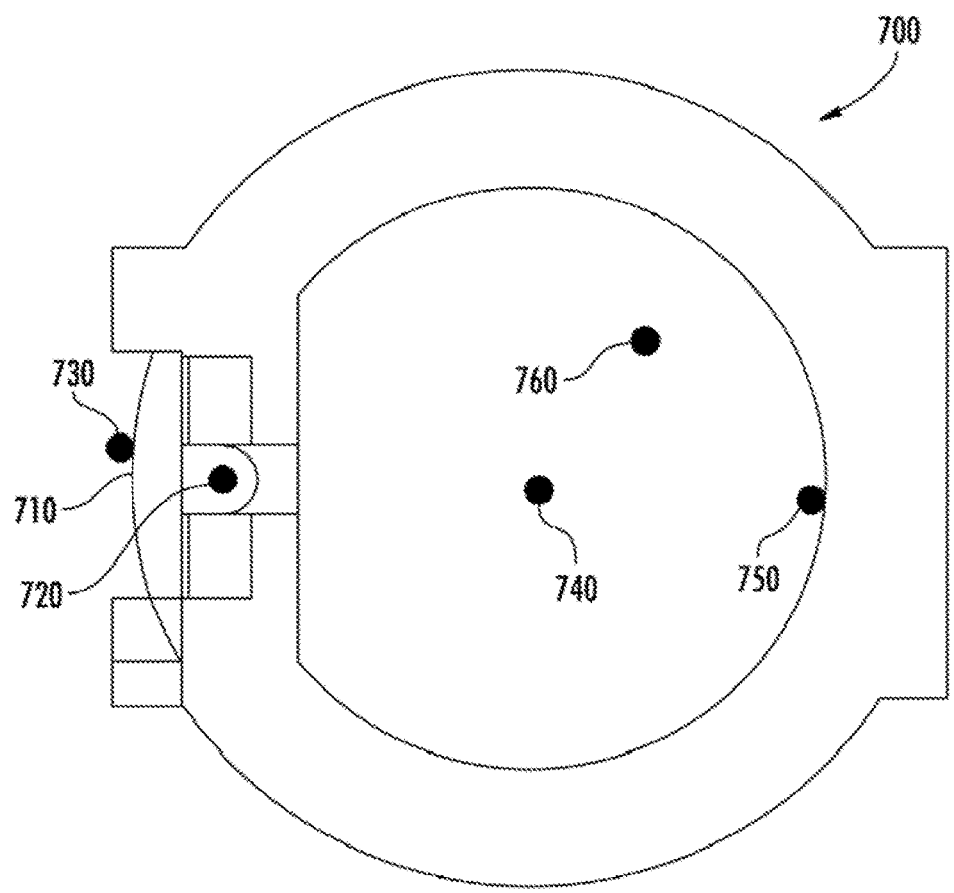
FIG. 7 is a side elevation view illustrating various positions for the pass through conductor of a current sensing device in accordance with the principles of the present invention.

Referring now to FIG. 7, various exemplary positions for a return or return conductor on a bobbin element 700 are shown. Specifically, FIG. 7 illustrates various options for positioning the return conductor with respect to the bobbin element 700 and the respective windings 710 disposed on that element. While simultaneously illustrating multiple return conductors (720, 730, 740, 750, 760), it is recognized that in most embodiments, only a single position for the return conductor will exist at a time. The various illustrated options are as follows (these are not intended to be limiting, and other options exist):

Option (1) The return conductor 720 can be placed at the inner diameter radius of the bobbin element 700, similar to the positioning as set forth in the embodiment of FIGS. 5-5C;

Option (2) The return conductor 730 can also be placed external to the windings 710. While unconventional, it has been found that such an arrangement is effective so long as the return conductor 730 is in physical contact with the windings 710. It is appreciated that the return conductor 730 can literally be placed anywhere along the outer periphery of the windings 710;

Option (3) The pass through conductor 740 can be placed at the geometric center of the bobbin element 700 (i.e. along the longitudinal winding axis) as set forth in, for example, FIGS. 2-2C;

Option (4) The pass through conductor 750 can be positioned along the outer diameter radius of the bobbin element 700 internal to the windings 710; and/or Option (5) The pass through conductor 760 can be positioned off-plane with respect to the inner conductor 720 and outer conductor 750 positions as set forth in (1) and (4) above.

The various options discussed above with respect to FIG. 7 have various electrical performance versus manufacturability tradeoffs. For example, in some applications, the degradation in electrical performance seen by a current sensing apparatus is not significant enough to offset the benefits in terms of ease of manufacture by placing the feed through conductor closer to the inner diameter of the completed current sensing apparatus (as discussed above with respect to, for example, FIGS. 5-5C). Alternatively, in high performance and/or precision applications, the additional manufacturing cost may be justified for the higher level of performance/precision. Such tradeoffs would be readily understood by one of ordinary skill given the present disclosure and accordingly are not discussed further herein.

Referring now to FIG. 8, yet another embodiment of a current sensing apparatus 810 is shown and described in detail. Specifically, the embodiment of FIG. 8 addresses the special case where the current carrying conductor 820 to be sensed is oblong or otherwise irregular in shape. Such an oblong shape as illustrated is common in, e.g., many electrical utility company applications (such as for example in so-called busbars utilized in electrical power distribution switchboards, distribution stations and substations). As discussed previously, the current sensing apparatus of previous embodiments was primarily contemplated as being generally torus-like in shape as is conventional in the prior art. However, it has been found that by elongating the current sensing apparatus 810 such that it now comprises a generally oval or elliptical type shape to accommodate the oblong shape of the conductor 820, improved electrical performance is achieved. Recall from above that the voltage sensitivity of a Rogowski coil is driven by equation (1) in which:

$$V = \frac{-AN\mu_0}{l} \frac{dI}{dt} \qquad \text{Equation (1)}$$

Accordingly, by possessing a generally oval type shape, the current sensing apparatus has a relatively shorter length (than a prior art round Rogowski coil), thereby increasing the voltage level seen in the current carrying conductor 820. In addition to curved configurations, it is also recognized that square and rectangular configurations can be utilized as well.

In embodiments that utilize the segmented bobbin elements (e.g. segmented bobbin element 210, FIG. 2) or alternatively the header element (110, FIG. 1), it is appreciated that the center opening 830 can be sized to accommodate the conductor 820 without having to physically vary the shape of the segmented windings themselves. In other words, the bobbin element or header element itself is physically sized to accommodate the conductor. FIG. 8A illustrates on such exemplary implementation. Specifically, FIG. 8A illustrates a current sensing apparatus 850 formed of a multiplicity of segmented bobbin elements 852 each having a number of conductive windings 854 wound thereon. These segmented bobbin elements are then utilized in conjunction with alignment elements 856 so as to align the bobbin elements around the conductor 820 to be measured. In this manner, the alignment elements prevent skewing and biasing of the current sensing apparatus 850 when placed around the conductor, and further provide accurate and repeatable placement (ensuring consistent electrical performance for current sensing apparatus installed in the field).

Moreover, in other embodiments, the alignment elements are interchangeable, such as to accommodate bus bars of different shapes and sizes, and/or the placement of the conductor within different portions of the center opening of the coil.

Similarly, for the free-space or former-less embodiments described elsewhere herein, a central alignment element can be used which positively places (and orients) the sensing apparatus around the conductor.

FIGS. 8B and 8B-1 illustrates yet another embodiment of the sensing coil of the invention, rendered in a substantially rectangular form factor having four (4) (or multiples of 2) segments corresponding to each of the four sides of a rectangular conductor. As shown in FIG. 8B, the four segments 870, 872, 874, 876 are disposed at 90 degrees relative to one another, corresponding to the four sides of the bus bar 878. The lateral coil segments 872, 876 are longer in length (and have more turns) than the end coil segments 870, 874, although it will be appreciated that other configurations may be used (including four identical segments, segments of the same length but different turn density, segments of different length but the same turn density, and so forth). Moreover, the configuration of FIG. 8B can be used with square conductors (not shown), or multiple conductors whose composite outline forms an effective rectangle or square.

The device 868 of FIGS. 8B and 8B-1 is in the illustrated embodiment, disposed within a hard shell or case 880 (shown with part of the case "clamshell" removed in FIG. 8B), although other approaches (including for example encapsulation, or use of a header or bobbin for support) may be used as well.

Figure 9:
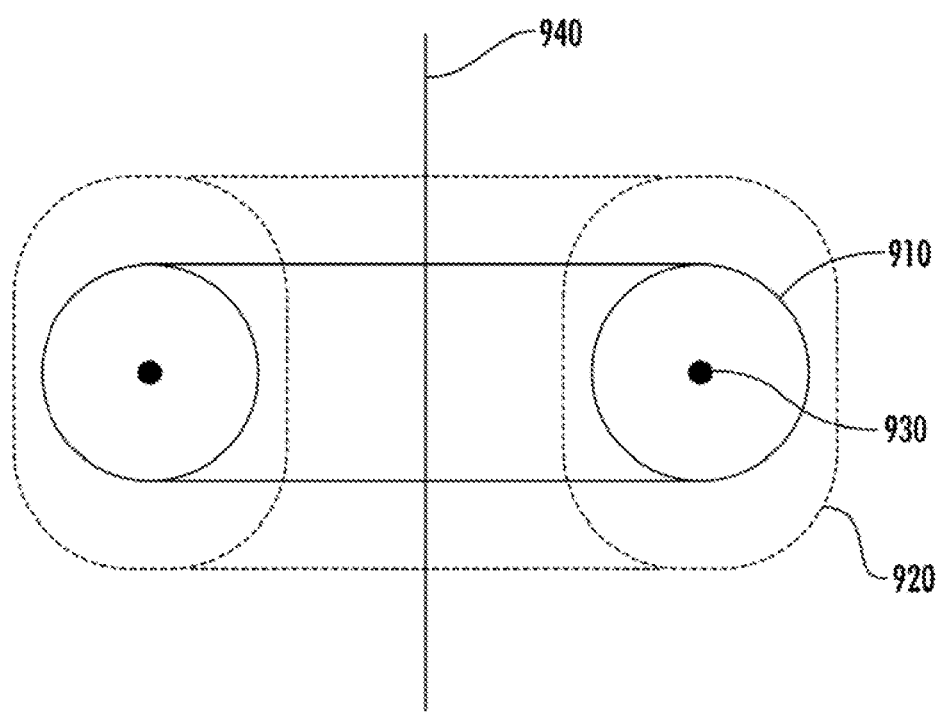
FIG. 9 is a side elevation view illustrating an alternate configuration for a Rogowski coil device in accordance with the principles of the present invention.

FIG. 9 illustrates an alternative to the substantially round winding channels 910 associated with typical prior art current sensing apparatus. As can be seen in FIG. 9, the cross sectional length of the current sensing apparatus 920 has been lengthened along the path of the conductor 940 in which current is desired to be sensed. The feed through conductor 930 can be placed within the current sensing apparatus 920 in any number of locations, considering the various design tradeoffs, as set forth in the discussion of FIG. 7 above. Accordingly, because the cross sectional area (A) has been increased (as set forth in Equation (1) above), the voltage level measuring the current carrying conductor 940 increases. While prior art Rogowski-type coils have typically maintained their traditionally circular and torus-like shapes due to a fear that deviating from these shapes would adversely impact the electrical performance of the coil, it has been found that in many typical applications, such deviations are acceptable in implementation.

In yet another embodiment of the invention, two or more "layers" of windings may be utilized to form the coil and the return conductor. For example, in one variant, a first layer of windings is applied over the top of the bobbin or header segments so as to effectively provide complete coverage of the segmented bobbin or header elements. At completion of the first layer, the same winding is "doubled back" upon itself and over the top of the first layer so as to form a second layer. The first layer in effect acts as a return conductor within the second layer, although the return conductor layer need not necessarily be the first layer. It will be appreciated that more layers for the return and/or "top" (second) layer may be used as well if desired. Moreover, the winding densities and topologies may be varied for each layer, such as e.g., where the return conductor layer is would at a lower density (greater inter-turn spacing) than the top layer.

It is also appreciated that the aforementioned "layered" approach need not be used in conjunction with a bobbin or header at all. For instance, in one "free standing" variant, bonded wire of the type discussed previously herein is used to form the first and subsequent layers (e.g., wound atop a mandrel or other removable structure, and then bonded, and the mandrel/structure removed). Alternatively, non-bonded wire can be used, and subsequently encapsulated or held in place with an adhesive before removal of the mandrel/support. Myriad other variations will be appreciated by those of ordinary skill given the present disclosure.

Exemplary Current Sensing Apparatus Applications—

The exemplary current sensing apparatus described herein can be used in any large number of applications, and/or where it is desirable to measure the current of a conductor without otherwise disturbing the current carrying conductor itself. One such common application is in the incorporation of current sensing apparatus in electrical meters for use in residential, commercial and industrial applications. By measuring the current being consumed by a consumer of electricity, and passing this information along to the utility company via a network interface on the meter, the utility company or other entity can better gauge what to charge its consumers, and/or better understand the energy being consumed throughout various parts of an electricity grid or system.

As well as being resistant to tampering and electromagnetic interference, current sensing apparatus such as Rogowski coils have wide applicability to various applications included in the recent push towards so-called smart grids. Furthermore, in addition to being utilized in power distribution metering applications (such as circuit breakers, residential and industrial monitoring stations, etc.), the use of current sensing apparatus in a wide variety of appliance applications which utilize large amounts of current (such as for example, electric welders and motor controls) are envisioned as well.

Multi-Coil Current Sensing Apparatus—

Figure 15A:
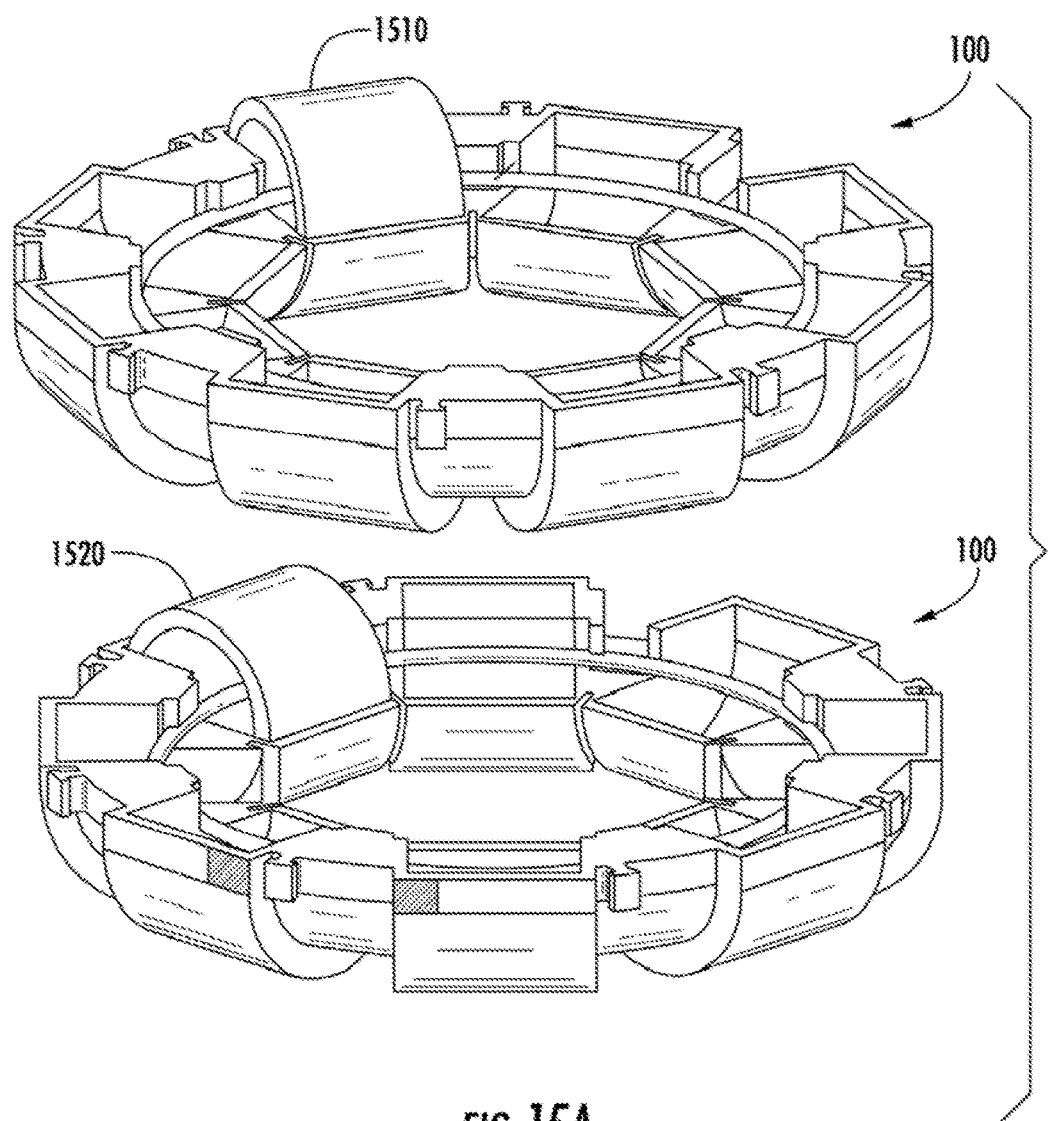
FIG. 15A is a perspective view of an exemplary stacked Rogowski coil device in accordance with the principles of the present invention.

Referring now to FIG. 15A, a first exemplary embodiment of a multi-coil Rogowski coil device is illustrated. Specifically, the multi-coil Rogowski coil device of FIG. 15A comprises two (2) Rogowski coil devices of the type previously illustrated with respect to FIG. 1 above, disposed in a "stacked" or juxtaposed arrangement. While illustrated with the coil embodiment of FIG. 1, it is appreciated that any of the current sensing apparatus embodiments described herein could readily be stacked in such a manner (including without limitation the free-space or bobbin-less embodiments described elsewhere herein). Furthermore, the upper and lower Rogowski coil devices are each shown with only a single coil element or segment 1510 and 1520, respectively. It should be recognized however that in practice, each of the Rogowski coil devices of the illustrated embodiment would have eight (8) wound coils; the single wound coil is illustrated FIG. 15A merely so as to more easily illustrate the relative offset between the top and bottom Rogowski coil devices.

Recall from the previous discussion of prior art Rogowski coil devices, that these prior art devices are uniform in their distribution of their windings (i.e. they are non-segmented). Furthermore, as the Rogowski coil devices 100 illustrated in FIG. 15A are segmented, there is expected to be some flux leakage or "imperfection" in the gaps between the wound coils of these devices. Accordingly, by stacking the Rogowski coil devices in FIG. 15A in proximity to one another, and angularly offsetting the top segmented wound coil 1510 from the bottom segmented wound coil 1520 (and combining the outputs from the two coils), the combined devices behave more like an ideal Rogowski coil with a non-segmented uniform distribution of windings.

It will be appreciated that while only two coils are shown in the embodiment of FIG. 15A, three (or more) coils can be stacked in such a manner if desired. For example, it may be desirable to utilize three (3) such coils in stacked arrangement (not shown), with the gaps between segments in the middle coil corresponding to coil segments of both the upper and lower coils, such that the flux leakage from the middle coil gaps is addressed substantially symmetrically (from both top and bottom) by the upper and lower coils, respectively.

In another configuration (such as where the gaps are appreciable in size relative to the length of the coil segments), the placement of the coils of the respective stacked coils can be "phased" with respect to the gap of the first; e.g., a first coil at vertical position zero (0) at an angular position zero (0), the second coil at vertical position one (1) atop the first coil at angular position zero plus x, the third coil at vertical position two (2) atop the second coil at angular position zero plus y (where y is greater than x), and so forth.

Generally speaking, for any appreciable affect on leakage or precision to occur due to the addition of more coils, the coils must be offset from one another in azimuth somewhat (i.e., segments of one coil overlap with gaps in another coil); however, this is not always the case. At least some effect on precision/leakage may be achieved in certain configurations simply by stacking two or more coils with their segments aligned, due to the fact the leakage from the gap of one coil couples with the adjacent segments of the other coil(s) even when the adjacent segments of the second coil are not aligned with the gaps.

Figure 15B:
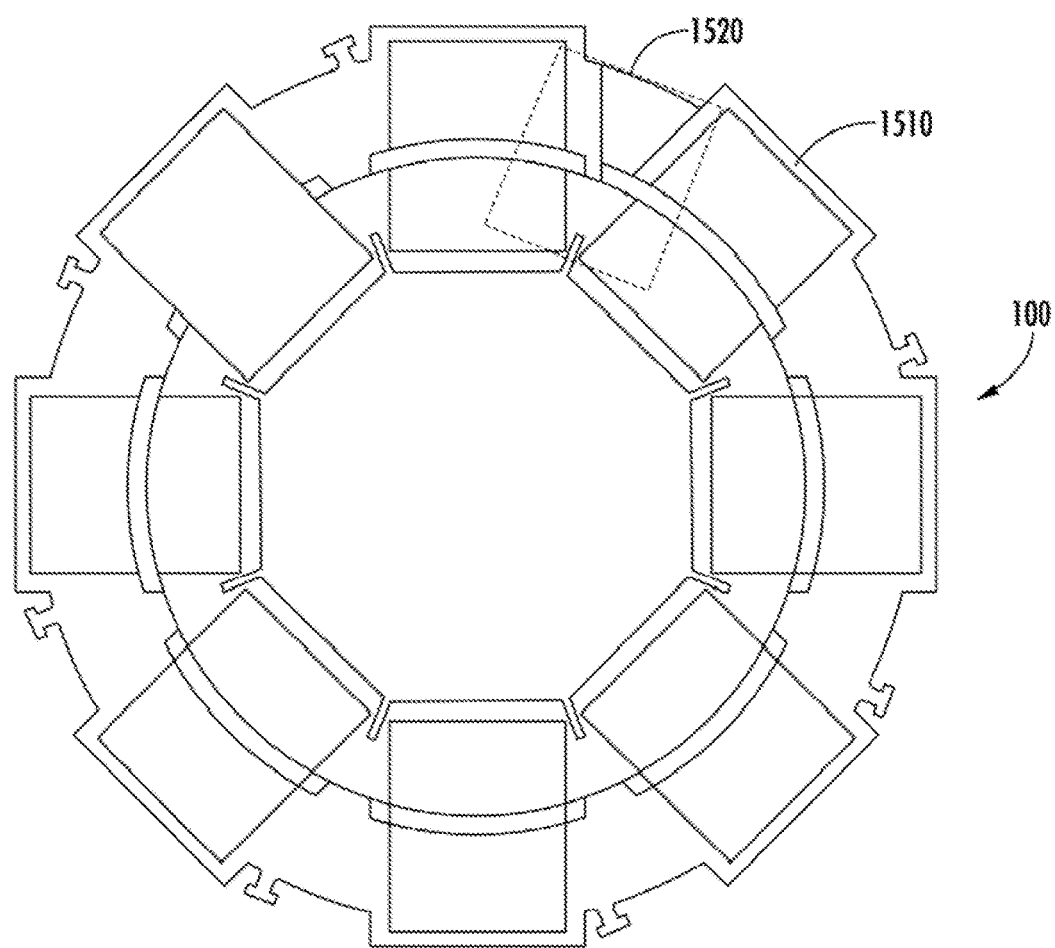
FIG. 15B is a top elevation view of the stacked Rogowski coil device of FIG. 15A.

FIG. 15B illustrates a top down view of the two Rogowski coil devices of FIG. 15A. Specifically, the angular offset can be clearly seen in FIG. 15B with the bottom wound coils 1520 offset or shifted with respect to the top wound coils 1510. While the stacked Rogowski coil device of FIGS. 15A and 15B illustrate only two (2) such devices, it is recognized that three (3) or more Rogowski coil devices can also be stacked with their outputs combined and angularly offset from one another in order to provide a more ideal behavior when measuring current passing through a conductor to be measured.

Figure 15C:
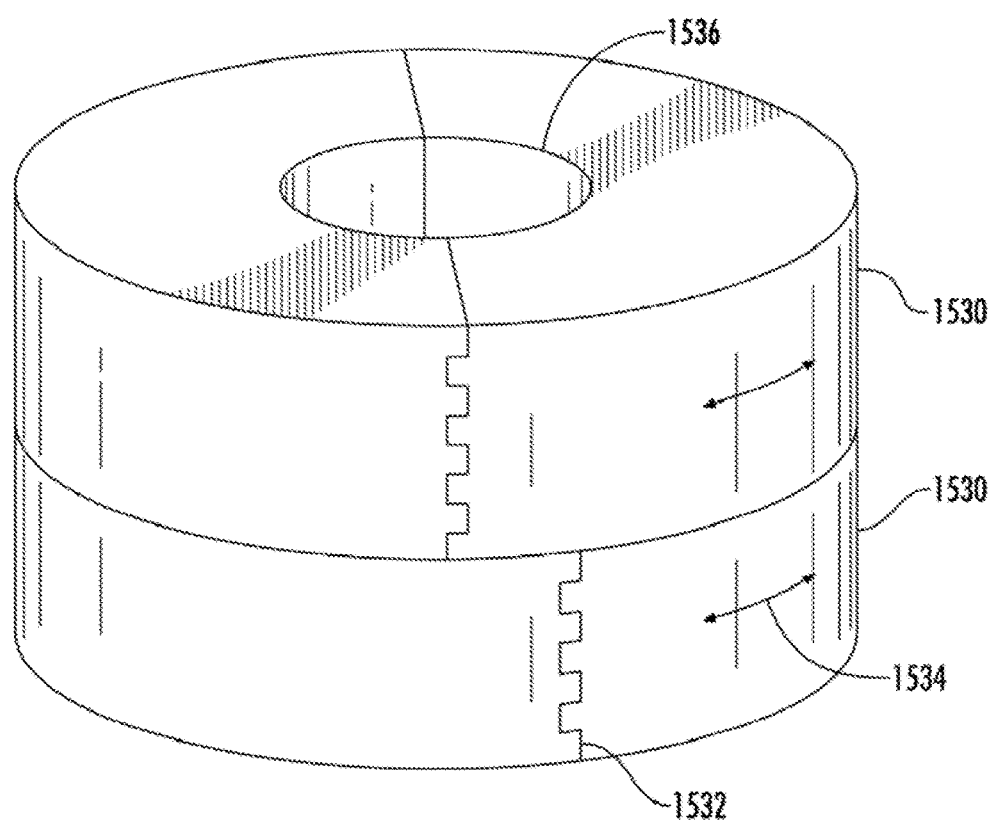
FIG. 15C is a perspective view of a tunable implementation of the stacked Rogowski coil device of FIG. 15A.

FIG. 15C illustrates another embodiment of a stacked Rogowski coil apparatus. Specifically, FIG. 15C illustrates a variant to the apparatus shown in FIG. 15A in which tuning covers 1530 are placed about the Rogowski coil devices 100. These covers 1530 are preferably made from a molded polymer and have features (not shown) which permit the covers to rotate with respect to one another while coupled. As the two devices are permitted to rotate 1534, a user can effectively tune the output of the stacked Rogowski coil devices in order to optimize the performance of the stacked Rogowski coil device. The tuning covers also include a hinge 1532 which permits the covers and the Rogowski coil devices to be positioned about the conductor to be measured without necessitating that the conductor be threaded through the central aperture 1536.

Figure 15D:
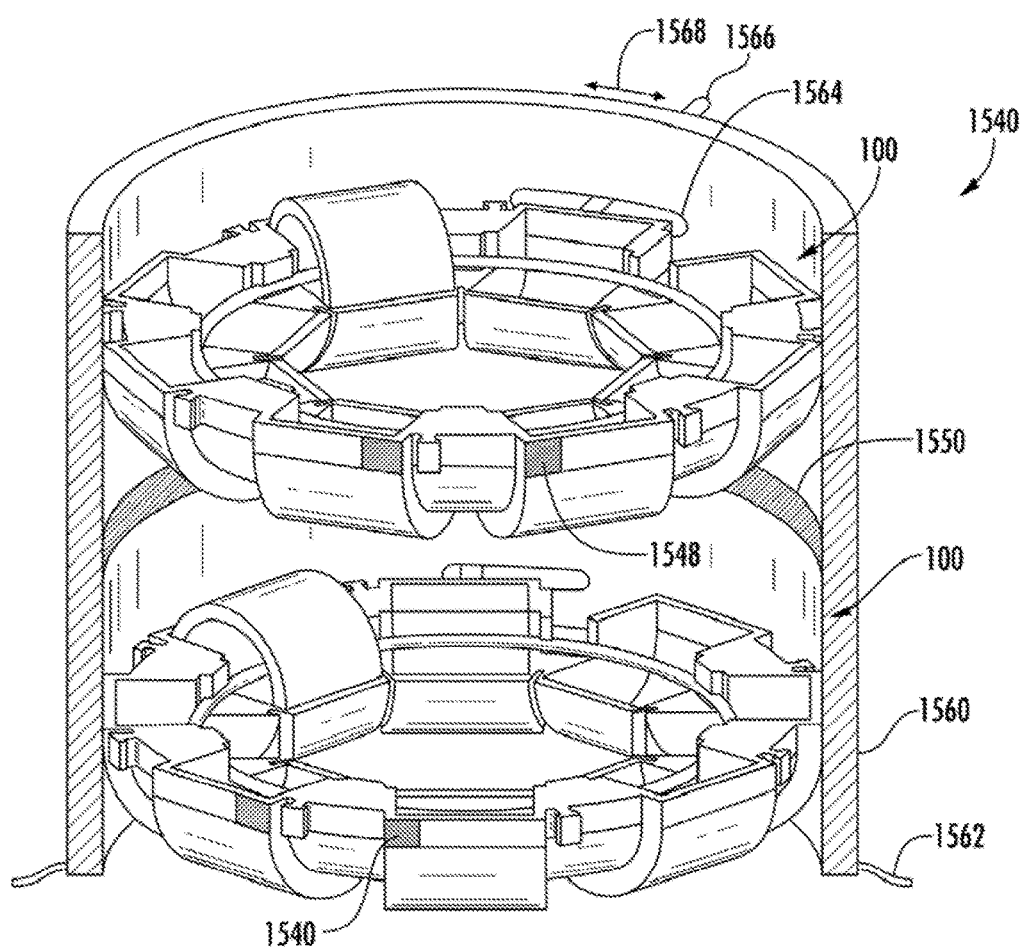
FIG. 15D is a perspective section view of a second exemplary embodiment of a tunable stacked Rogowski coil device in accordance with the principles of the present invention.

Referring now to FIG. 15D, an alternative tunable stacked Rogowski coil apparatus 1540 is shown and described in detail. The apparatus of FIG. 15D includes three (3) Rogowski coil devices 100; although the middle device has been removed from view in order to better illustrate the inner workings of the stacked apparatus 1540. The Rogowski coil devices 100 are received within a protective cover 1560 which is illustrated in cross section. The devices 100 are similar in construction to those devices shown in FIG. 1; however they have been, in an exemplary embodiment, constructed from a laser direct sintering (LDS) polymer material. Each of the devices have formed thereon two (2) conductively plated surfaces 1540 which are electrically coupled to respective ends of the Rogowski coil segmented windings. The Rogowski coil devices 100 are received within a channel 1550 formed within the protective cover 1560. These channels 1550 act as a guide which permits the Rogowski coil devices 100 to rotate within the cover 1560.

The cover 1560 is also preferably formed from an LDS polymer material thereby permitting the channels 1550 to be conductively plated as well. Accordingly, the conductive channels 1550 of the cover are electrically coupled to the conductive pads 1548 of the Rogowski coil devices. Various interfaces (including LDS polymer interfaces) between the individual devices 100 and the cover 1560 can be utilized such as those described in co-owned and co-pending U.S. patent application Ser. No. 12/482,371 filed Jun. 10, 2009 and entitled "Miniaturized Connectors and Methods", the contents of which are incorporated herein by reference in its entirety. The conductive channels 1550 are then electrically coupled to one another and also to output terminals 1562. These output terminals 1562 can then either be attached to external conductors (not shown) or alternatively mounted as either a through hole or surface mount contact to an external substrate (not shown).

As an alternative to the use of LDS polymers, the Rogowski coil devices 100 and cover 1560 could also be constructed as a composite structure. Specifically, the conductive pads 1548 on the Rogowski coil device and the conductive channels 1550 is constructed from a metallic alloy placed onto the underlying polymer structures. These metallic alloys can either be insert-molded or post inserted into pre-formed apertures present on the cover and Rogowski coil header, respectively. In addition, these metallic alloys are preferably shaped so as to act as a spring and provide additional contact force while the Rogowski coil devices 100 are rotated within the cover. The Rogowski coil devices are rotated within the cover via a protrusion 1566 through an aperture 1564 located on the cover 1560. By manipulating the protrusion 1566 in a lateral (azimuth) direction 1568, the individual Rogowski coil devices can be tuned within the assembly 1540.

Figure 15E:
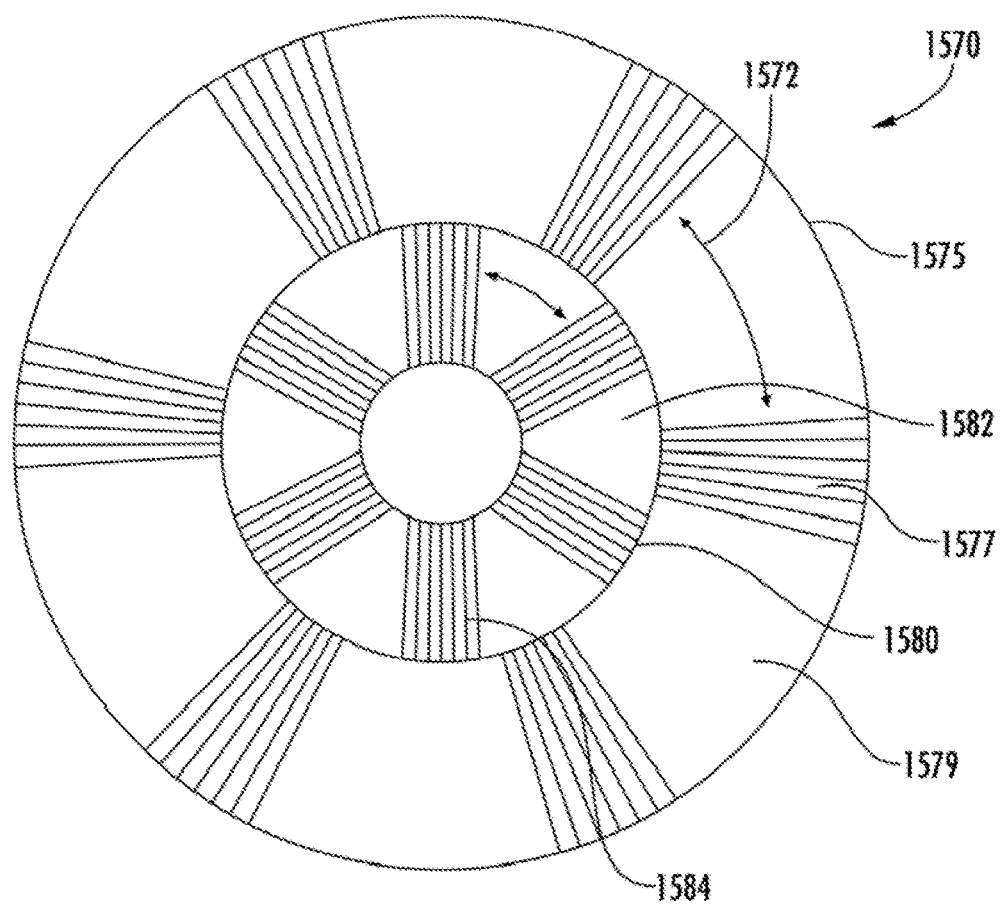
FIG. 15E is a top elevation view of a concentrically stacked Rogowski coil device in accordance with the principles of the present invention.

Referring now to FIG. 15E, a concentrically arranged stacked Rogowski coil apparatus 1570 is shown and described in detail. Specifically, the stacked Rogowski coil apparatus 1570 comprises an inner Rogowski coil 1580 and an outer Rogowski coil 1575. Both the inner and outer Rogowski coils are adapted to rotate in a circumferential direction 1572 with respect to one another. Similar to the stacked concepts illustrated in FIGS. 15A-15D, the concentrically stacked Rogowski coil apparatus of FIG. 15E permits the windings 1577 of the outer coil 1575 to be positioned adjacent the unoccupied intermediate segments 1582 of the inner coil 1580. Similarly, the windings 1584 of the inner coil 1584 are positioned adjacent the unoccupied intermediate segments 1579 of the outer coil 1575. The respective ends of the inner and outer Rogowski coil devices are then electrically coupled to one another to provide a combined output for a conductor to be measured.

In yet another exemplary embodiment two (2) or more of these concentrically arranged stacked Rogowski coil apparatus 1570 can be placed in a top-to-bottom disposition (similar to that shown with respect to FIG. 15A), thereby adding yet another layer of redundancy to help correct against distortions in electrical performance due to the segmenting of the coils. In such a configuration it is desirable that the winding portions 1584 of the inner coil be placed adjacent to the unoccupied intermediate segments 1582 of the adjacent inner coil, while the winding portions 1577 of the outer coil are placed adjacent the unoccupied intermediate segments 1579 of the adjacent outer coil.

In another variant, a "hybrid" stacked/concentric configuration (not shown) is provided. In this variant, the individual coils of the multi-coil assembly are of different radius, yet not so that one fits entirely within the other (i.e., the outer diameter of one coil is such that it is greater than the inner "hole" diameter of the next adjacent coil, such that they sit in a stacked configuration, but with the coils having different diameters. The variation of the coil diameter as a function of vertical position may be progressive (e.g., diameter of coil at vertical position zero (0) being smaller than that of the next higher coil, and the diameter of that next higher coil being smaller than that of the third coil above it, and so forth), or assume other patterns (such as an "hourglass", wherein the lowest coil is of a larger diameter than the (second) coil directly above it, and the coil directly above that second coil is also of a/the larger diameter).

Furthermore, while primarily envisioned as tunable embodiments, the stacked Rogowski coil devices of FIGS. 15A-15E are not so limited. In fact, it may be desirable in some embodiments to maintain a fixed relationship between adjacent ones of Rogowski coil devices thereby simplifying the assembly.

It will also be appreciated that in yet another embodiment, the vertical spacing or disposition of the different coils (whether in "stacked" or "concentric" configuration) can be varied, thereby increasing/decreasing the coupling or interaction of the coils. For instance, the vertical height between tow stacked coils can range from zero (0) to literally any value consistent with the form factor of the application. Obviously, the most coupling effect will be achieved when the coils are immediately proximate one another, but it is contemplated by the present invention that "tuning" of the assembly may also comprise variation of the vertical spacing of coils in the stacked or concentric configurations. In one variant, such variable spacing is accomplished by simply substituting non-conductive spacers (e.g., flat toroids or "washers" of prescribed thickness made from e.g., a polymer, paper, kapton, etc.) between the individual coils. In another variant, the case which contains the coils may be configured so that the stacked coils may reside at different elevations relative to one another. Myriad other techniques for allowing variation of the spacing between coils will be appreciated by those of ordinary skill when given the present disclosure.

It is also noted that while the aforementioned embodiments of stacked and concentric (and hybrid) coil assemblies may be "tuned" by varying the placement of the coils relative to one another—whether vertically, horizontally, or in azimuth or even attitude (yaw)—they may also be tutted to achieve the desired level of performance by virtue of their constituency. For example, in one embodiment of the assembly, the user/installer is provided with a plurality (e.g., two or more) of very low cost, lower-precision coils. These coils each may for example only have a few number of segments, relatively large spacing between segments, and/or less turn density in each segment, such that they are a more gross approximation of the "perfect" Rogowski coil (yet are also very inexpensive to manufacture). It may be that one user of the assembly merely requires a low-precision, gross approximation of the sensed parameter(s) (e.g., current through a conductor), and hence the use of a single one of the aforementioned coils within the assembly may suffice for these purposes. Alternatively, another user of the assembly may require much higher levels of precision in their intended application; such levels of precision cannot be achieved through use of one of the low precision coils alone, yet can be achieved with perhaps two or three coils used in stacked/concentric/hybrid configuration. In this fashion, one embodiment of the invention is configured such that coils can be added or subtracted by the user as required in order to achieve their desired level of precision, while also achieving the most economical implementation (in contrast to a "one-size-fits all" approach of the prior art, wherein the device precision/accuracy is effectively fixed).

The foregoing methodology may also be applied in installations where large numbers of of individual or aggregated coils may be required, such as by a utility implementing a customer-wide monitoring program. For example, where the installed electrical meter base for the utility's customers is substantially homogeneous, the utility can "tune" the device installation on an exemplary or representative meter, and then simply replicate that installation on all other meters within the customer base (without having to individually tune each one). Hence, the utility can purchase one "tuning kit", which may for example have myriad different types, diameters, winding densities, segment spacings, and configurations of coils/coil assemblies, and tune the prototype or representative installation so as to optimize performance and/or cost (i.e., achieve the desired level of precision at the lowest possible cost). Once the optimal configuration (or configurations for respective types of customer installations) is/are known, the utility can then simple purchase the cost/performance-optimized configuration en masse from a supplier, thereby obviating the waste and cost of "leftover" or unused parts (e.g., coils) that would result from purchasing a multitude of individual tuning kits.

It is also noted that while some of the foregoing embodiments contemplate the use of homogeneous coil configurations (e.g., two or three substantially identical coils used in a stacked arrangement), the present invention further contemplates the use of heterogeneous coil configurations. For instance, in the stacked assembly described above, the first coil might have a certain segment winding density and segment spacing/number of segments. The second coil, however, might utilize a different density/spacing/number, albeit having the same effective radius and/or vertical height. Moreover, as noted previously, the coils may also (or alternatively) have different coil heights and/or radii, different cross-sectional profiles, etc. Hence, an assembly which can "mix and match" different coil types is contemplated herein. For such an assembly, the housing (if any) may also be configured to accept the different coil types, so as to obviate the user/installer having to procure a different housing type depending on the selected combinations/configuration of component coils. This "universal" housing can readily be constructed so as to accommodate the various possible configurations, yet meet the aims of relative conservation of space, low cost, holding the coil(s) in a desired orientation relative to the monitored conductor(s), and so forth.

Methods of Manufacture for Current Sensing Apparatus—

Figure 10:
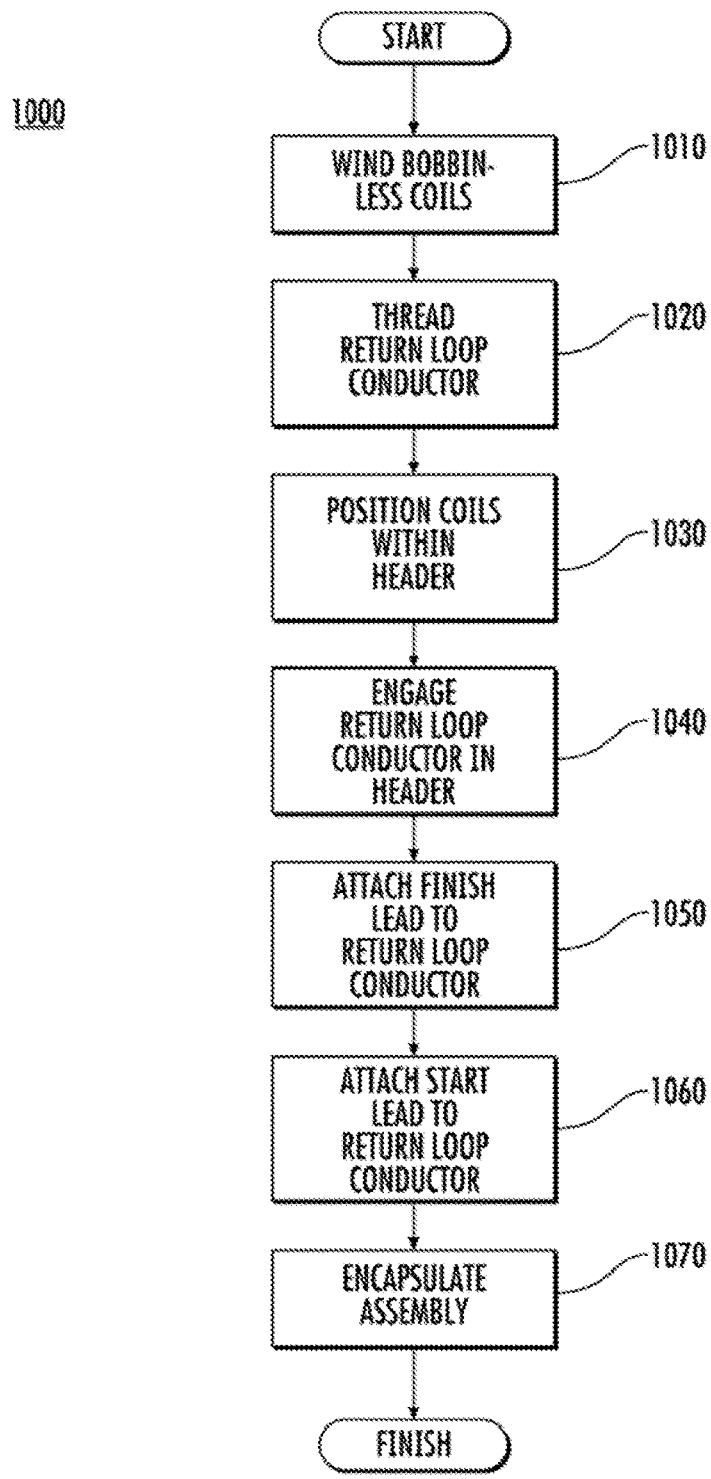
FIG. 10 is a process flow diagram for manufacturing the current sensing apparatus of FIGS. 1-1B in accordance with the principles of the present invention.

Referring now to FIG. 10, a first exemplary method for manufacturing a current sensing apparatus 1000 is shown and described in detail. Specifically FIG. 10 illustrates the methodology for manufacturing the current sensing apparatus illustrated in FIGS. 1-1B. At step 1010, the bobbin-less coils are wound on a mandrel. These coils can optionally be wound either one at a time or alternatively may be wound together so as to avoid having to interconnect them at a later processing step. These coils may be wound either using a single layer of windings or alternatively in a multi-layer configuration. The wound coils are then bonded together via the application of heat. The manufacture of bobbin-less coils is described at, inter alia, co-owned U.S. patent application Ser. No. 11/203,042 filed Aug. 12, 2005 and entitled "Stacked Inductive Device and Methods of Manufacturing", the contents of which are incorporated herein by reference in its entirety.

At step 1020, the wound coils are threaded on a preformed return loop of copper wire (FIG. 1, 104). In an exemplary embodiment, the return loop of copper wire is formed so as to be generally "c-shaped" with a relatively small gap between the start and finish of the copper wire return loop.

At step 1030, each of the bobbin-less coils (FIG. 1, 102) are positioned within corresponding cavities (FIG. 1A, 112) of the segmented header (FIG. 1, 110).

At step 1040, the return loop of copper wire is snapped into the positioning radial slot (FIG. 1B, 114) of the segmented header. In a variant, the return loop can be secured to the radial slot via the use of an epoxy adhesive.

At step 1050, the finish lead of the last wound coil is attached to an end of the return wire loop. This attachment may utilize any number of known techniques such as eutectic solder operations, sonic welding, and the like.

At step 1060, the start lead of the first wound coil and the start of the return loop to the connection wires for the current sensing apparatus are connected. In an exemplary embodiment, the connection wires comprise twisted pair, shielded lead wires.

At step 1070, the coil assembly is placed within or otherwise encapsulated with a protective shell or coating thereby finishing the assembly. In an exemplary embodiment, the coil assembly is placed within an over-lapping protective plastic clamshell case. The over-lapping nature of the plastic clamshell case provides enhanced protection against resistance to high potential (also known as "Hi-Pot") by increasing the path length between the wires on the current sensing apparatus and the conductor to be monitored.

Figure 11:
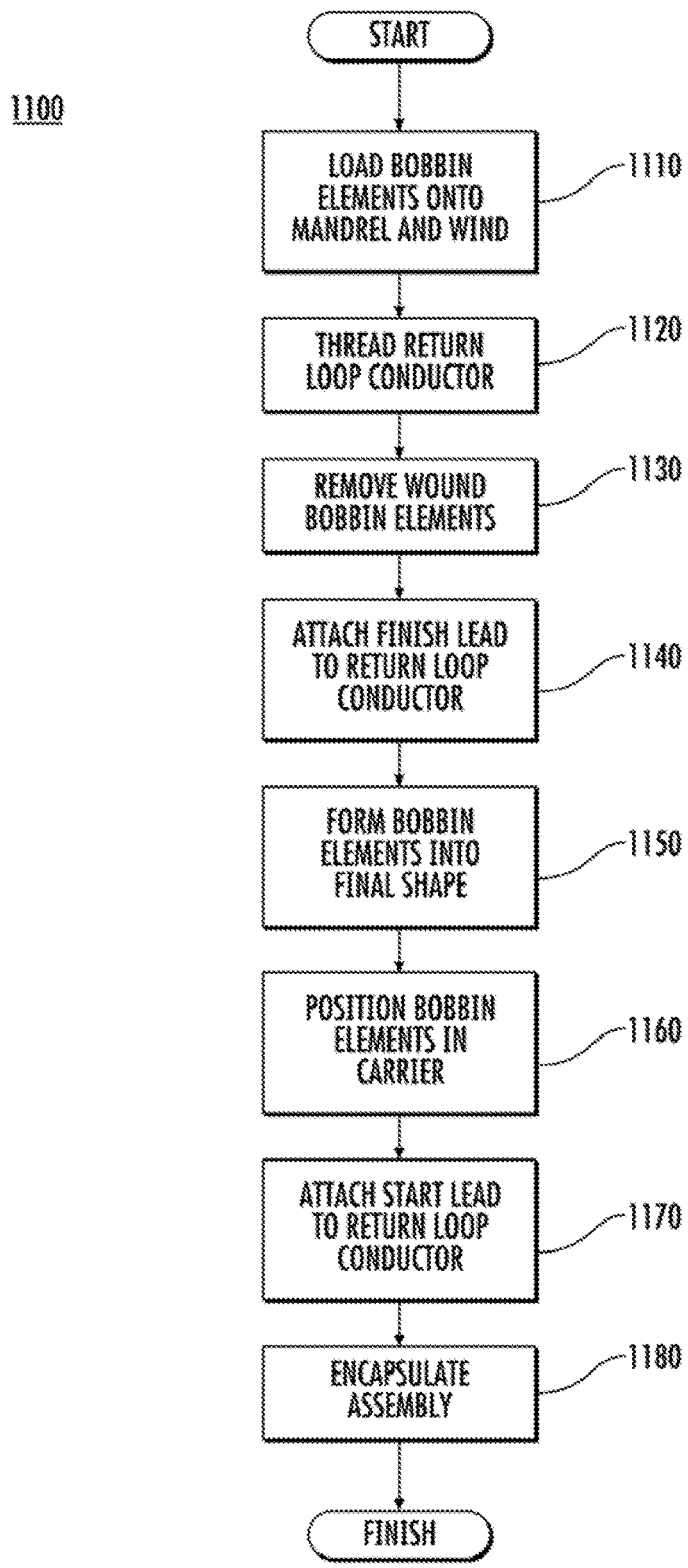
FIG. 11 is a process flow diagram for manufacturing the current sensing apparatus of FIGS. 2-2C and FIGS. 4-4B in accordance with the principles of the present invention.

Referring now to FIG. 11, an alternative method for manufacturing a current sensing apparatus 1100 is shown and described in detail. Specifically FIG. 11 illustrates the methodology for manufacturing the current sensing apparatus illustrated in for example FIGS. 2-2C; and FIGS. 4-4B. At step 1110, the segmented bobbin elements (FIG. 2, 210) are loaded onto a mandrel. In an exemplary embodiment, starting at one end, each bobbin element is wound continuously over successive bobbin elements such that a continuous coil winding with no discrete interconnections is included. These wound coils can be either single or multi-layer in nature.

At step 1120, the return wire is threaded through respective apertures (FIG. 2A, 230) of the bobbin elements. In one embodiment, the return wire comprises one or more twisted pair, shielded lead wires that are pre-stripped, separated and straightened so that they may be placed through the holes provided in the bobbin elements as they sit on the mandrel. In an alternative embodiment, step 1120 is performed prior to bobbin winding at step 1110.

At step 1130, the wound bobbin elements are removed from the mandrel as a single assembly. The removed wound bobbin element assembly resembles pearls on a string.

At step 1140, the end wire of the last coil is terminated to one end of the twisted pair return wire. In embodiments which utilize two apertures (see e.g. FIG. 4, 432), the return wire can be routed back through the center portion of the segmented wound bobbin elements.

At step 1150, the bobbin elements are formed into their final shape (such as the exemplary torus-like or radial pattern described previously herein). In exemplary embodiments that include hinged couplings (e.g. FIG. 2, 220), the hinged couplings are positioned such that they are on the inside diameter of the torus-like pattern.

At step 1160, each of the bobbin elements are placed within corresponding cavities or slots associated with a plastic carrier. For example, in the illustrated embodiment of FIG. 4A, each bobbin element 410 is placed within a respective cavity 464 of the external ring-like header 460.

At step 1170, the start lead of the first coil is terminated to the other end of the return wire loop.

At step 1180, the coil assembly is placed within or otherwise encapsulated with a protective shell or coating thereby finishing the assembly such as that described with respect to step 1070 of FIG. 10 previously discussed herein.

Figure 12:
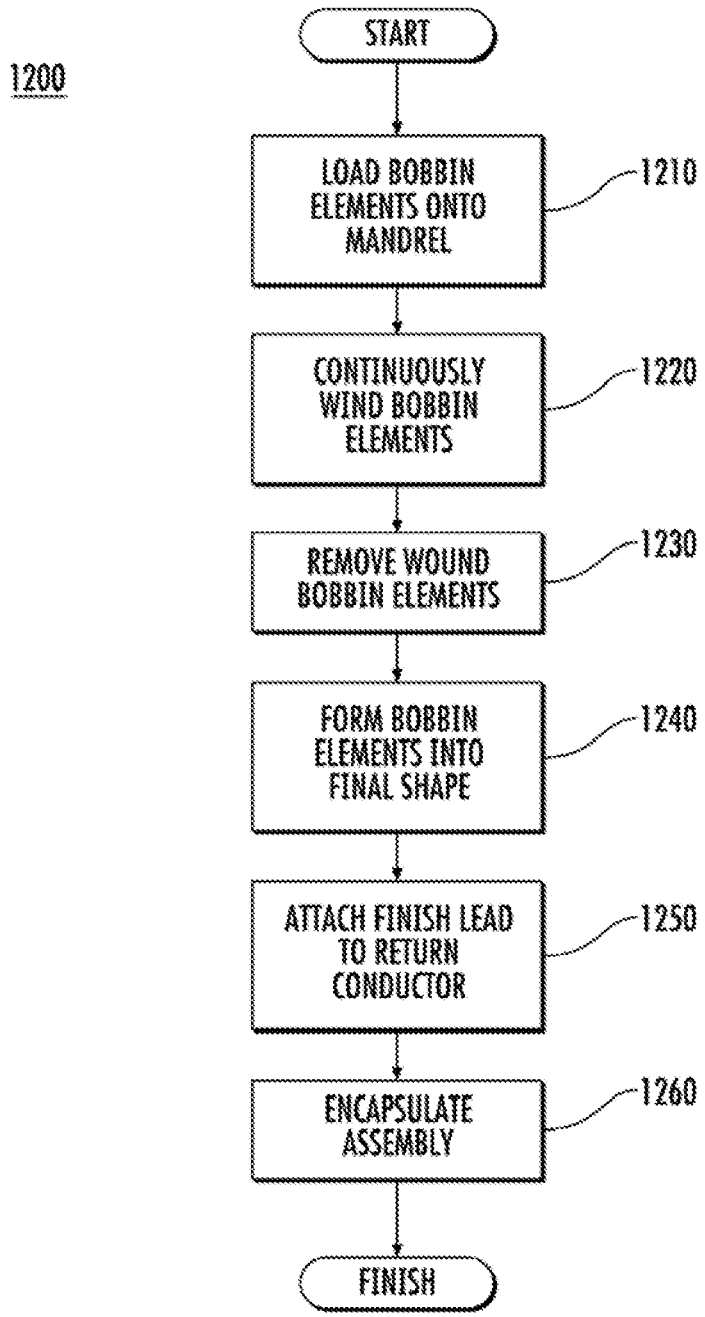
FIG. 12 is a process flow diagram for manufacturing the current sensing apparatus of FIGS. 3-3D in accordance with the principles of the present invention.

Referring now to FIG. 12, a third exemplary method for manufacturing a current sensing apparatus 1200 is shown and described in detail. Specifically FIG. 12 illustrates the methodology for manufacturing the current sensing apparatus illustrated in FIGS. 3-3D. At step 1210, the segmented bobbin elements (FIG. 3, 300) are loaded onto a mandrel. In an exemplary embodiment, starting at one end, the winding is anchored on one end and the wire is run along the top grooves (FIG. 3, 314) across all the bobbin elements. This wire is to be utilized as the return wire.

At step 1220, and starting on the far end (from the starting point of the return wire), the wire is wound back along the length of bobbin elements with windings placed on each bobbin element thereby making a continuous coil winding with no interconnections while simultaneously wrapping over the return wire. Similar to previous embodiments discussed above, the coils can be either single or multi-layer depending on design considerations associated with the particular application for the current sensing apparatus.

At step 1230, the wound bobbin elements are removed from the mandrel.

At step 1240, the bobbin elements are formed into their final shape (such as the exemplary torus-like or radial pattern described previously herein). With respect to the embodiment illustrated in FIGS. 3-3D, the return wire will now run along the outer diameter of the bobbin elements.

At step 1250, the finish lead and return wire are terminated to conductors associated with the connection wires (e.g. twisted pair, shielded lead wires).

At step 1260, the coil assembly is placed within or otherwise encapsulated with a protective shell or otherwise encapsulated with a coating thereby finishing the assembly.

Figure 13:
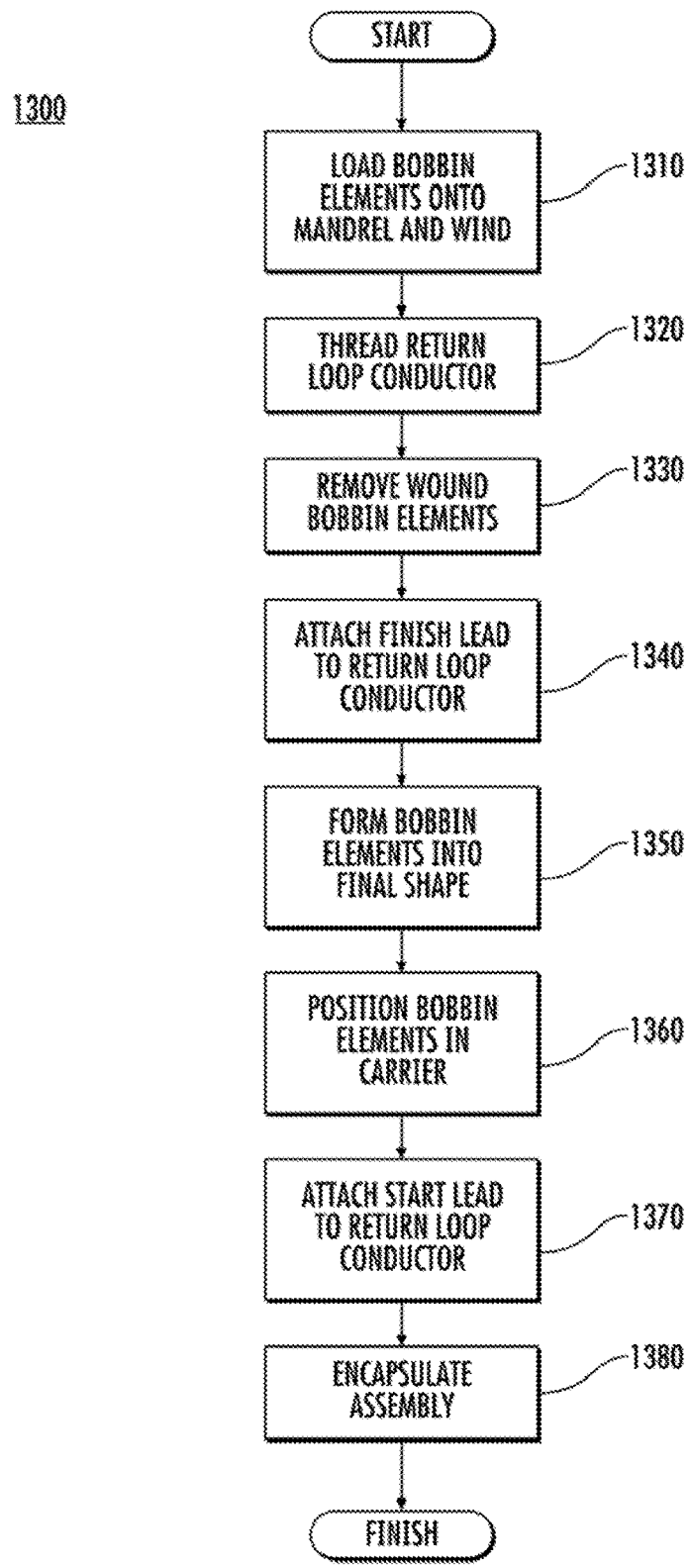
FIG. 13 is a process flow diagram for manufacturing the current sensing apparatus of FIGS. 5-5C in accordance with the principles of the present invention.

Referring now to FIG. 13, yet another embodiment for manufacturing a current sensing apparatus 1300 is shown and described in detail. Specifically FIG. 13 illustrates the methodology for manufacturing the current sensing apparatus illustrated in for example FIGS. 5-5C. At step 1310, the segmented bobbin elements (FIG. 5, 510) are loaded onto a mandrel. In an exemplary embodiment, starting at one end each bobbin element is wound continuously over successive bobbin elements such that a continuous coil winding with no discrete interconnections is included. These wound coils can be either single or multi-layer in nature.

At step 1320, the return wire is threaded through respective apertures (FIG. 5, 522) of the bobbin elements. In one embodiment, the return wire comprises one or more twisted pair, shielded lead wires that are pre-stripped, separated and straightened so that they may be placed through the holes provided in the bobbin elements as they sit on the mandrel. In an alternative embodiment, step 1320 is performed prior to bobbin winding at step 1310.

At step 1330, the wound bobbin elements are removed from the mandrel. The wound bobbin elements, because they are interconnected, are removed in a single assembly.

At step 1340, the end wire of the last coil is terminated to one end of the twisted pair return wire.

At step 1350, the bobbin elements are formed into their final shape (such as the exemplary torus-like or radial pattern described previously herein). In exemplary embodiments that include hinged couplings (e.g. FIG. 5B, 550), the hinged couplings are positioned such that they are on the inside diameter of the torus-like pattern.

At step 1360, each of the bobbin elements are placed within corresponding cavities or slots associated with a plastic carrier, similar to that shown in the illustrated embodiment of FIG. 4A.

At step 1370, the start lead of the first coil is terminated to the other end of the return wire loop.

At step 1380, the coil assembly is placed within or otherwise encapsulated with a protective shell.

Figure 14:
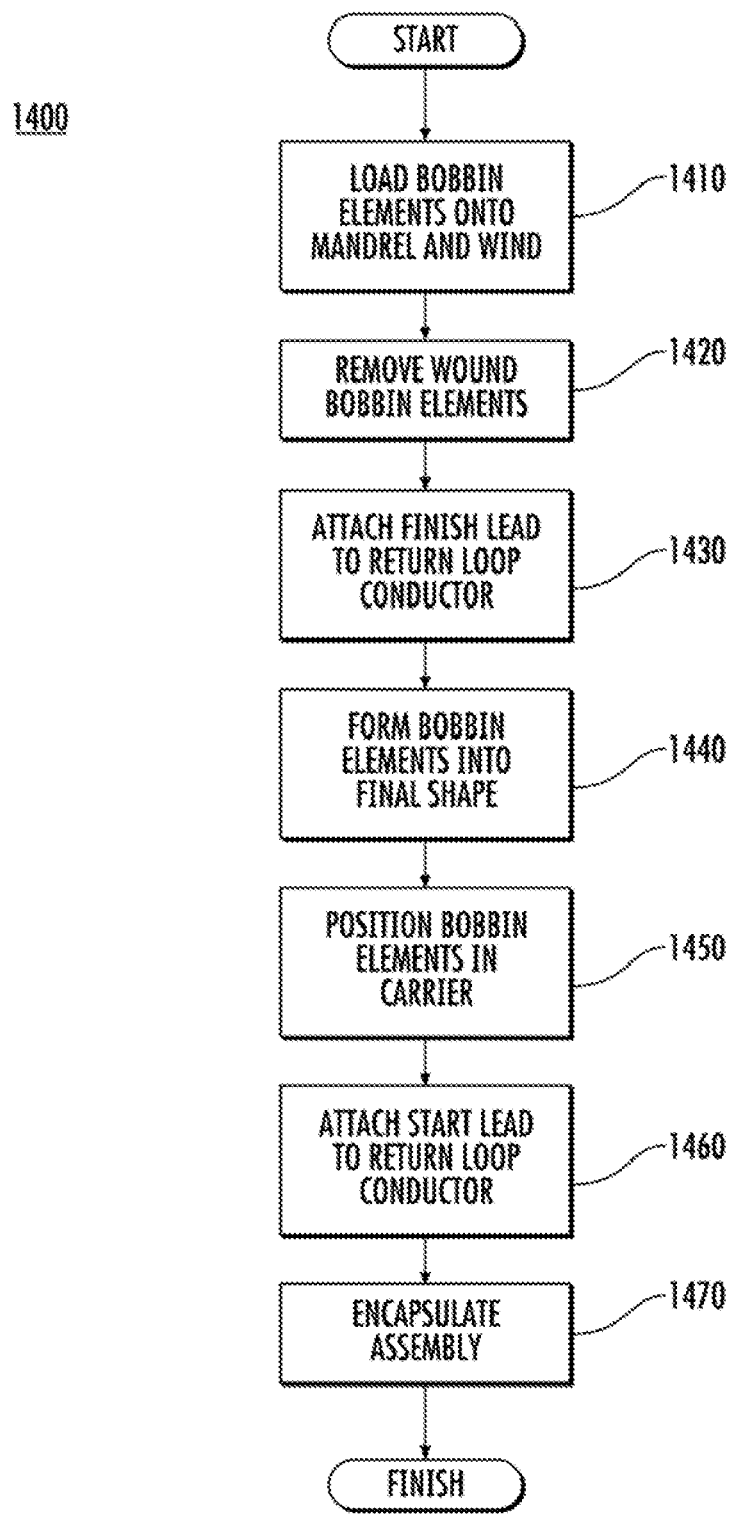
FIG. 14 is a process flow diagram for manufacturing the current sensing apparatus of FIGS. 6-6B in accordance with the principles of the present invention.

Referring now to FIG. 14, yet another method for manufacturing a current sensing apparatus 1400 is shown and described in detail. Specifically FIG. 14 illustrates the methodology for manufacturing the current sensing apparatus illustrated in, for example, FIGS. 6-6B. At step 1410, the segmented bobbin elements (FIG. 6, 610) are loaded onto a mandrel. The return wire is, starting at one end, routed in the cavity (FIG. 6, 630) on the outer diameter of the bobbin element. Then, starting at the opposite end, each bobbin element is wound continuously over successive bobbin elements such that a continuous coil winding with no discrete interconnections is included. These wound coils can be either single or multi-layer in nature and are positioned over the return wire.

At step 1420, the wound bobbin elements are removed from the mandrel. The wound bobbin elements, because they are interconnected, are removed in a single attached assembly.

At step 1430, the end wire of the last coil is terminated to one end of the twisted pair return wire.

At step 1440, the bobbin elements are formed into their final shape (such as the exemplary torus-like or radial pattern described previously herein.

At step 1450, each of the bobbin elements are placed within corresponding cavities or slots associated with a plastic carrier, similar to that shown in the illustrated embodiment of FIG. 4A. In another embodiment, each of the bobbin elements is placed within the bottom portion of an over-lapping clam shell case.

At step 1460, the start lead of the first coil is terminated to the other end of the return wire loop.

Finally at step 1470, the coil assembly is placed within or otherwise encapsulated with a protective shell. In embodiments in which a plastic clam shell case is used, this step is accomplished by placing and securing the top over-lapping protective plastic clam shell case over the assembly.

It will be recognized that while certain aspects of the invention are described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A current sensing inductive device, comprising:
   a plurality of segmented winding elements, each element comprising a conductive wire having a plurality of winding turns, the conductive wire configured to electrically couple a leading one of the plurality of segmented winding elements with a trailing one of the plurality of segmented winding elements;
   wherein the plurality of segmented winding elements each comprise a discrete bobbin element;
   wherein each of the discrete bobbin elements comprises:
      a winding channel in which the plurality of winding turns are disposed;
      a routing feature disposed adjacent the winding channel, the routing feature configured to facilitate the routing of the conductive wire to an adjacent discrete bobbin element;
      a hinged or articulated coupling configured to mate with an adjacent feature on the adjacent discrete bobbin element;
      a winding aperture, the winding aperture sized to accommodate a respective winding mandrel, the winding aperture further including a keyed feature disposed therein which facilitates the winding operation on the respective winding mandrel;
      a pair of flange elements, the flange elements disposed on opposite ends of the winding channel; and
      an alignment feature disposed on at least one of the pair of flange elements, the alignment feature configured to facilitate alignment of the discrete bobbin element in a ring-like header.

2. The current sensing inductive device of claim 1, wherein the hinged or articulated coupling is configured to provide a pivoting function.

3. The current sensing inductive device of claim 1, wherein the hinged or articulated coupling is configured to provide both a pivoting function and a retaining function.

4. The current sensing inductive device of claim 1, wherein the hinged or articulated coupling comprises a web of connecting material.

\* \* \* \* \*